(12) United States Patent
Silverbrook

(10) Patent No.: US 7,929,179 B2
(45) Date of Patent: *Apr. 19, 2011

(54) FLAT PANEL DISPLAY

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 0 days.

This patent is subject to a terminal disclaimer.

(21) Appl. No.: 12/729,216

(22) Filed: Mar. 22, 2010

(65) Prior Publication Data

US 2010/0172686 A1    Jul. 8, 2010

Related U.S. Application Data

(63) Continuation of application No. 10/922,848, filed on Aug. 23, 2004, now Pat. No. 7,692,815, which is a continuation-in-part of application No. 10/803,074, filed on Mar. 18, 2004.

(30) Foreign Application Priority Data

Mar. 20, 2003 (AU) ................................ 2003901297

(51) Int. Cl.
*B41J 29/13* (2006.01)
*G09G 5/00* (2006.01)
(52) U.S. Cl. ............ 358/1.8; 358/1.1; 358/1.3; 400/416; 400/419; 347/3; 347/37; 347/101; 347/108
(58) Field of Classification Search .................... 358/1.8, 358/1.1, 1.3; 400/416, 419; 347/3, 37, 101, 347/108; 710/104
See application file for complete search history.

(56) References Cited

U.S. PATENT DOCUMENTS

| | | |
|---|---|---|
| 5,186,557 A | 2/1993 | Fushimi |
| 5,364,196 A | 11/1994 | Baitz et al. |
| 5,443,320 A | 8/1995 | Agata et al. |
| 5,558,449 A | 9/1996 | Morgavi |
| 5,602,572 A | 2/1997 | Rylander |
| 5,646,872 A | 7/1997 | Yonenaga et al. |
| 5,731,829 A | 3/1998 | Saito et al. |
| 5,752,049 A | 5/1998 | Lee |
| 5,917,995 A | 6/1999 | Ota |
| 5,967,682 A | 10/1999 | Tanahashi |
| 5,984,446 A | 11/1999 | Silverbrook |
| 6,061,104 A | 5/2000 | Evanicky et al. |
| 6,089,136 A | 7/2000 | Hinojosa et al. |
| 6,120,127 A | 9/2000 | Inoue et al. |
| 6,188,569 B1 | 2/2001 | Minemoto et al. |
| 6,206,593 B1 | 3/2001 | Brenner et al. |
| 6,272,252 B1 | 8/2001 | Eldridge et al. |

(Continued)

FOREIGN PATENT DOCUMENTS

DE    10050805    4/2002

(Continued)

*Primary Examiner* — Chan S Park

(57) ABSTRACT

A monitor having a flat panel display, a printer and a sheet feeder disposed within a housing is disclosed. The flat panel display displays a video signal provided from an external computer through a video input socket of the monitor. The printer is disposed behind the flat panel display as viewed by the user. The printer includes a pagewidth printhead which prints onto print media print data provided from the external computer through a serial data connection of the monitor. The sheet feeder feeds a sheet of print media from a stack of print media past the pagewidth printhead. The stack of print media is located behind the flat panel display such that, immediately prior to commencement of printing, at least an edge of the print media is visible above an upper edge of the flat panel display.

9 Claims, 50 Drawing Sheets

U.S. PATENT DOCUMENTS

| | | |
|---|---|---|
| 6,312,124 B1 | 11/2001 | Desormeaux |
| 6,315,470 B1 | 11/2001 | Vaghi |
| 6,418,010 B1 | 7/2002 | Sawyer |
| 6,428,142 B1 | 8/2002 | Silverbrook et al. |
| 6,474,882 B1 | 11/2002 | Vaghi |
| 6,478,275 B1 | 11/2002 | Huang |
| 6,508,536 B1 | 1/2003 | Beerling et al. |
| 6,508,552 B1 | 1/2003 | Steinfield et al. |
| 6,593,524 B1 | 7/2003 | Toedtman |
| 6,593,944 B1 | 7/2003 | Nicolas et al. |
| 6,973,518 B2 | 12/2005 | Purpura |
| 7,040,823 B2 | 5/2006 | Silverbrook |
| 7,116,344 B2 | 10/2006 | Shimoda |
| 7,125,185 B2 | 10/2006 | Silverbrook |
| 7,280,157 B2 | 10/2007 | Yamada et al. |
| 7,559,476 B2 | 7/2009 | Chen et al. |
| 7,692,815 B2 | 4/2010 | Silverbrook |
| 2002/0146271 A1 | 10/2002 | Luciano et al. |
| 2003/0020784 A1 | 1/2003 | Silverbrook |
| 2003/0075653 A1 | 4/2003 | Li |
| 2004/0085568 A1 | 5/2004 | Sesek et al. |
| 2005/0018220 A1 | 1/2005 | Silverbrook |
| 2008/0175646 A1 | 7/2008 | Silverbrook |

FOREIGN PATENT DOCUMENTS

| | | |
|---|---|---|
| JP | 04-014889 | 1/1992 |
| JP | 04-352228 A | 12/1992 |
| JP | 05-004413 | 1/1993 |
| JP | 05181564 A | 7/1993 |
| JP | 06-059772 A | 3/1994 |
| JP | 06-314137 | 11/1994 |
| JP | 06-314137 A | 11/1994 |
| JP | 08267854 A | 10/1996 |
| JP | 11-282258 | 10/1999 |
| JP | 2001-130090 | 5/2001 |
| JP | 2002-171462 A | 6/2002 |
| JP | 2003-44024 A | 2/2003 |
| JP | 2009-161151 | 7/2009 |

FLAT PANEL DISPLAY

CROSS REFERENCES TO RELATED APPLICATIONS

The present application is a Continuation Application of U.S. application Ser. No. 10/922,848, filed on Aug. 23, 2004, now issued U.S. Pat. No. 7,692,815, which is a Continuation-In-Part of U.S. application Ser. No. 10/803,074, filed on Mar. 18, 2004.

FIELD OF INVENTION

The present invention relates to an integrated printing and flat panel display unit.

The invention has been developed primarily as an integrated peripheral unit that is connectable to a personal computer such as Macintosh or IBM compatible PC. However, it will be appreciated by those skilled in the art that the invention is not limited to these applications.

CO-PENDING APPLICATIONS

Various methods, systems and apparatus relating to the present invention are disclosed in the following co-pending/ granted applications filed by the applicant or assignee of the present invention:

| | | | | |
|---|---|---|---|---|
| 10/922,971 | 7,672,012 | 10/922,842 | 7,419,259 | 7,125,185 |
| 7,229,226 | | | | |

The disclosures of these co-pending applications are incorporated herein by cross-reference.

CROSS-REFERENCES

Various methods, systems and apparatus relating to the present invention are disclosed in the following co-pending applications filed by the applicant or assignee of the present invention. The disclosures of all of these co-pending applications are incorporated herein by cross-reference.

| | | | | |
|---|---|---|---|---|
| 09/575,197 | 6,987,573 | 10/727,162 | 7,377,608 | 7,399,043 |
| 7,121,639 | 7,165,824 | 7,152,942 | 10/727,157 | 7,181,572 |
| 7,096,137 | 7,302,592 | 7,278,034 | 7,188,282 | 7,592,829 |
| 10/727,180 | 10/727,179 | 10/727,192 | 10/727,274 | 10/727,164 |
| 7,523,111 | 7,573,301 | 7,660,998 | 10/754,536 | 10/754,938 |
| 10/727,160 | 7,374,266 | 7,427,117 | 7,448,707 | 7,281,330 |
| 10/854,503 | 7,328,956 | 10/854,509 | 7,188,928 | 7,093,989 |
| 7,377,609 | 7,600,843 | 10/854,498 | 10/854,511 | 7,390,071 |
| 10/854,525 | 10/854,526 | 7,549,715 | 7,252,353 | 7,607,757 |
| 7,267,417 | 10/854,505 | 7,517,036 | 7,275,805 | 7,314,261 |
| 7,281,777 | 7,290,852 | 7,484,831 | 10/854,523 | 10/854,527 |
| 7,549,718 | 10/854,520 | 7,631,190 | 7,557,941 | 10/854,499 |
| 10/854,501 | 7,266,661 | 7,243,193 | 10/854,518 | |

Some applications are temporarily identified by docket numbers. These will be replaced by the corresponding application numbers when available.

BACKGROUND

Flat panel displays are known. A popular technology presently in use is the Thin Film Transistor (TFT) Liquid Crystal Display (LCD), which comprises an array of liquid crystal pixel elements driven by respective thin film transistors. In each element, liquid crystal is sandwiched between glass plates. A backlight is positioned behind the LCD layer relative to a position from which the display will be viewed. A polarizing screen is placed between the backlight and the LCD layer, and another polarizing screen is positioned on the other side of the LCD layer. The polarizing screens are orientated to be orthogonally polarizing with respect to each other.

Using the corresponding TFT to alter a voltage applied to the liquid crystal element causes a change in its crystalline structure that correspondingly alters the polarization of light passing through the element from the backlight. This change in polarization causes a corresponding change in the amount of light transmitted through the polarizing screens and LCD element.

Multiple colors are dealt with by providing each pixel with multiple LCD pixel elements (usually red, green and blue) that can individually be controlled for each pixel, thereby allowing various color combinations.

The design and operation of TFT LCD screens is well known to those skilled in the art and so is not described in more detail in this document.

Typically, flat panel displays, including TFT LCD displays, are more expensive than Cathode Ray Tube (CRT) display of comparable performance. However, the relative lightness and compactness of flat panel displays (particularly in terms of front to back depth) make them particularly suitable for situations where a small footprint is desirable. They are ubiquitous in laptop computers, and have come down in price sufficiently for them to be attractive to many desktop computer users. The relatively shallow front to back depth means that the display can be pushed back further from the user than would be possible with a CRT in many situations, thereby allowing better viewing comfort. Flat panel displays also enable a user to utilize considerably smaller areas than would be possible with an equivalent CRT display, which can be important in situations where a wall, partition or divider is located close to a work area in which the display is to be situated.

Often, computer users wish to print a hard copy of documents, images, web pages and the like. Usually, a printer is provided as a peripheral device that can be connected to the computer using a suitable cable. Alternatively, the computer can be connected via a Local Area Network (LAN) or other communications network. Printers can be bulky, and tend take up additional space in a user's work area. Where space is at a premium, such printers can be intrusive or at least inconvenient. In many cases where a flat panel display is selected, space is already at a premium, so printers can exacerbate the problem.

SUMMARY OF THE INVENTION

In accordance with an aspect of the present invention there is provided a monitor comprising:

a housing;

a flat panel display disposed within the housing for displaying a video signal provided from an external computer through a video input socket of the monitor;

a printer disposed within the housing and behind said flat panel display as viewed by the user, the printer including a pagewidth printhead for printing onto print media print data provided from the external computer through a serial data connection of the monitor; and a sheet feeder disposed within the housing for feeding a sheet of print media from a stack of print media past the pagewidth printhead, the stack of print media being located behind said flat panel display such that, immediately prior to commencement of printing, at least an edge of the print media is visible above an upper edge of the flat panel display.

Other aspects are also disclosed.

The invention will be more fully understood from the following description of an embodiment of a printing and display device that incorporates an exemplified form of the invention. The description is provided with reference to the accompanying drawings.

BRIEF DESCRIPTION OF DRAWINGS

Preferred embodiments of the invention will now be described, by way of example only, with reference to the accompanying drawings, in which.

DETAILED DESCRIPTION OF PREFERRED EMBODIMENT

Figure 1:
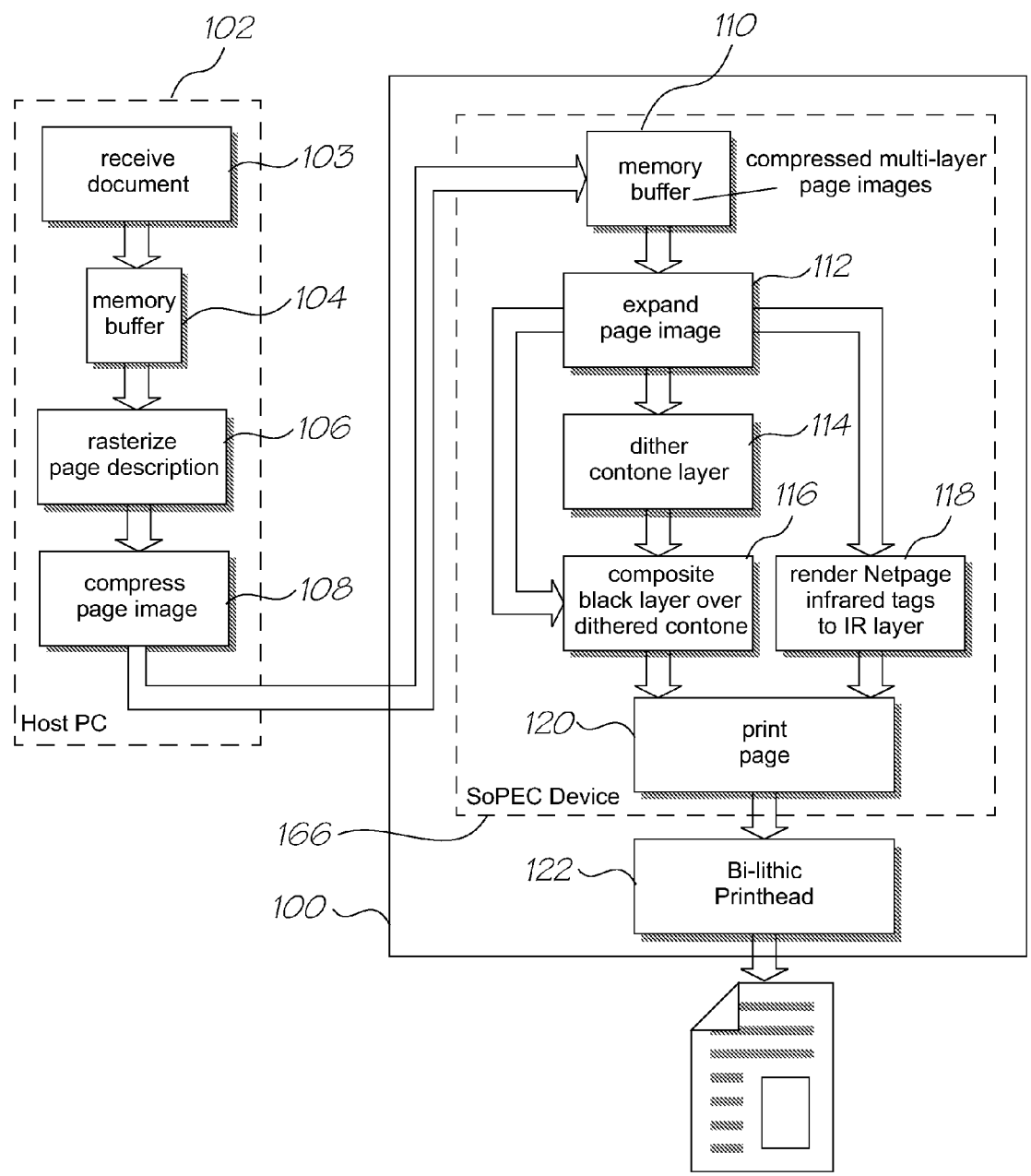
FIG. 1 is a schematic of document data flow in a printing system.

As shown in FIG. 1, in the preferred embodiment, the printing aspect of the invention is embodied in an A4/Letter printer 100 that prints documents supplied by a computer system 102. The computer system 102 is programmed to perform various steps involved in printing a document, including receiving the document (step 103), buffering it (step 104) and rasterizing it (step 106), and then compressing it (step 108) for transmission to the printer 100.

The compressed, multi-layer page image is buffered (step 110) upon receipt in the printer 100, then expanded (step 112). The expanded contone layer is dithered (step 114) and then the black layer from the expansion step is composited over the dithered contone layer (step 116). Coded data can also be rendered (step 118) to form an additional layer, to be printed (in the preferred form) using an infrared ink that is substantially invisible to the human eye. The black, dithered contone and infrared layers are combined (step 120) to form a page that is supplied to a printhead for printing (step 122). In the preferred embodiment, the printhead is a bi-lithic printhead configured to print in 6 colors in a pagewidth format, although the design can be adapted to print using any desired number of colors, and can be monolithic or require multiple substrates depending upon implementation.

The preferred embodiment divides printer data into a high-resolution bi-level mask layer for text and line art and a medium-resolution contone color image layer for images or background colors. Optionally, colored text can be supported by the addition of a medium-to-high-resolution contone texture layer for texturing text and line art with color data taken from an image or from flat colors. The preferred printing architecture, elements of which are described in more detail below, generalises these contone layers by representing them in abstract "image" and "texture" layers which can refer to either image data or flat color data. This division of data into layers based on content follows the base mode Mixed Raster Content (MRC) model specified in ITU-T.44. Like the MRC base mode, the preferred printing architecture makes compromises in some cases when data to be printed overlap. In particular, in the preferred form all overlaps are reduced to a 3-layer representation in a process (collision resolution) embodying the compromises explicitly.

Figure 3:
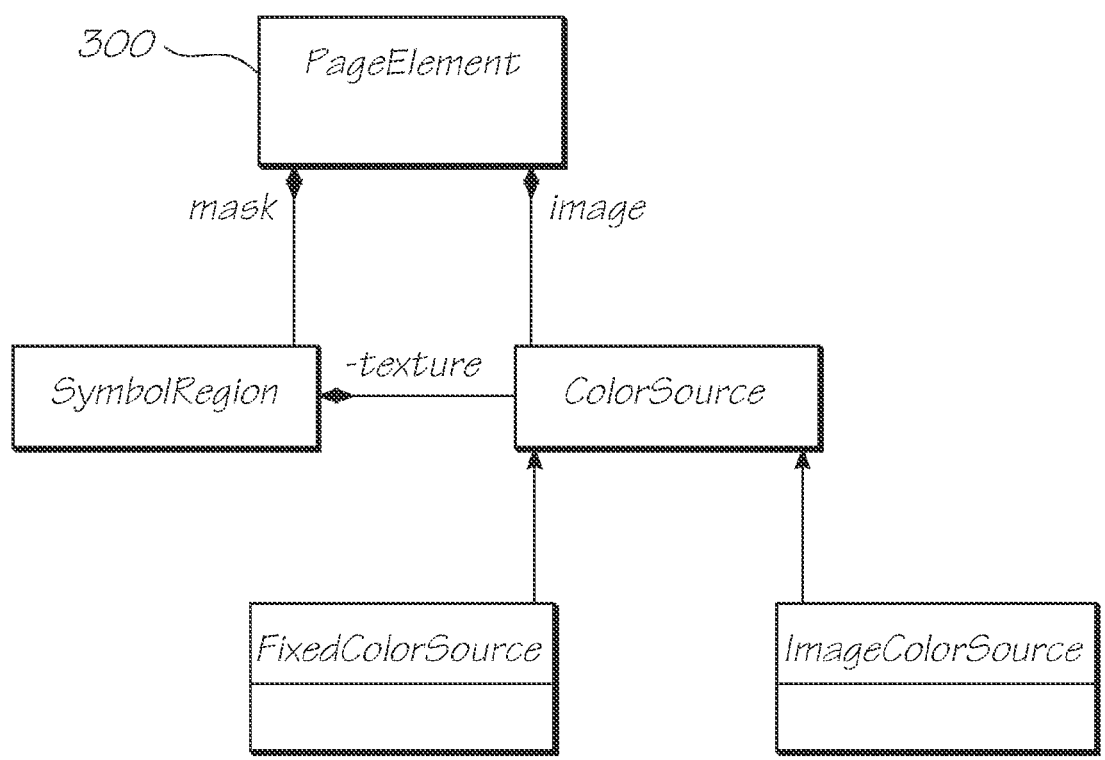
FIG. 3 is a data representation of page element used in the printing system of FIG. 1.

As shown in FIG. 3, the central data structure for the preferred printing architecture is a generalised representation of the three layers, called a page element. A page element can be used to represent units ranging from single rendered elements emerging from a rendering engine up to an entire band of a print job. FIG. 3 shows a simplified UML diagram of a page element 300. Conceptually, the bi-level symbol region selects between the two color sources, as described in more detail below.

Printing Architecture

A more detailed description of the printing architecture will now be described with reference to FIGS. 2 and 3. It will be appreciated that the components of the architecture 208 shown in FIG. 2 will typically be device dependent, in that they process the data into a form required by a software or hardware component further downstream.

Figure 2:
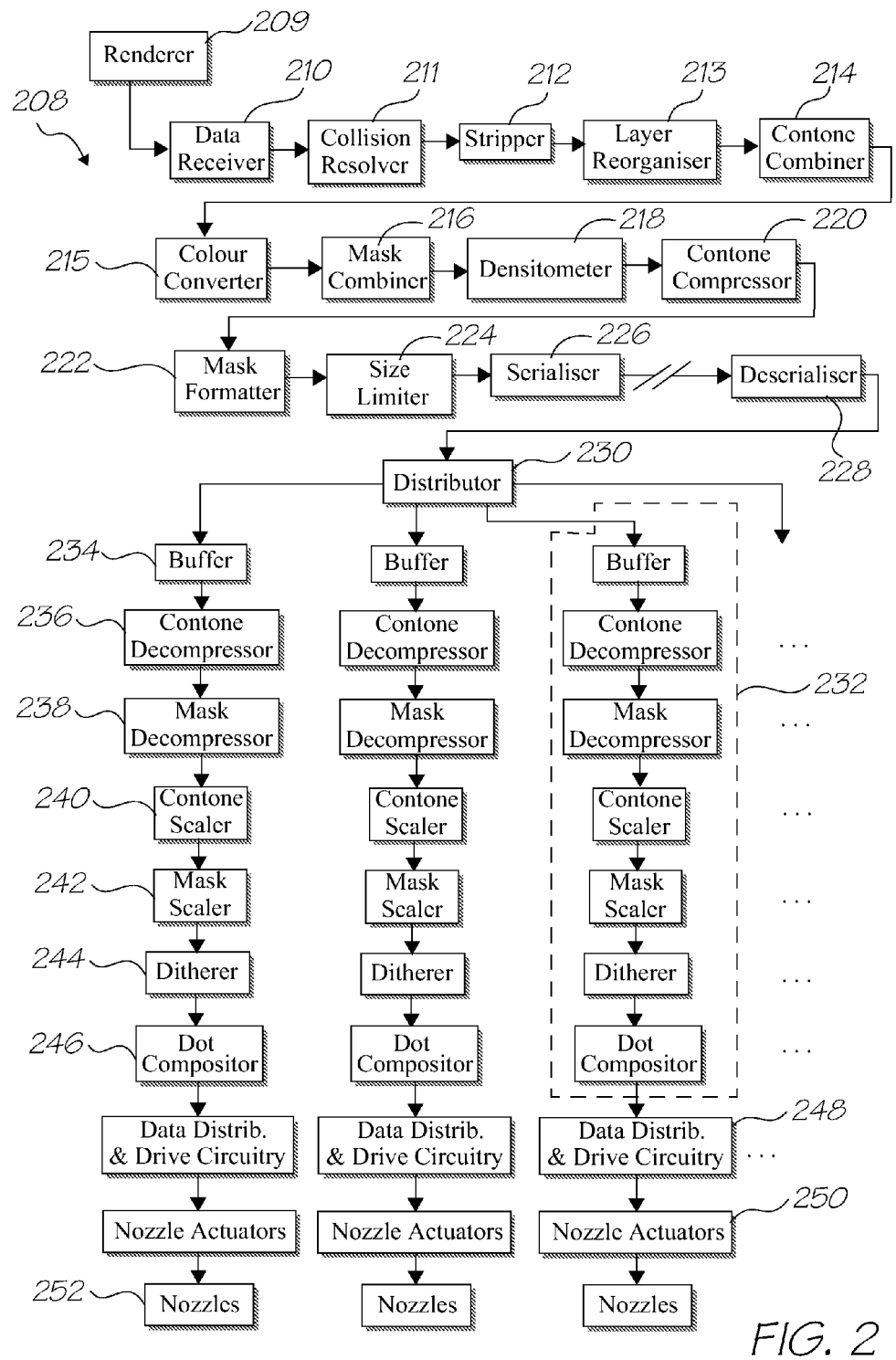
FIG. 2 is a more detailed schematic showing an architecture used in the printing system of FIG. 1.

In FIG. 2, a renderer 209 exists outside of the more general printer system pipeline. Its purpose is to render files to be printed and deliver rendered elements to the data receiver 210 of the pipeline, using an API ("Application Programming Interface") exposed by the data receiver 210 for that purpose. The rendered elements are delivered in order according to the painter's algorithm, which is well known to those skilled in the art of image processing. The data passed in through the API is converted by the data receiver 210 into lists of dictionaries and page elements for processing in later stages.

A collision resolver 211 accepts the simple page elements created by the data receiver and creates a fully opaque "resolved" page element for each intersection of a new element with the background and any elements already present. Fundamentally, the collision resolver guarantees that the entire page is tiled with opaque elements.

A stripper 212 divides a band of data into horizontally overlapping pieces. This need only be performed in the case where relatively wide or fast printers use multiple parallel devices in order to achieve the required output dot-rate. In such cases, each horizontally overlapping piece is fed into a corresponding device downstream. Where such data division is not required, the stripper 212 can be omitted.

Different printing configurations will require different configurations of layers for delivery to the downstream hardware. A layer reorganiser 213 converts 3-layer page elements to the appropriate 2- or 3-layer form for the specific configuration. Again, there may be cases in which this function is not required, in which case the layer organiser can be omitted.

A contone combiner 214 combines and clips the image and texture layers of all page elements in a strip into single image and texture layers, as required by downstream hardware.

A color converter 215 transforms the contone planes of all page elements from the input color space to a device-specific color space (which is usually CMYK).

A mask combiner 216 performs the same operation on the mask layer as the contone combiner performs on the contone layers. All elements are clipped to a strip boundary and drawn into a single mask buffer.

A densitometer 218 measures the density of the current page as a percentage of total possible density. This operation is necessary only in low-end printers with power supplies that may not be able to handle a fully dense page at full speed.

A contone compressor 220 compresses the contone layers of all page elements in order to reduce downstream memory and/or transmission bandwidth requirements.

A mask formatter 222 converts the mask layer of page elements, which may be represented as regions of placed symbol references, into the form expected by a downstream mask decompressor.

A size limiter 224 ensures that all size limitations, for bands and for entire pages, are adhered to, by either dividing bands into smaller bands or by recompressing the data, repeating until the constraint is satisfied.

If data is to be transmitted to the printer between pipeline stages, a serialised form of the data structures is generated (in serialiser 226), transmitted, then deserialised (in deserialiser 228).

Within the printer, a distributor 230 converts data from a proprietary representation into a hardware-specific representation and ensures that the data for each strip is sent to the correct hardware device whilst observing any constraints or requirements on data transmission to these devices. The distributor distributes the converted data to an appropriate one of a plurality of pipelines 232. The pipelines are identical to each other, and in essence provide decompression, scaling and dot compositing functions to generate a set of printable dot outputs.

Each pipeline 232 includes a buffer 234 for receiving the data. A contone decompressor 236 decompresses the color contone planes, and a mask decompressor 238 decompresses the monotone (text) layer. Contone and mask scalers 240 and 242 scale the decompressed contone and mask planes respectively, to take into account the size of the medium onto which the page is to be printed.

The scaled contone planes are then dithered by ditherer 244. In the preferred form, a stochastic dispersed-dot dither is used. Unlike a clustered-dot (or amplitude-modulated) dither, a dispersed-dot (or frequency-modulated) dither reproduces high spatial frequencies (i.e. image detail) almost to the limits of the dot resolution, while simultaneously reproducing lower spatial frequencies to their full color depth, when spatially integrated by the eye. A stochastic dither matrix is carefully designed to be relatively free of objectionable low-frequency patterns when tiled across the image. As such, its size typically exceeds the minimum size required to support a particular number of intensity levels (e.g. 16×16×8 bits for 257 intensity levels).

The dithered planes are then composited in a dot compositor 246 on a dot-by-dot basis to provide dot data suitable for printing. This data is forwarded to data distribution and drive circuitry 248, which in turn distributes the data to the correct nozzle actuators 250, which in turn cause ink to be ejected from the correct nozzles 252 at the correct time. This process is described in more detail below.

The architecture 208 includes a mainly software-based computer system portion prior to the serialiser 226, and a mainly hardware-based printer portion that is located within a printer remote from the computer system, which includes everything from the deserialiser 228 onwards. It will be appreciated, however, that the indicated division between computer system and printer is somewhat arbitrary, and various components can be placed on different sides of the divide without substantially altering the operation of the architecture as a whole. It will also be appreciated that some of the components in the architecture 208 can be handled in hardware or software remotely from the main computer system and printer. For example, rather than relying on the general-purpose processor of a personal computer, some of the components in the architecture can be accelerated using dedicated hardware.

SoPEC Device

In the preferred form, the hardware pipelines 232 are embodied in a Small Office Home Office Printer Engine Controller (SoPEC), as shown in FIG. 2 and described in more detail below. The printer preferably also includes one or more system on a chip (SoC) components, as well as the print engine pipeline control application specific logic, configured to perform some or all of the functions described above in relation to the printing pipeline.

Figure 45:
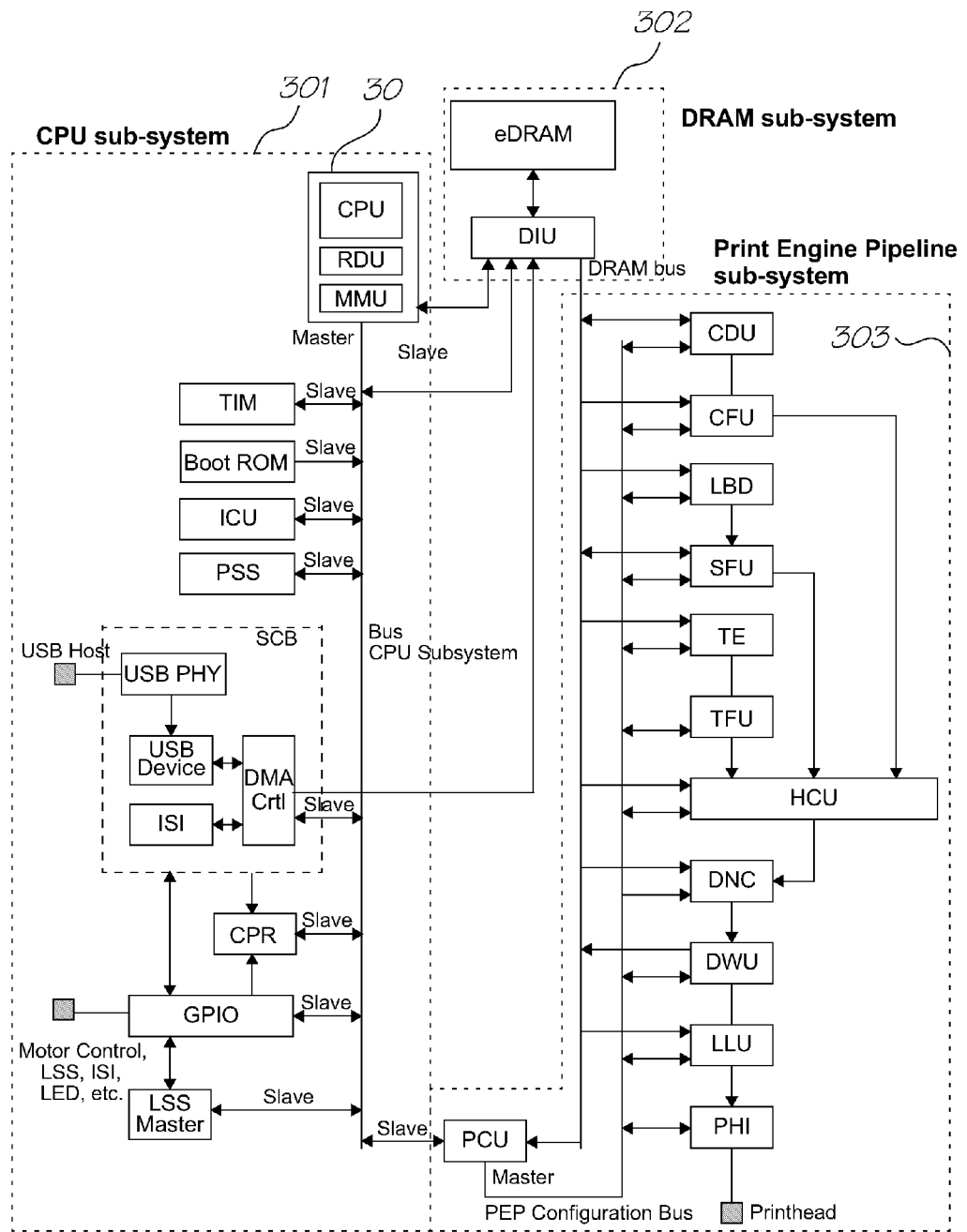
FIG. 45 is a schematic view of a print engine chip incorporated in the flat panel display of FIG. 8.

As shown in FIG. 45, from the highest point of view a SoPEC device consists of 3 distinct subsystems: a Central Processing Unit (CPU) subsystem 301, a Dynamic Random Access Memory (DRAM) subsystem 302 and a Print Engine Pipeline (PEP) subsystem 303.

The CPU subsystem 301 includes a CPU 30 that controls and configures all aspects of the other subsystems. It provides general support for interfacing and synchronizing the external printer with the internal print engine. It also controls the low-speed communication to QA chips (which are described elsewhere in this specification). The CPU subsystem 301 also contains various peripherals to aid the CPU, such as General Purpose Input Output (GPIO, which includes motor control), an Interrupt Controller Unit (ICU), LSS Master and general timers. The Serial Communications Block (SCB) on the CPU subsystem provides a full speed USB1.1 interface to the host as well as an Inter SoPEC Interface (ISI) to other SoPEC devices (not shown).

The DRAM subsystem 302 accepts requests from the CPU, Serial Communications Block (SCB) and blocks within the PEP subsystem. The DRAM subsystem 302, and in particular the DRAM Interface Unit (DIU), arbitrates the various requests and determines which request should win access to the DRAM. The DIU arbitrates based on configured parameters, to allow sufficient access to DRAM for all requestors. The DIU also hides the implementation specifics of the DRAM such as page size, number of banks and refresh rates.

The Print Engine Pipeline (PEP) subsystem 303 accepts compressed pages from DRAM and renders them to bi-level dots for a given print line destined for a printhead interface that communicates directly with up to 2 segments of a bi-lithic printhead. The first stage of the page expansion pipeline is the Contone Decoder Unit (CDU), Lossless Bi-level Decoder (LBD) and Tag Encoder (TE). The CDU expands the JPEG-compressed contone (typically CMYK) layers, the LBD expands the compressed bi-level layer (typically K), and the TE encodes Netpage tags for later rendering (typically in IR or K ink). The output from the first stage is a set of buffers: the Contone FIFO unit (CFU), the Spot FIFO Unit (SFU), and the Tag FIFO Unit (TFU). The CFU and SFU buffers are implemented in DRAM.

The second stage is the Halftone Compositor Unit (HCU), which dithers the contone layer and composites position tags and the bi-level spot layer over the resulting bi-level dithered layer.

A number of compositing options can be implemented, depending upon the printhead with which the SoPEC device is used. Up to 6 channels of bi-level data are produced from this stage, although not all channels may be present on the printhead. For example, the printhead may be CMY only, with K pushed into the CMY channels and IR ignored. Alternatively, the encoded tags may be printed in K if IR ink is not available (or for testing purposes).

In the third stage, a Dead Nozzle Compensator (DNC) compensates for dead nozzles in the printhead by color redundancy and error diffusing of dead nozzle data into surrounding dots.

The resultant bi-level 6 channel dot-data (typically CMYK, Infrared, Fixative) is buffered and written to a set of line buffers stored in DRAM via a Dotline Writer Unit (DWU).

Finally, the dot-data is loaded back from DRAM, and passed to the printhead interface via a dot FIFO. The dot FIFO accepts data from a Line Loader Unit (LLU) at the system clock rate (pclk), while the PrintHead Interface (PHI) removes data from the FIFO and sends it to the printhead at a rate of ⅔ times the system clock rate.

In the preferred form, the DRAM is 2.5 Mbytes in size, of which about 2 Mbytes are available for compressed page store data. A compressed page is received in two or more bands, with a number of bands stored in memory. As a band of the page is consumed by the PEP subsystem 303 for printing, a new band can be downloaded. The new band may be for the current page or the next page.

Using banding it is possible to begin printing a page before the complete compressed page is downloaded, but care must be taken to ensure that data is always available for printing or a buffer under-run may occur.

The embedded USB 1.1 device accepts compressed page data and control commands from the host PC, and facilitates the data transfer to either the DRAM (or to another SoPEC device in multi-SoPEC systems, as described below).

Multiple SoPEC devices can be used in alternative embodiments, and can perform different functions depending upon the particular implementation. For example, in some cases a SoPEC device can be used simply for its onboard DRAM, while another SoPEC device attends to the various decompression and formatting functions described above. This can reduce the chance of buffer under-run, which can happen in the event that the printer commences printing a page prior to all the data for that page being received and the rest of the data is not received in time. Adding an extra SoPEC device for its memory buffering capabilities doubles the amount of data that can be buffered, even if none of the other capabilities of the additional chip are utilized.

Each SoPEC system can have several quality assurance (QA) devices designed to cooperate with each other to ensure the quality of the printer mechanics, the quality of the ink supply so the printhead nozzles will not be damaged during prints, and the quality of the software to ensure printheads and mechanics are not damaged.

Normally, each printing SoPEC will have an associated printer QA, which stores information printer attributes such as maximum print speed. An ink cartridge for use with the system will also contain an ink QA chip, which stores cartridge information such as the amount of ink remaining. The printhead also has a QA chip, configured to act as a ROM (effectively as an EEPROM) that stores printhead-specific information such as dead nozzle mapping and printhead characteristics. The CPU in the SoPEC device can optionally load and run program code from a QA Chip that effectively acts as a serial EEPROM. Finally, the CPU in the SoPEC device runs a logical QA chip (i.e., a software QA chip).

Usually, all QA chips in the system are physically identical, with only the contents of flash memory differentiating one from the other.

Each SoPEC device has two LSS system buses that can communicate with QA devices for system authentication and ink usage accounting. A large number of QA devices can be used per bus and their position in the system is unrestricted with the exception that printer QA and ink QA devices should be on separate LSS busses.

In use, the logical QA communicates with the ink QA to determine remaining ink. The reply from the ink QA is authenticated with reference to the printer QA. The verification from the printer QA is itself authenticated by the logical QA, thereby indirectly adding an additional authentication level to the reply from the ink QA.

Data passed between the QA chips, other than the printhead QA, is authenticated by way of digital signatures. In the preferred embodiment, HMAC-SHA1 authentication is used for data, and RSA is used for program code, although other schemes could be used instead.

A single SoPEC device can control two bi-lithic printheads and up to six color channels. Six channels of colored ink are the expected maximum in a consumer SOHO, or office bi-lithic printing environment, and include:

CMY (cyan, magenta, yellow), for regular color printing.

K (black), for black text, line graphics and gray-scale printing.

IR (infrared), for Netpage-enabled applications.

F (fixative), to enable printing at high speed.

Because the bi-lithic printer is capable of printing so fast, a fixative may be required to enable the ink to dry before the page touches the page already printed. Otherwise ink may bleed between pages. In relatively low-speed printing environments the fixative may not be required.

In the preferred form, the SoPEC device is color space agnostic. Although it can accept contone data as CMYX or RGBX, where X is an optional 4th channel, it also can accept contone data in any print color space. Additionally, SoPEC provides a mechanism for arbitrary mapping of input channels to output channels, including combining dots for ink optimization and generation of channels based on any number of other channels. However, inputs are typically CMYK for contone input, K for the bi-level input, and the optional Netpage tag dots are typically rendered to an infrared layer. A fixative channel is typically generated for fast printing applications.

In the preferred form, the SoPEC device is also resolution agnostic. It merely provides a mapping between input resolutions and output resolutions by means of scale factors. The expected output resolution for the preferred embodiment is 1600 dpi, but SoPEC actually has no knowledge of the physical resolution of the Bi-lithic printhead.

In the preferred form, the SoPEC device is page-length agnostic. Successive pages are typically split into bands and downloaded into the page store as each band of information is consumed.

The following three tables show the constituents of each of the three distinct subsystems which make up the SoPEC device. In particular, each of the columns provide the unit acronym, the unit name and a description of the functions performed by each unit.

| Subsystem | Unit Acronym | Unit Name | Description |
| --- | --- | --- | --- |
| DRAM | DIU | DRAM interface unit | Provides interface for DRAM read and write access for the various SoPEC units, CPU and the SCB block. The DIU provides arbitration between competing units and controls DRAM access. |
|  | DRAM | Embedded DRAM | 20 Mbits of embedded DRAM. |
| CPU | CPU | Central Processing Unit | CPU for system configuration and control. |
|  | MMU | Memory Management Unit | Limits access to certain memory address areas in CPU user mode. |
|  | RDU | Real-time Debug Unit | Facilitates the observation of the contents of most of the CPU addressable registers in SoPEC, in addition to some pseudo-registers in real time. |

-continued

| Subsystem | Unit Acronym | Unit Name | Description |
|---|---|---|---|
| | TIM | General Timer | Contains watchdog and general system timers. |
| | LSS | Low Speed Serial Interfaces | Low level controller for interfacing with the QA chips |
| | GPIO | General Purpose IOs | General IO controller, with built-in Motor control unit, LED pulse units and de-glitch circuitry |
| | ROM | Boot ROM | 16 KBytes of System Boot ROM code |
| | ICU | Interrupt Controller Unit | General Purpose interrupt controller with configurable priority, and masking. |
| | CPR | Clock, Power and Reset block | Central Unit for controlling and generating the system clocks and resets and powerdown mechanisms |
| | PSS | Power Save Storage | Storage retained while system is powered down |
| | USB | Universal Serial Bus Device | USB device controller for interfacing with the host USB. |
| | ISI | Inter-SoPEC Interface | ISI controller for data and control communication with other SoPECs in a multi-SoPEC system |
| | SCB | Serial Communication Block | Contains both the USB and ISI blocks. |
| Print Engine Pipeline (PEP) | PCU | PEP controller | Provides external CPU with the means to read and write PEP Unit registers, and read and write DRAM in single 32-bit chunks. |
| | CDU | Contone Decoder Unit | Expands JPEG compressed contone layer and writes decompressed contone to DRAM |
| | CFU | Contone FIFO Unit | Provides line buffering between CDU and HCU |
| | LBD | Lossless Bi-level Decoder | Expands compressed bi-level layer. |
| | SFU | Spot FIFO Unit | Provides line buffering between LBD and HCU |
| | TE | Tag Encoder | Encodes tag data into line of tag dots. |
| | TFU | Tag FIFO Unit | Provides tag data storage between TE and HCU |
| | HCU | Halftoner Compositor Unit | Dithers contone layer and composites the bi-level spot and position tag dots. |
| | DNC | Dead Nozzle Compensator | Compensates for dead nozzles by color redundancy and error diffusing dead nozzle data into surrounding dots. |
| | DWU | Dotline Writer Unit | Writes out the 6 channels of dot data for a given printline to the line store DRAM |
| | LLU | Line Loader Unit | Reads the expanded page image from line store, formatting the data appropriately for the bi-lithic printhead. |
| | PHI | PrintHead Interface | Responsible for sending dot data to the bi-lithic printheads and for providing line synchronization between multiple SoPECs. Also provides test interface to printhead such as temperature monitoring and Dead Nozzle Identification. |

Printhead Mechanical

In the preferred form, a Memjet printer has two printhead integrated circuits that are mounted adjacent each other to form a pagewidth printhead. Typically, the printhead ICs can vary in size from 2 inches to 8 inches, so several combinations can be used to produce, say, an A4 pagewidth printhead. For example two printhead ICs of 7 and 3 inches, 2 and 4 inches, or 5 and 5 inches could be used to create an A4 printhead (the notation is 7:3). Similarly 6 and 4 (6:4) or 5 and 5 (5:5) combinations can be used. An A3 printhead can be constructed from 8 and 6-inch printhead integrated circuits, for example. For photographic printing, particularly in camera, smaller printheads can be used. It will also be appreciated that a single printhead integrated circuit, or more than two such circuits, can also be used to achieve the required printhead width.

Figure 40:
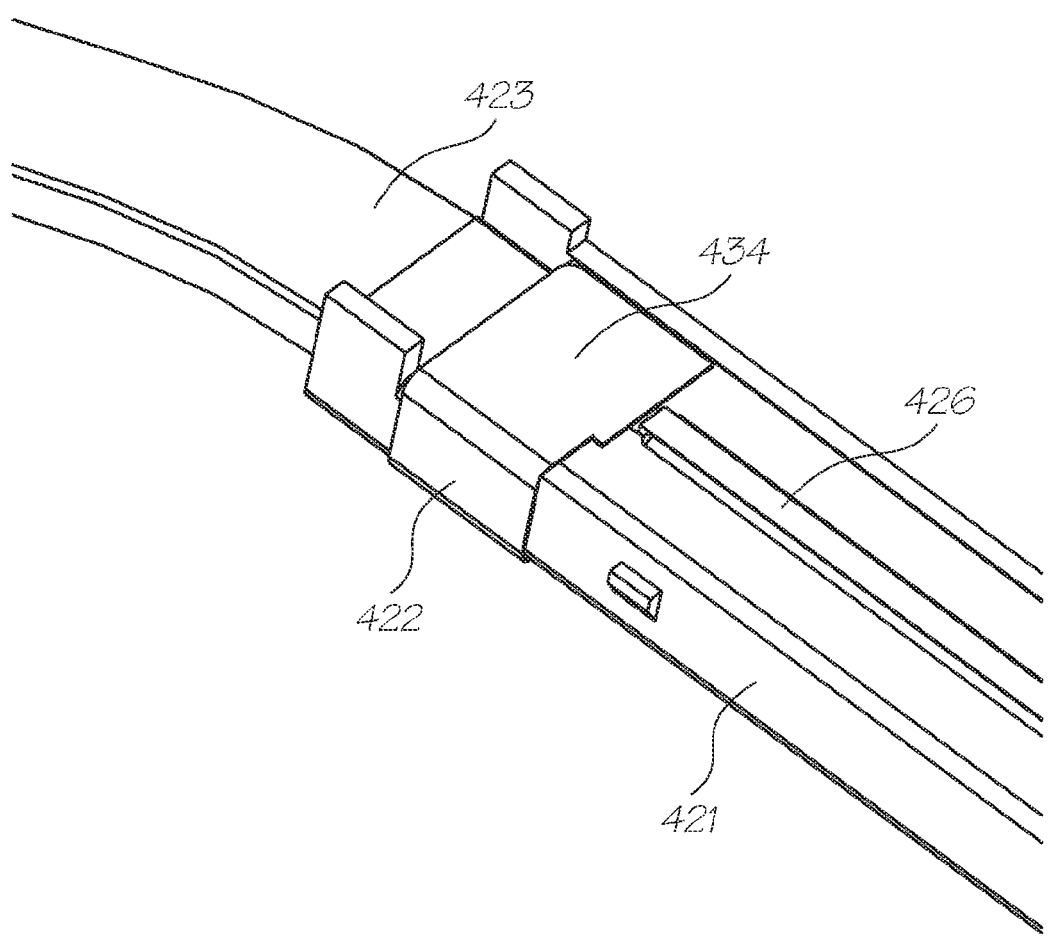
FIG. 40 is an enlarged detail perspective view of one end of the bi-lithic printhead of FIG. 33.
Figure 41:
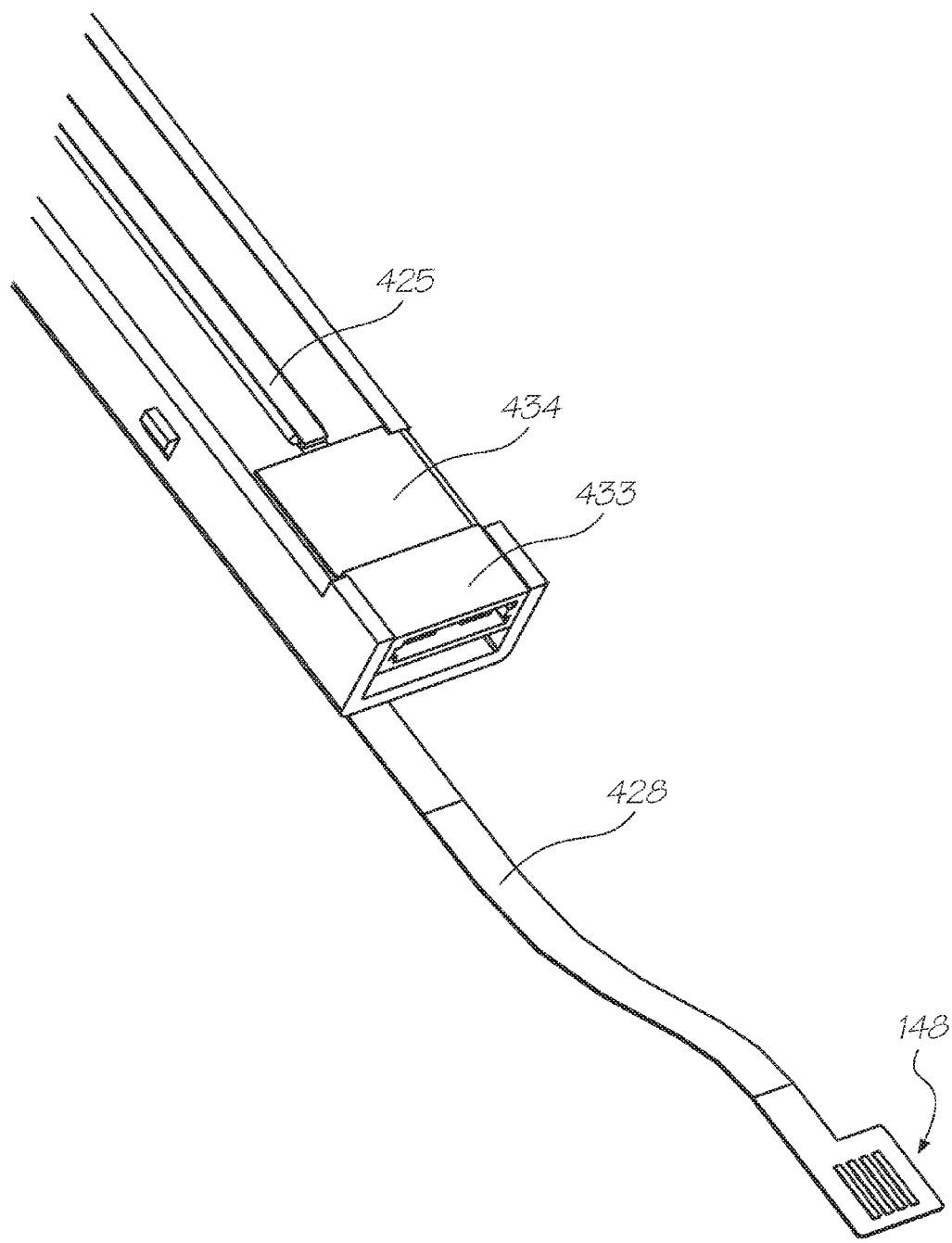
FIG. 41 is an enlarged detail perspective view of an opposite end of the bi-lithic printhead of FIG. 33.
Figure 42:
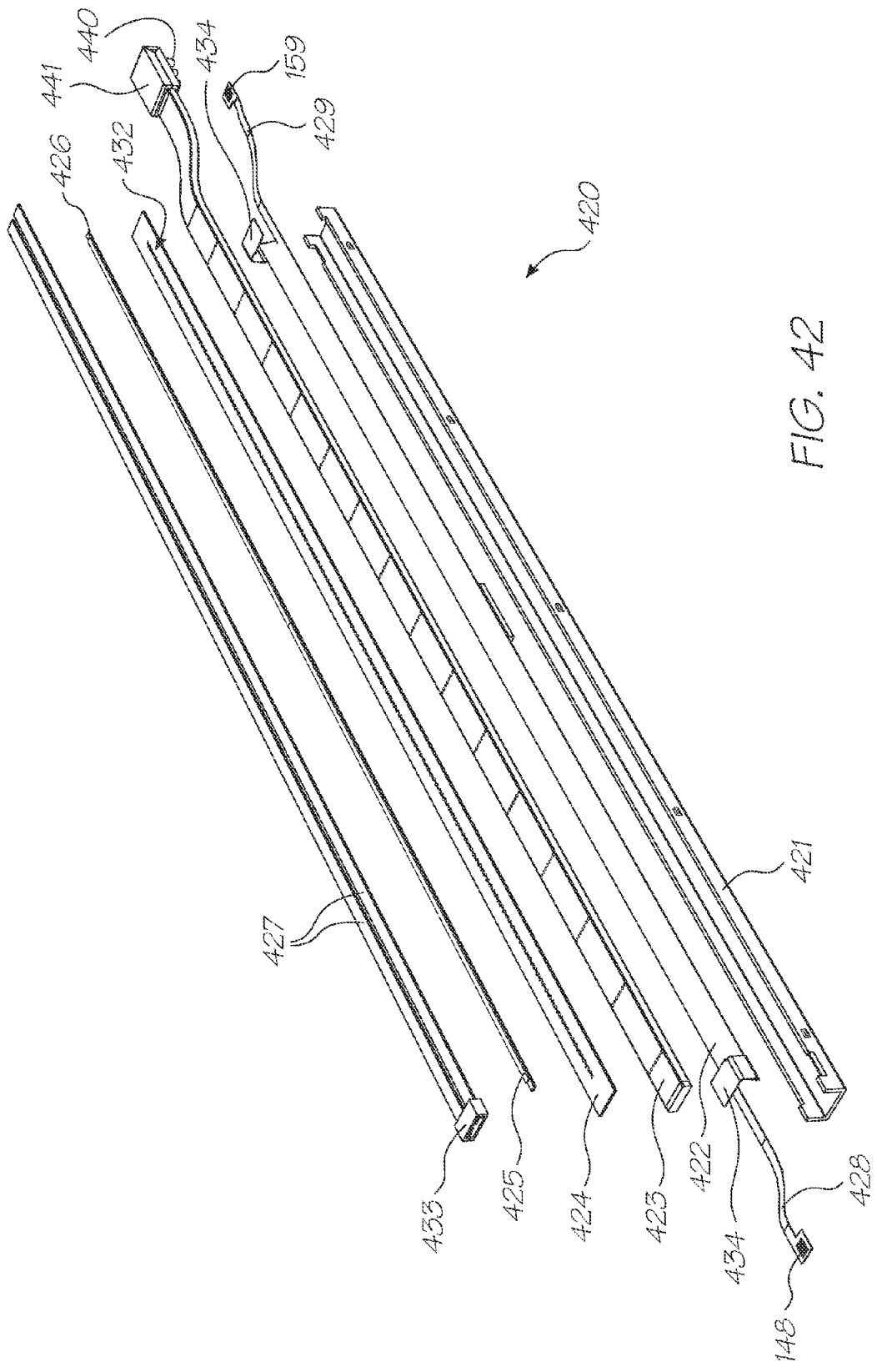
FIG. 42 is an exploded perspective view of the bi-lithic printhead of FIG. 33.

A preferred printhead embodiment will now be described with reference to FIGS. 33 to 43. As best shown in FIGS. 33 to 35 and FIG. 42, a printhead 420 takes the form of an elongate unit. As best shown in FIG. 42, the components of the printhead 420 include a support member 421, a flexible PCB 422, an ink distribution molding 423, an ink distribution plate 424, a MEMS printhead comprising first and second printhead integrated circuits (ICs) 425 and 426, and busbars 427.

The support member 421 is can be formed from any suitable material, such as metal or plastic, and can be extruded, molded or formed in any other way. The support member 421 should be strong enough to hold the other components in the appropriate alignment relative to each other whilst stiffening and strengthening the printhead as a whole.

Figure 21:
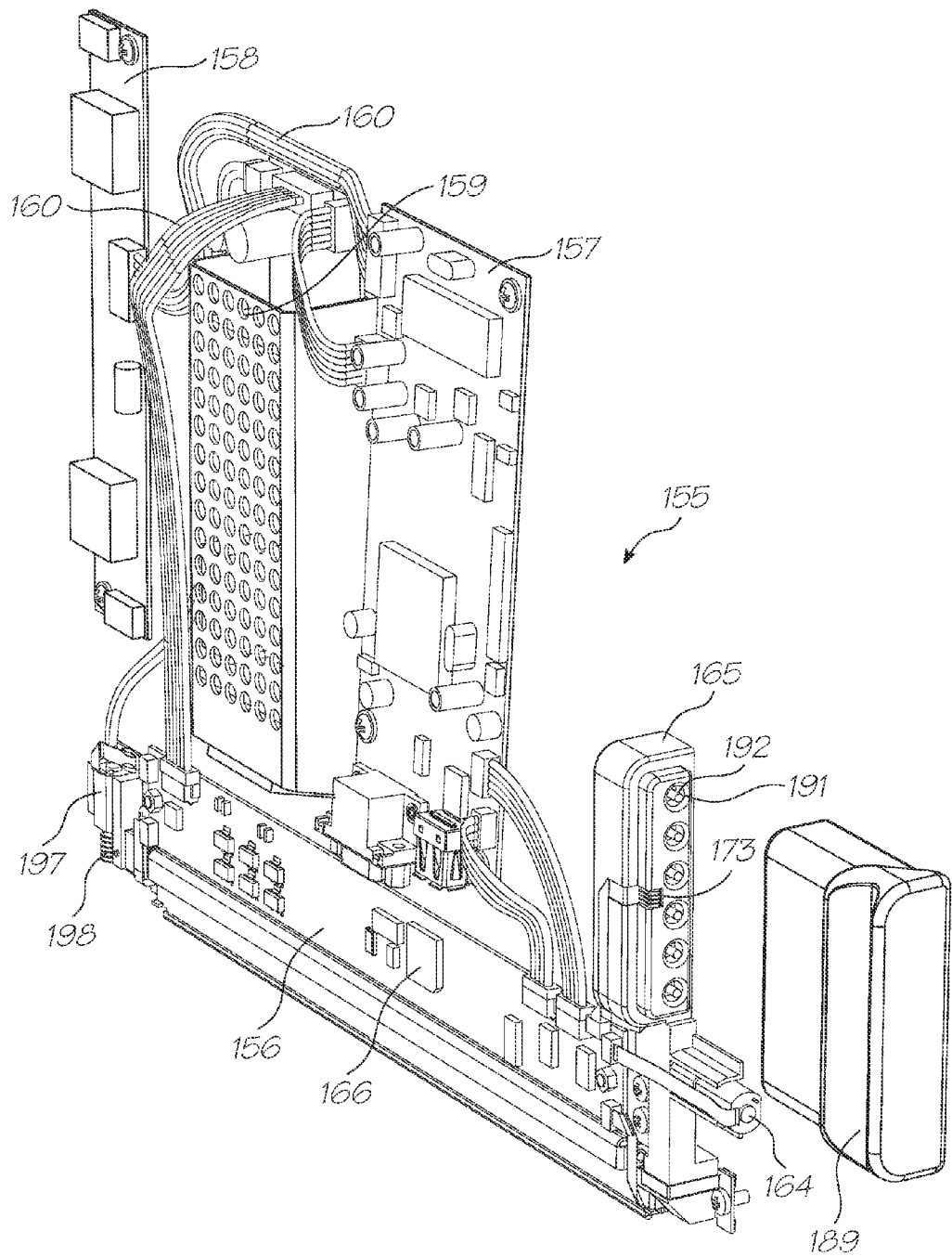
FIG. 21 is a perspective view of interconnected printed circuit boards used in the flat panel display of FIG. 8.

The flexible PCB extends the length of the printhead 420 and includes first and second electrical connectors 428 and 429. The electrical connectors 428 and 429 correspond with the flexible connectors 147 shown FIG. 22. The electrical connectors include contact areas 148 and 159 that, in use, are positioned in contact with corresponding output connectors (not shown) from the SoPEC chip 166 (FIG. 21). Data from the SoPEC chip 166 passes along the electrical connectors 428 and 429, and is distributed to respective ends of the first and second printhead ICs 425 and 426.

Figure 43:
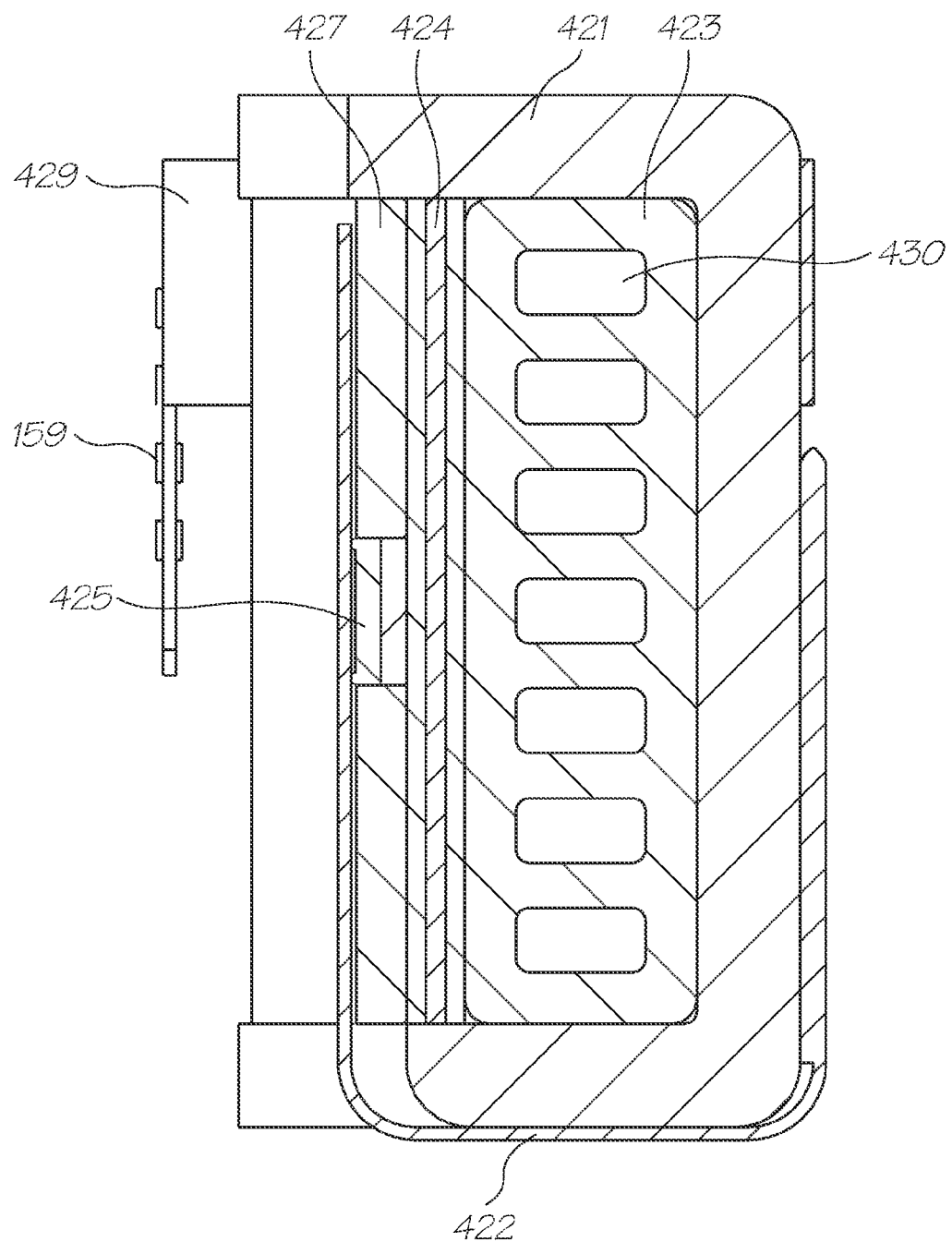
FIG. 43 is a sectional view taken along line 49-49 in FIG. 38.

As shown in FIG. 43, the ink distribution molding 423 includes a plurality of elongate conduits 430 that distribute fluids (i.e., colored inks, infrared ink and fixative) and pressurized air from the air pump along the length of the printhead 420 (FIG. 42). Sets of fluid apertures 431 (FIG. 39) disposed along the length of the ink distribution molding 423 distribute the fluids and air from the conduits 430 to the ink distribution plate 424. The fluids and air are supplied via nozzles 440 formed on a plug 441 (FIG. 35), which plugs into a corresponding socket (not shown) in the printer.

Figure 39:
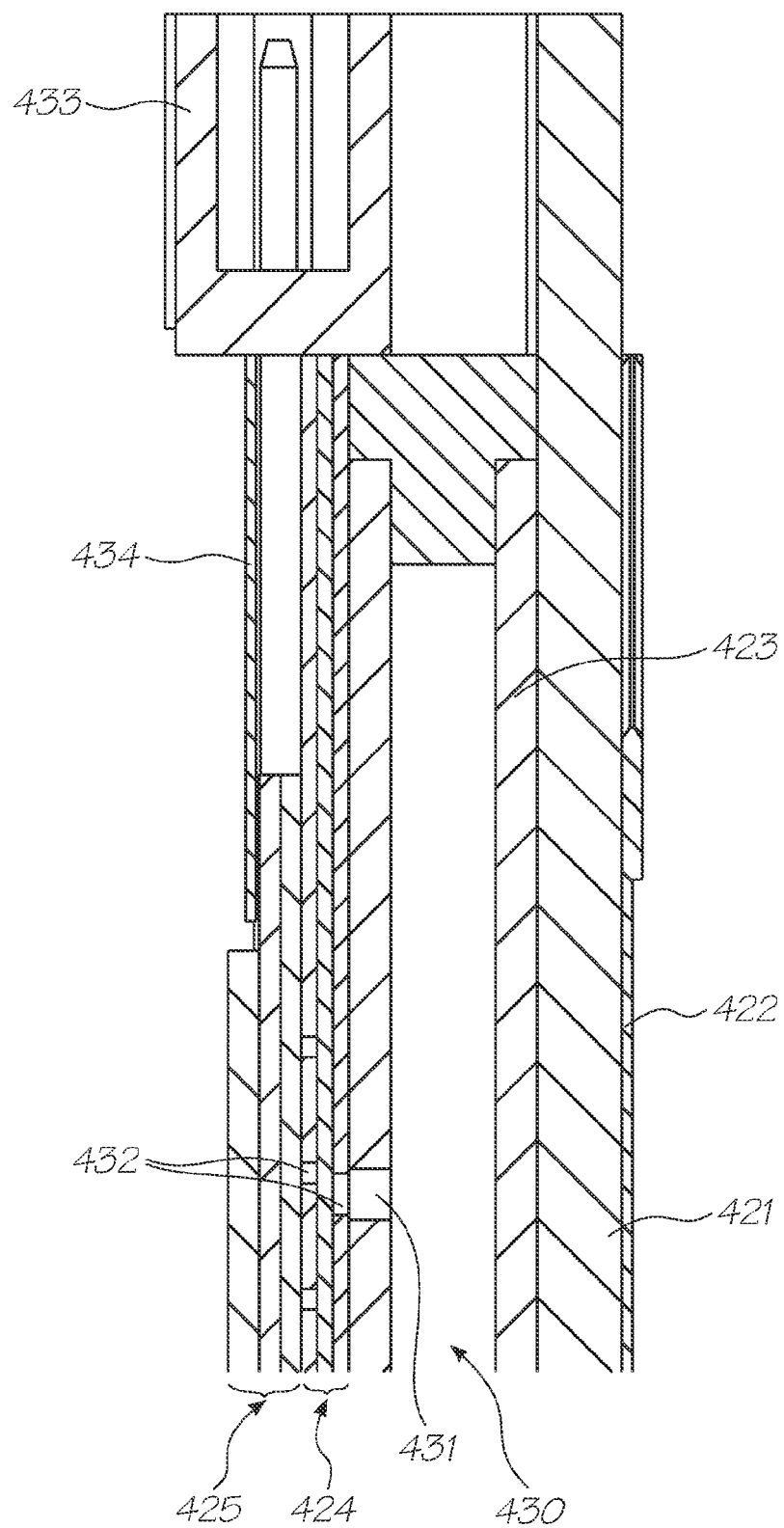
FIG. 39 is a sectional view taken along line 45-45 in FIG. 38.

The distribution plate 424 is a multi-layer construction configured to take fluids provided locally from the fluid apertures 431 and distribute them through smaller distribution apertures 432 into the printhead ICs 425 and 426 (as shown in FIG. 39).

The printhead ICs 425 and 426 are positioned end to end, and are held in contact with the distribution plate 424 so that ink from the smaller distribution apertures 432 can be fed into corresponding apertures (not shown) in the printhead ICs 425 and 426.

Figure 38:
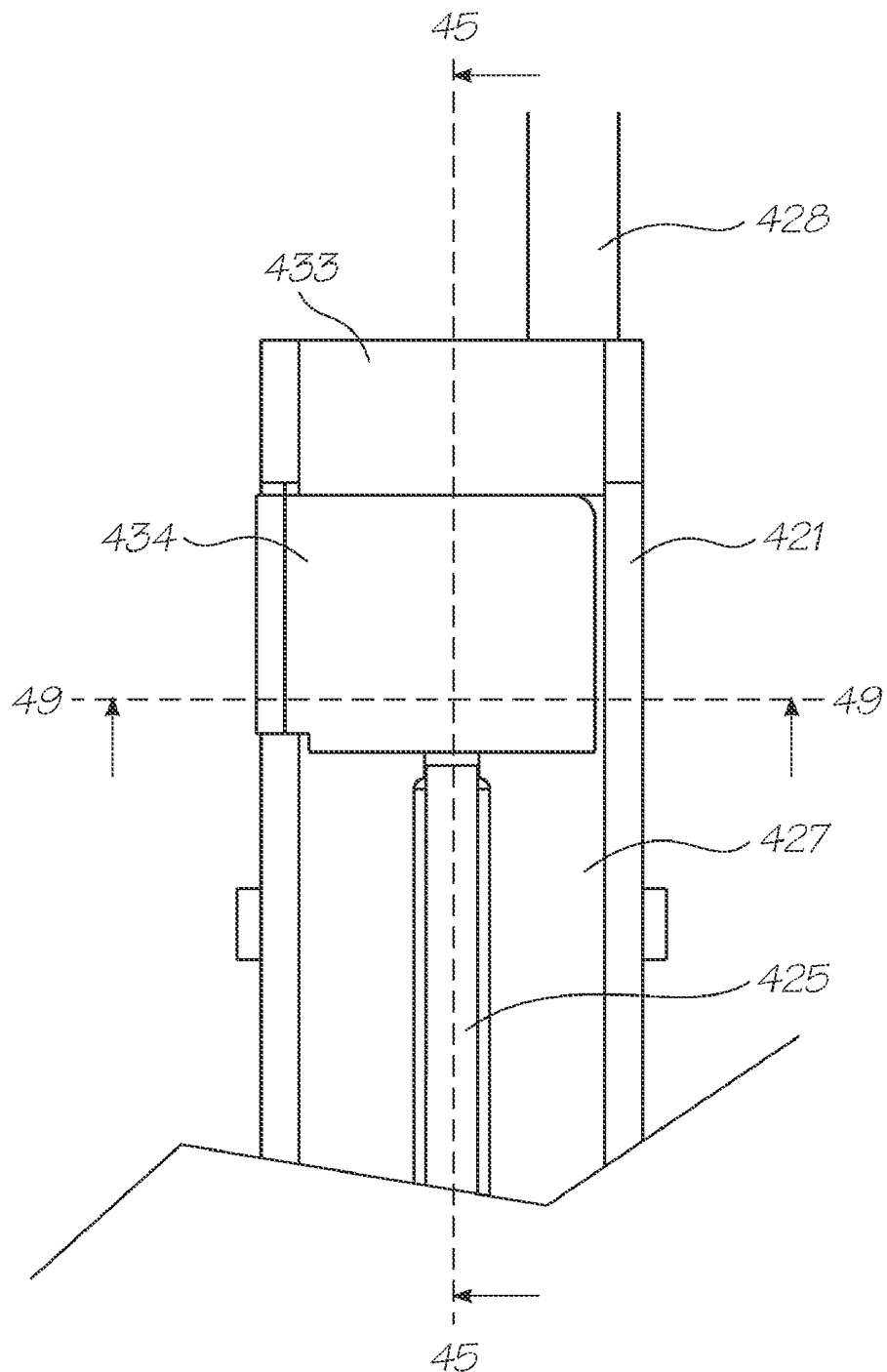
FIG. 38 shows an enlarged detail plan view of one end of the bi-lithic printhead of FIG. 33.

The busbars 427 are relatively high-capacity conductors positioned to provide drive current to the actuators of the printhead nozzles (described in detail below). As best shown in FIGS. 39 to 41, the busbars 427 are retained in position at one end by a socket 433, and at both ends by wrap-around wings 434 of the flexible PCB 422. The busbars also help hold the printhead ICs 425 in position, as best shown in FIGS. 38, 40 and 41.

As shown best in FIGS. 40, 41 and 42, when assembled, the flexible PCB 422 is effectively wrapped around the other components, thereby holding them in contact with each other. Notwithstanding this binding effect, the support member 421 provides a major proportion of the required stiffness and strength of the printhead 420 as a whole.

Printhead CMOS

Figure 4:
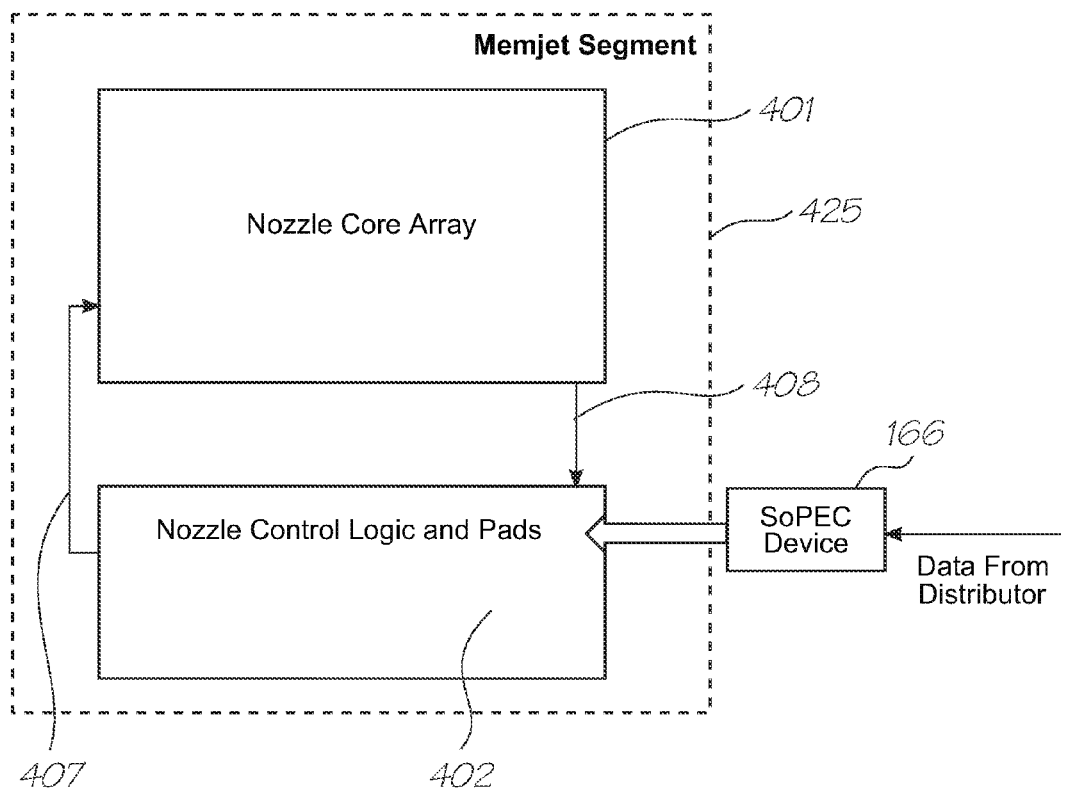
FIG. 4 is a schematic showing CMOS drive and control blocks for use with the printer of FIG. 1.

Turning now to FIGS. 4 to 7, a preferred embodiment of the printhead 420 (comprising printhead ICs 425 and 426) will be described. For clarity, only one printhead IC 425 is shown in FIG. 4, but it will be appreciated that a corresponding arrangement is implemented for the printhead IC 426.

FIG. 4 shows an overview of printhead IC 425 and its connections to the SoPEC device 166. Printhead IC 425 includes a nozzle core array 401 containing the repeated logic to fire each nozzle, and nozzle control logic 402 to generate the timing signals to fire the nozzles. The nozzle control logic 402 receives data from the SoPEC chip 166 via a high-speed link. In the preferred form, a single SoPEC chip 166 feeds the two printhead ICs 425 and 426 with print data.

The nozzle control logic 402 is configured to send serial data to the nozzle array core for printing, via a link 407, which for printhead 425 is the electrical connector 428. Status and other operational information about the nozzle array core 401 is communicated back to the nozzle control logic via another link 408, which is also provided on the electrical connector 428.

Figure 5:
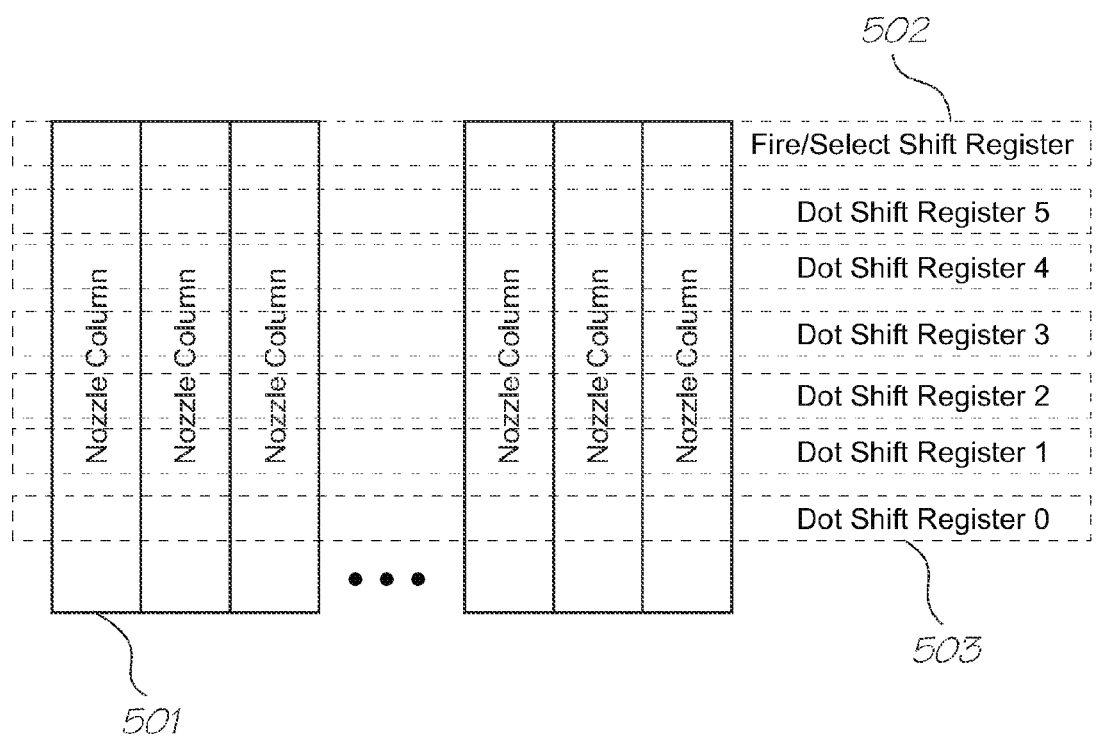
FIG. 5 is a schematic showing the relationship between nozzle columns and dot shift registers in the CMOS blocks of FIG. 4.
Figure 6:
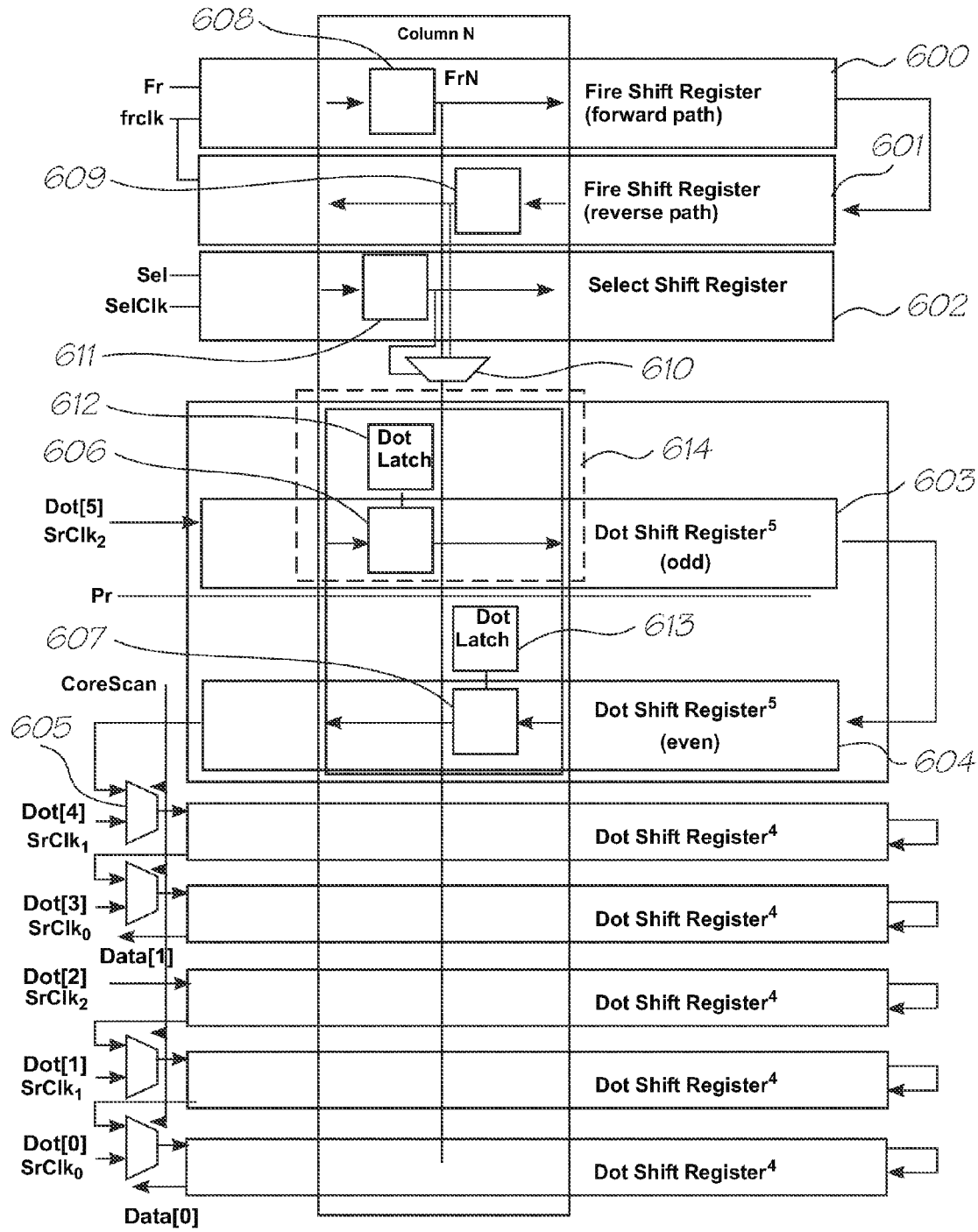
FIG. 6 is a more detailed schematic showing a unit cell and its relationship to the nozzle columns and dot shift registers of FIG. 5.

The nozzle array core 401 is shown in more detail in FIGS. 5 and 6. In FIG. 5, it will be seen that the nozzle array core comprises an array of nozzle columns 501. The array includes a fire/select shift register 502 and up to 6 color channels, each of which is represented by a corresponding dot shift register 503.

As shown in FIG. 6, the fire/select shift register 502 includes forward path fire shift register 600, a reverse path fire shift register 601 and a select shift register 602. Each dot shift register 503 includes an odd dot shift register 603 and an even dot shift register 604. The odd and even dot shift registers 603 and 604 are connected at one end such that data is clocked through the odd shift register 603 in one direction, then through the even shift register 604 in the reverse direction. The output of all but the final even dot shift register is fed to one input of a multiplexer 605. This input of the multiplexer is selected by a signal (corescan) during post-production testing. In normal operation, the corescan signal selects dot data input Dot[x] supplied to the other input of the multiplexer 605. This causes Dot[x] for each color to be supplied to the respective dot shift registers 503.

A single column N will now be described with reference to FIG. 6. In the embodiment shown, the column N includes 12 data values, comprising an odd data value 606 and an even data value 607 for each of the six dot shift registers. Column N also includes an odd fire value 608 from the forward fire shift register 600 and an even fire value 609 from the reverse fire shift register 601, which are supplied as inputs to a multiplexer 610. The output of the multiplexer 610 is controlled by the select value 611 in the select shift register 602. When the select value is zero, the odd fire value is output, and when the select value is one, the even fire value is output.

Each of the odd and even data values 606 and 607 is provided as an input to corresponding odd and even dot latches 612 and 613 respectively.

Each dot latch and its associated data value form a unit cell, such as unit cell 614. A unit cell is shown in more detail in FIG. 7. The dot latch 612 is a D-type flip-flop that accepts the output of the data value 606, which is held by a D-type flip-flop 614 forming an element of the odd dot shift register 603. The data input to the flip-flop 614 is provided from the output of a previous element in the odd dot shift register (unless the element under consideration is the first element in the shift register, in which case its input is the Dot[x] value). Data is clocked from the output of flip-flop 614 into latch 612 upon receipt of a negative pulse provided on LsyncL.

The output of latch 612 is provided as one of the inputs to a three-input AND gate 615. Other inputs to the AND gate 615 are the Fr signal (from the output of multiplexer 610) and a pulse profile signal Pr. The firing time of a nozzle is controlled by the pulse profile signal Pr, and can be, for example, lengthened to take into account a low voltage condition that arises due to low battery (in a battery-powered embodiment). This is to ensure that a relatively consistent amount of ink is efficiently ejected from each nozzle as it is fired. In the embodiment described, the profile signal Pr is the same for each dot shift register, which provides a balance between complexity, cost and performance. However, in other embodiments, the Pr signal can be applied globally (i.e., is the same for all nozzles), or can be individually tailored to each unit cell or even to each nozzle.

Once the data is loaded into the latch 612, the fire enable Fr and pulse profile Pr signals are applied to the AND gate 615, combining to the trigger the nozzle to eject a dot of ink for each latch 612 that contains a logic 1.

The signals for each nozzle channel are summarized in the following table:

| Name | Direction | Description |
| --- | --- | --- |
| d | Input | Input dot pattern to shift register bit |
| q | Output | Output dot pattern from shift register bit |
| SrClk | Input | Shift register clock in - d is captured on rising edge of this clock |
| LsyncL | Input | Fire enable - needs to be asserted for nozzle to fire |
| Pr | Input | Profile - needs to be asserted for nozzle to fire |

Figure 7:
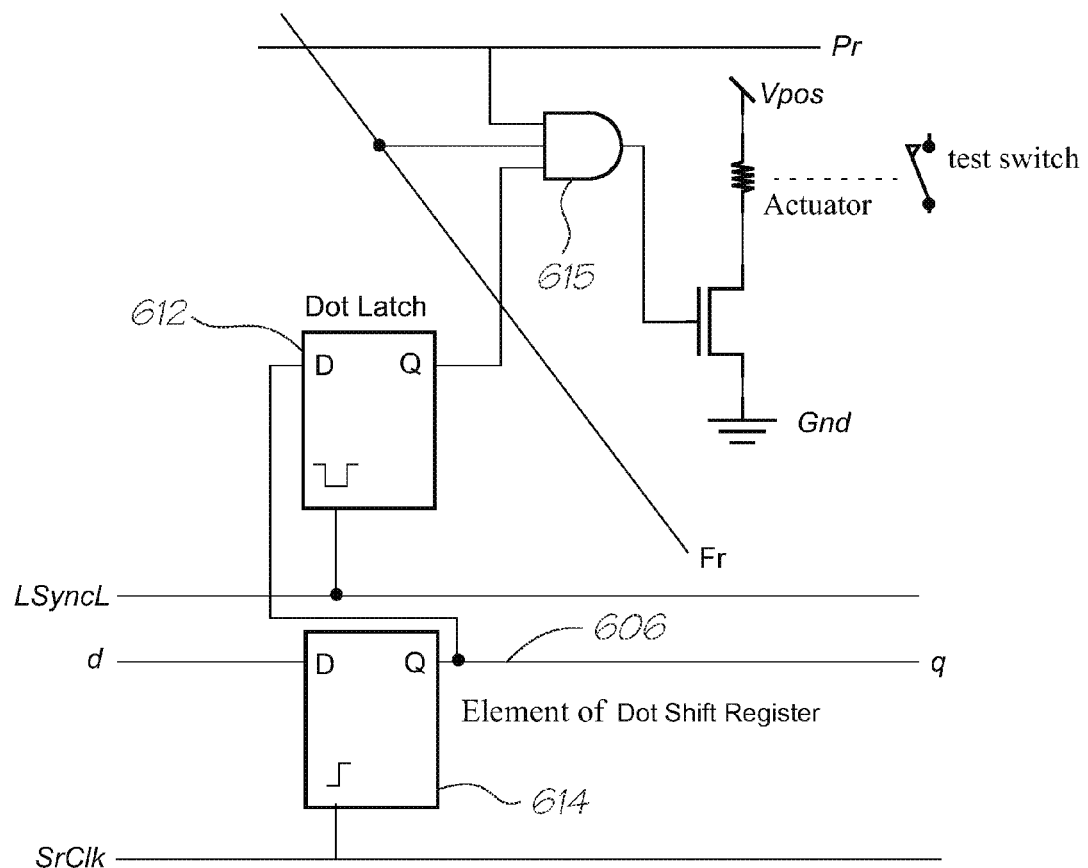
FIG. 7 is a circuit diagram showing logic for a single printer nozzle in the printer of FIG. 1.
Figure 8:
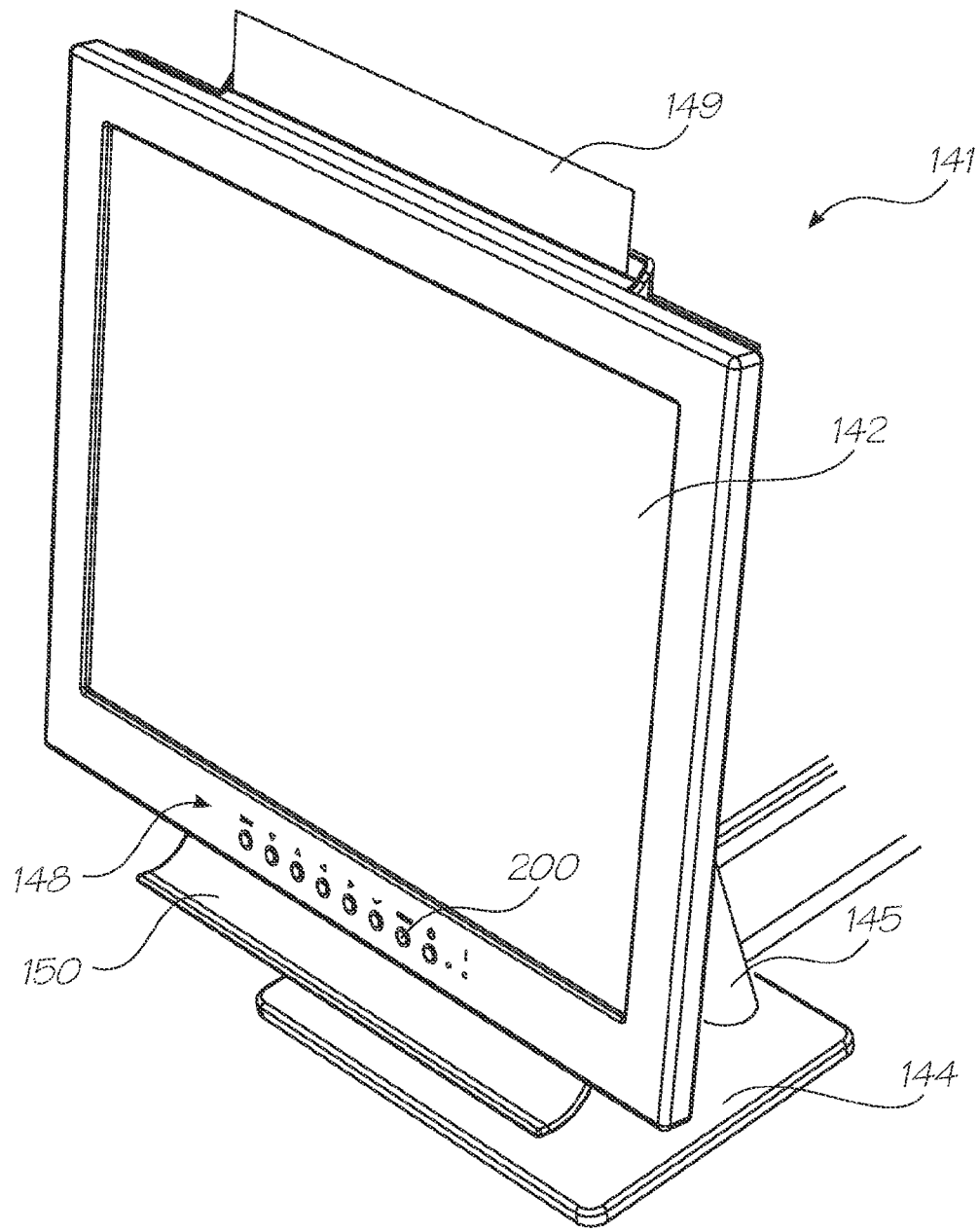
FIG. 8 is a perspective view of a flat panel display incorporating a printer, in accordance with the invention.

As shown in FIG. 7, the fire signals Fr are routed on a diagonal, to enable firing of one color in the current column, the next color in the following column, and so on. This averages the current demand by spreading it over 6 columns in time-delayed fashion.

The dot latches and the latches forming the various shift registers are fully static in this embodiment, and are CMOS-based. The design and construction of latches is well known to those skilled in the art of integrated circuit engineering and design, and so will not be described in detail in this document.

The combined printhead ICs define a printhead having 13824 nozzles per color. Therefore, in the case where the printhead ICs 425 and 426 are equal in length, each of them includes 6912 nozzles per color. The circuitry supporting each nozzle is the same, but the pairing of nozzles happens due to physical positioning of the MEMS nozzles; odd and even nozzles are not actually on the same horizontal line Power and ground are provided via pads disposed along the length of the printhead ICs. The pads are connected to busbars 427 using conductive adhesive, as described above.

Printhead Nozzles and Actuators

Figure 46:
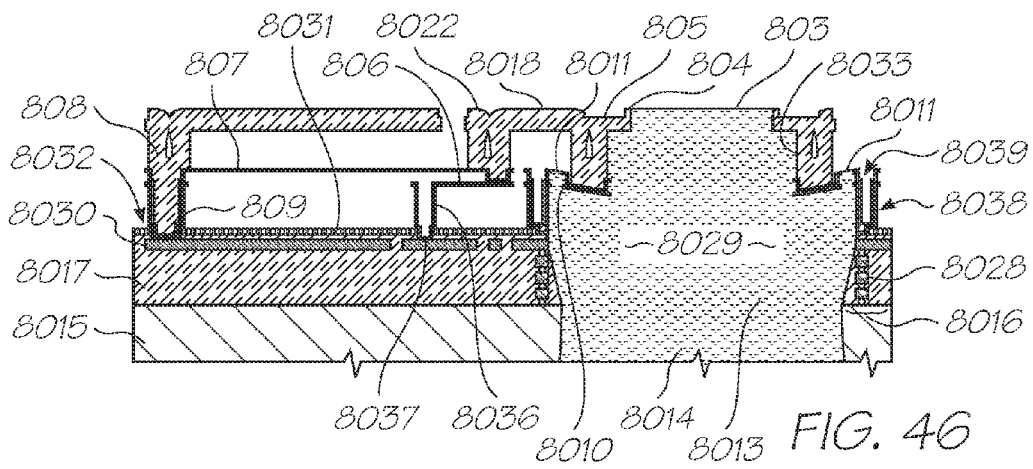
FIG. 46 is a vertical sectional view of a single nozzle for ejecting ink, for use with the invention, in a quiescent state.
Figure 47:
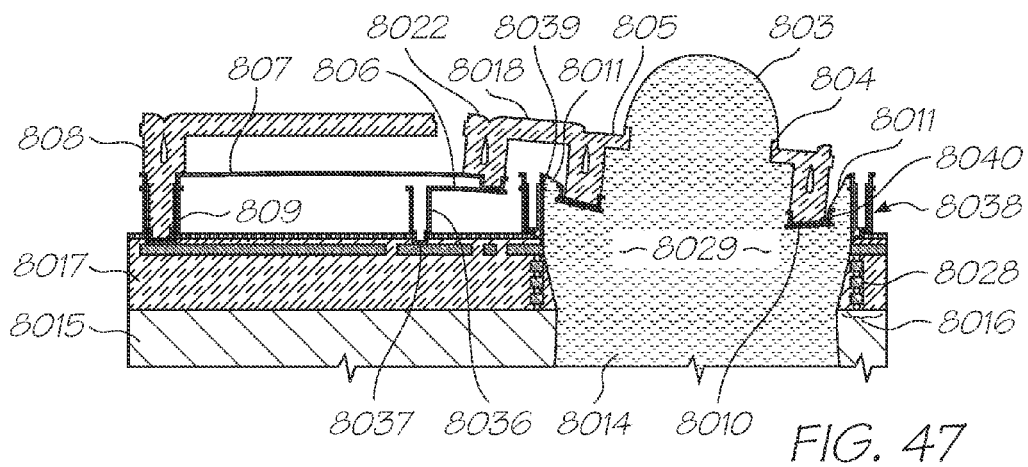
FIG. 47 is a vertical sectional view of the nozzle of FIG. 46 during an initial actuation phase.

The preferred printhead nozzle arrangement, comprising a nozzle and corresponding actuator, will now be described with reference to FIGS. 46 to 55. FIG. 47 shows an array of the nozzle arrangements 801 formed on a silicon substrate 8015. The nozzle arrangements are identical, but in the preferred embodiment, different nozzle arrangements are fed with different colored inks and fixative. It will be noted that rows of the nozzle arrangements 801 are staggered with respect to each other, allowing closer spacing of ink dots during printing than would be possible with a single row of nozzles. The multiple rows also allow for redundancy (if desired), thereby allowing for a predetermined failure rate per nozzle.

Each nozzle arrangement 801 is the product of an integrated circuit fabrication technique. In particular, the nozzle arrangement 801 defines a micro-electromechanical system (MEMS).

For clarity and ease of description, the construction and operation of a single nozzle arrangement 801 will be described with reference to FIGS. 46 to 54.

Each of the ink jet printhead chips 425, 426 includes a silicon wafer substrate 801. 0.35 Micron 1 P4M 12 volt CMOS microprocessing circuitry is positioned on the silicon wafer substrate 8015.

A silicon dioxide (or alternatively glass) layer 8017 is positioned on the wafer substrate 8015. The silicon dioxide layer 8017 defines CMOS dielectric layers. CMOS top-level metal defines a pair of aligned aluminium electrode contact layers 8030 positioned on the silicon dioxide layer 8017. Both the silicon wafer substrate 8015 and the silicon dioxide layer 8017 are etched to define an ink inlet channel 8014 having a generally circular cross section (in plan). An aluminium diffusion barrier 8028 of CMOS metal 1, CMOS metal 2/3 and CMOS top level metal is positioned in the silicon dioxide layer 8017 about the ink inlet channel 8014. The diffusion barrier 8028 serves to inhibit the diffusion of hydroxyl ions through CMOS oxide layers of the drive circuitry layer 8017.

A passivation layer in the form of a layer of silicon nitride 8031 is positioned over the aluminium contact layers 8030 and the silicon dioxide layer 8017. Each portion of the passivation layer 8031 positioned over the contact layers 8030 has an opening 8032 defined therein to provide access to the contacts 8030.

The nozzle arrangement 801 includes a nozzle chamber 8029 defined by an annular nozzle wall 8033, which terminates in a nozzle rim 804 that is circular in plan. The ink inlet channel 8014 is in fluid communication with the nozzle chamber 8029. At a lower end of the nozzle wall, there is disposed a moving rim 8010, that includes a moving seal lip 8040. An encircling wall 8038 surrounds the movable nozzle, and includes a stationary seal lip 8039 that, when the nozzle is at rest as shown in FIG. 46, is adjacent the moving rim 8010. A fluidic seal 8011 is formed due to the surface tension of ink trapped between the stationary seal lip 8039 and the moving seal lip 8040. This prevents leakage of ink from the chamber whilst providing a low resistance coupling between the encircling wall 8038 and the nozzle wall 8033.

As best shown in FIG. 47, a plurality of radially extending recesses 8035 is defined in the roof 8034 about the nozzle rim 804. The recesses 8035 serve to contain radial ink flow as a result of ink escaping past the nozzle rim 804.

The nozzle wall 8033 forms part of a lever arrangement that is mounted to a carrier 8036 having a generally U-shaped profile with a base 8037 attached to the layer 8031 of silicon nitride.

Figure 49:
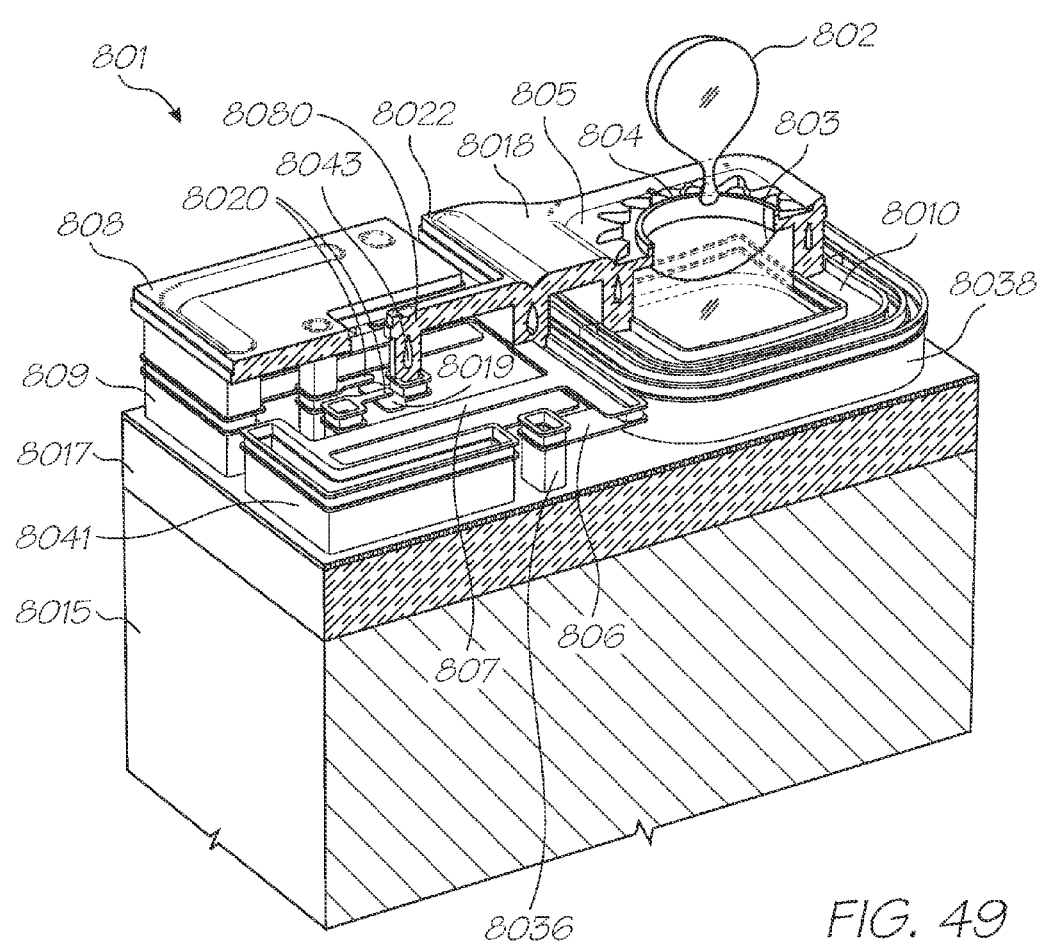
FIG. 49 is a perspective partial vertical sectional view of the nozzle of FIG. 48, at the actuation state shown in FIG. 48.
Figure 50:
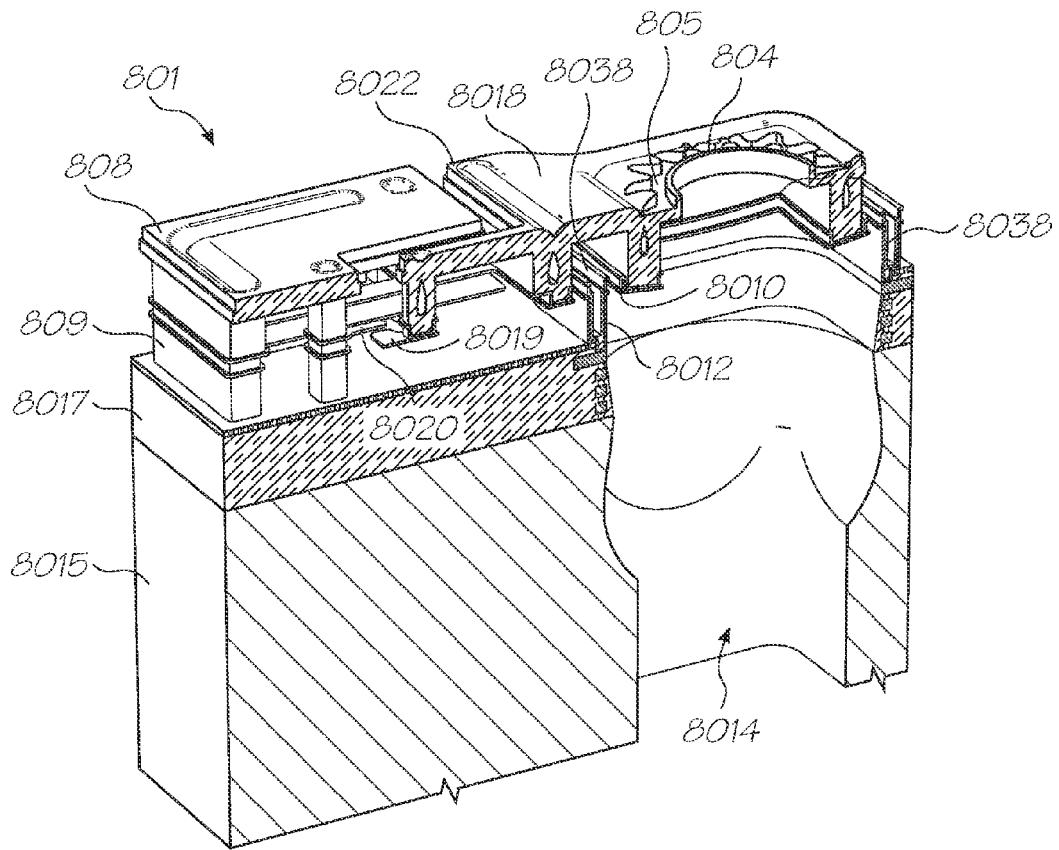
FIG. 50 is a perspective vertical section of the nozzle of FIG. 46, with ink omitted.
Figure 51:
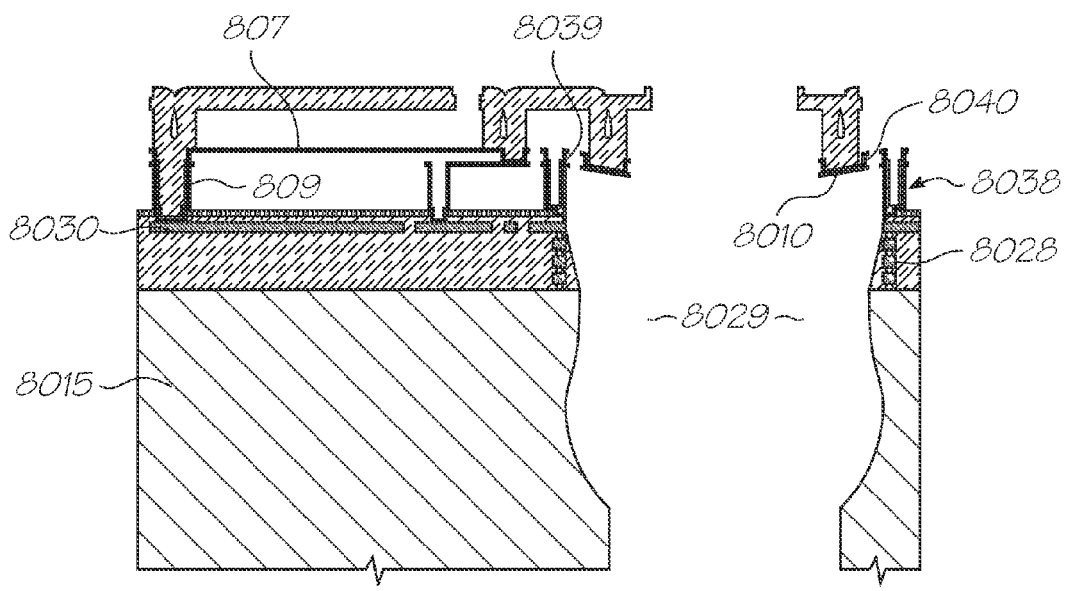
FIG. 51 is a vertical sectional view of the of the nozzle of FIG. 50.
Figure 54:
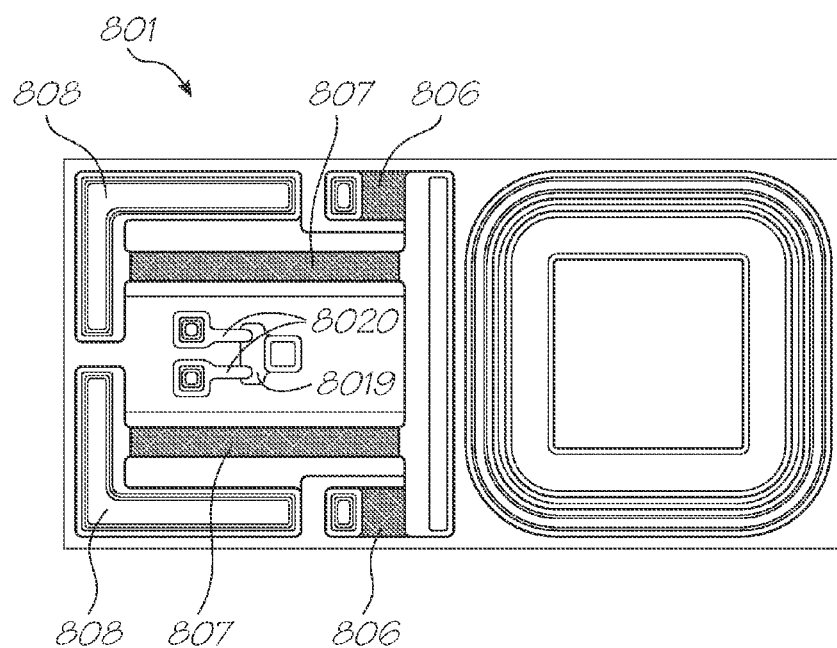
FIG. 54 is a plan view of the nozzle of FIG. 46 with the lever arm and movable nozzle removed for clarity.
Figure 55:
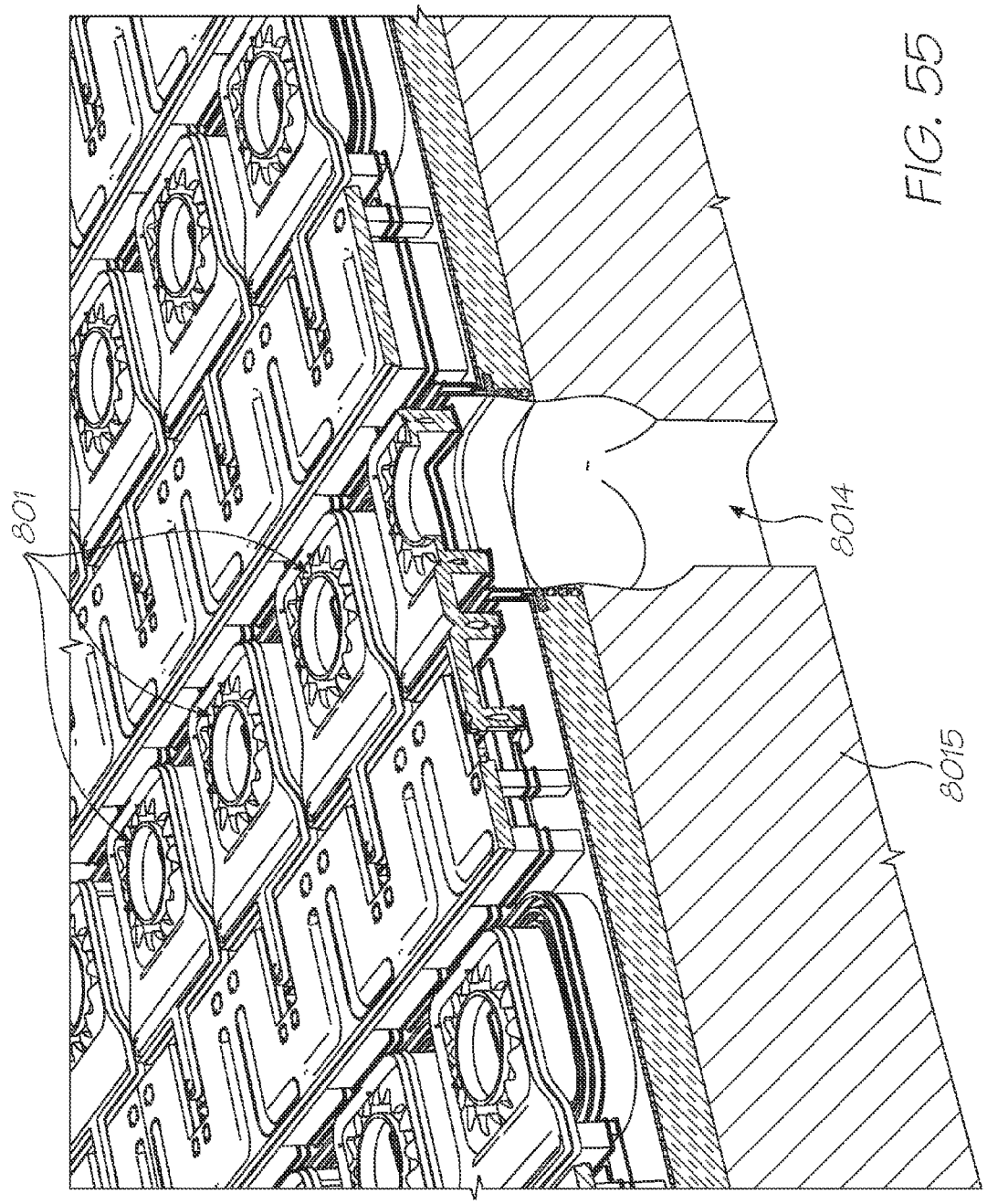
FIG. 55 is a perspective vertical sectional view of a part of a printhead chip incorporating a plurality of the nozzle arrangements of the type shown in FIG. 46.

The lever arrangement also includes a lever arm 8018 that extends from the nozzle walls and incorporates a lateral stiffening beam 8022. The lever arm 8018 is attached to a pair of passive beams 806, formed from titanium nitride (TiN) and positioned on either side of the nozzle arrangement, as best shown in FIGS. 49 and 54. The other ends of the passive beams 806 are attached to the carrier 8036.

The lever arm 8018 is also attached to an actuator beam 807, which is formed from TiN. It will be noted that this attachment to the actuator beam is made at a point a small but critical distance higher than the attachments to the passive beam 806.

Figure 52:
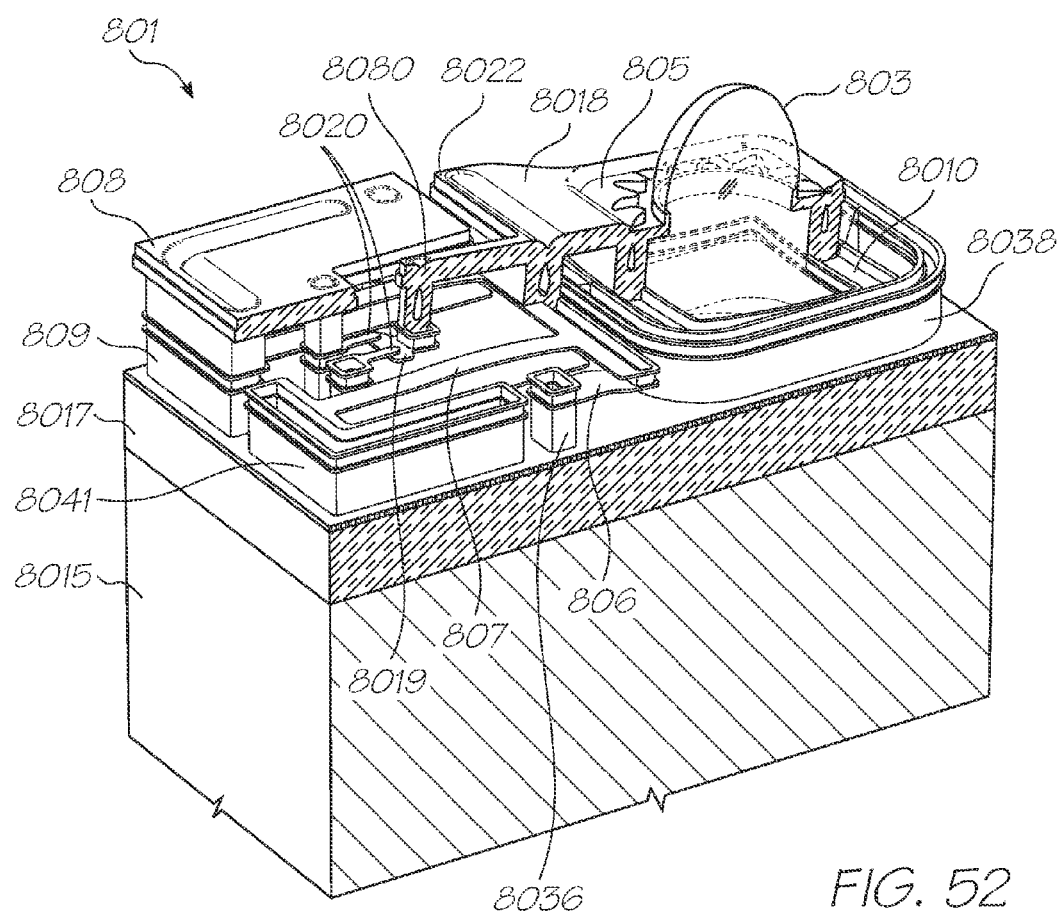
FIG. 52 is a perspective partial vertical sectional view of the nozzle of FIG. 46, at the actuation state shown in FIG. 47.
Figure 53:
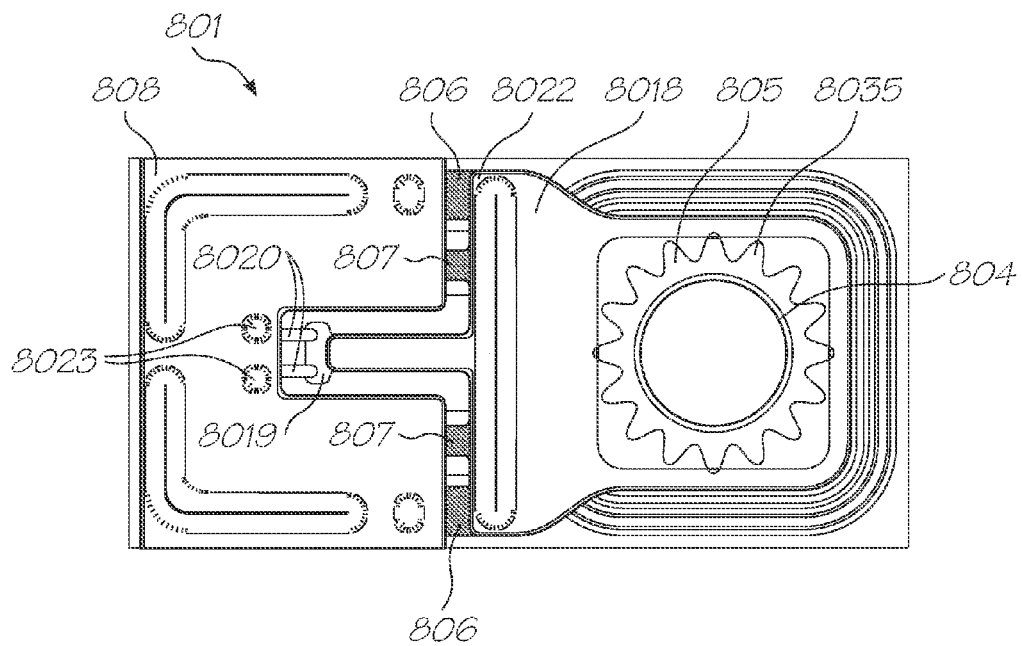
FIG. 53 is a plan view of the nozzle of FIG. 46.

As best shown in FIGS. 49 and 52, the actuator beam 807 is substantially U-shaped in plan, defining a current path between the electrode 809 and an opposite electrode 8041. Each of the electrodes 809 and 8041 are electrically connected to respective points in the contact layer 8030 (shown in FIGS. 46 and 51). As well as being electrically coupled via the contacts 809, the actuator beam is also mechanically anchored to anchor 808. The anchor 808 is configured to constrain motion of the actuator beam 807 to the left of FIGS. 46 to 48 when the nozzle arrangement is in operation.

The TiN in the actuator beam 807 is conductive, but has a high enough electrical resistance that it undergoes self-heating when a current is passed between the electrodes 809 and 8041. No current flows through the passive beams 806, so they do not expand.

In use, the device at rest is filled with ink 8013 (FIG. 46) that defines a meniscus 803 under the influence of surface tension. The ink is retained in the chamber 8029 by the meniscus, and will not generally leak out in the absence of some other physical influence.

As shown in FIG. 47, to fire ink from the nozzle, a current is passed between the contacts 809 and 8041, passing through the actuator beam 807. The self-heating of the beam 807 due to its resistance causes the beam to expand. The dimensions and design of the actuator beam 807 mean that the majority of the expansion in a horizontal direction with respect to FIGS. 46 to 48. The expansion is constrained to the left by the anchor 808, so the end of the actuator beam 807 adjacent the lever arm 8018 is impelled to the right.

The relative horizontal inflexibility of the passive beams 806 prevents them from allowing much horizontal movement with respect to the lever arm 8018. However, the relative displacement of the attachment points of the passive beams and actuator beam respectively to the lever arm causes a twisting movement that causes the lever arm 8018 to move generally downwards. The movement is effectively a pivoting or hinging motion. However, the absence of a true pivot point means that the rotation is about a pivot region defined by bending of the passive beams 806.

The downward movement (and slight rotation) of the lever arm 8018 is amplified by the distance of the nozzle wall 8033 from the passive beams 806. The downward movement of the nozzle walls and roof causes a pressure increase within the chamber 8029, causing the meniscus to bulge as shown in FIG. 47. It will be noted that the surface tension of the ink means the fluid seal 8011 is stretched by this motion without allowing ink to leak out.

Figure 48:
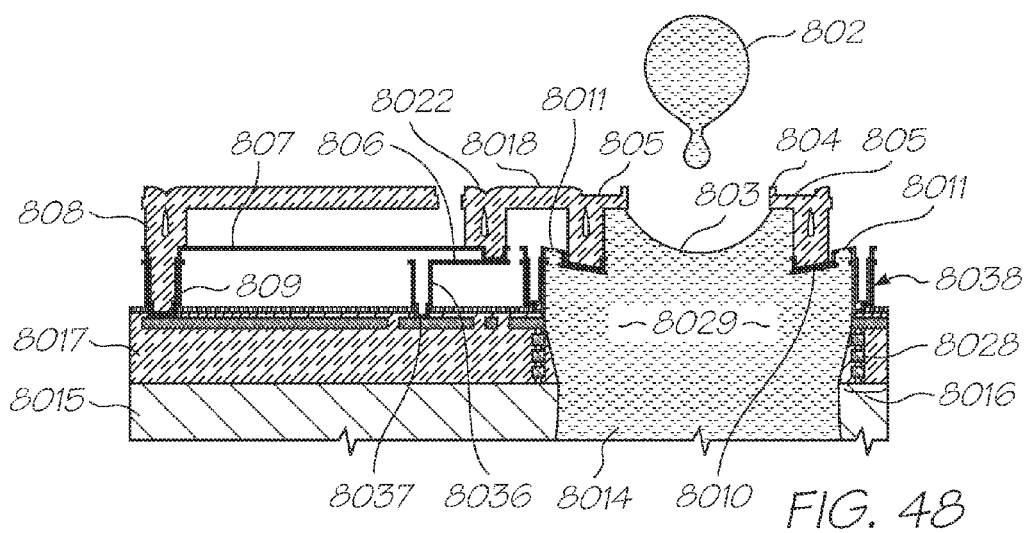
FIG. 48 is a vertical sectional view of the nozzle of FIG. 57 later in the actuation phase.

As shown in FIG. 48, at the appropriate time, the drive current is stopped and the actuator beam 807 quickly cools and contracts. The contraction causes the lever arm to commence its return to the quiescent position, which in turn causes a reduction in pressure in the chamber 8029. The interplay of the momentum of the bulging ink and its inherent surface tension, and the negative pressure caused by the upward movement of the nozzle chamber 8029 causes thinning, and ultimately snapping, of the bulging meniscus to define an ink drop 802 that continues upwards until it contacts adjacent print media.

Immediately after the drop 802 detaches, the meniscus forms the concave shape shown in FIG. 48. Surface tension causes the pressure in the chamber 8029 to remain relatively low until ink has been sucked upwards through the inlet 8014, which returns the nozzle arrangement and the ink to the quiescent situation shown in FIG. 48.

As best shown in FIG. 49, the nozzle arrangement also incorporates a test mechanism that can be used both post-manufacture and periodically after the printhead is installed. The test mechanism includes a pair of contacts 8020 that are connected to test circuitry (not shown). A bridging contact 8019 is provided on a finger 8043 that extends from the lever arm 8018. Because the bridging contact 8019 is on the opposite side of the passive beams 806, actuation of the nozzle causes the priding contact to move upwardly, into contact with the contacts 8020. Test circuitry can be used to confirm that actuation causes this closing of the circuit formed by the contacts 8019 and 8020. If the circuit closed appropriately, it can generally be assumed that the nozzle is operative.

Flat Panel Display Device with Integrated Printer

A preferred embodiment of the invention is shown in FIGS. 8 to 25. Referring particularly to FIGS. 8 to 15, a flat panel display unit 141 includes a flat panel display 142 that is supported on a stand 143. The present invention primarily applies to flat panel displays where a viewable size of the flat panel display exceeds 40 cm measured along a diagonal of the flat panel display. The stand 143 includes a base portion 144, which supports an arm 145 to which a housing 146 for the display 142 is hingedly connected. Various control buttons 148 are provided on the display unit 141, for controlling display functions such as contrast, brightness, color temperature and the like.

Figure 9:
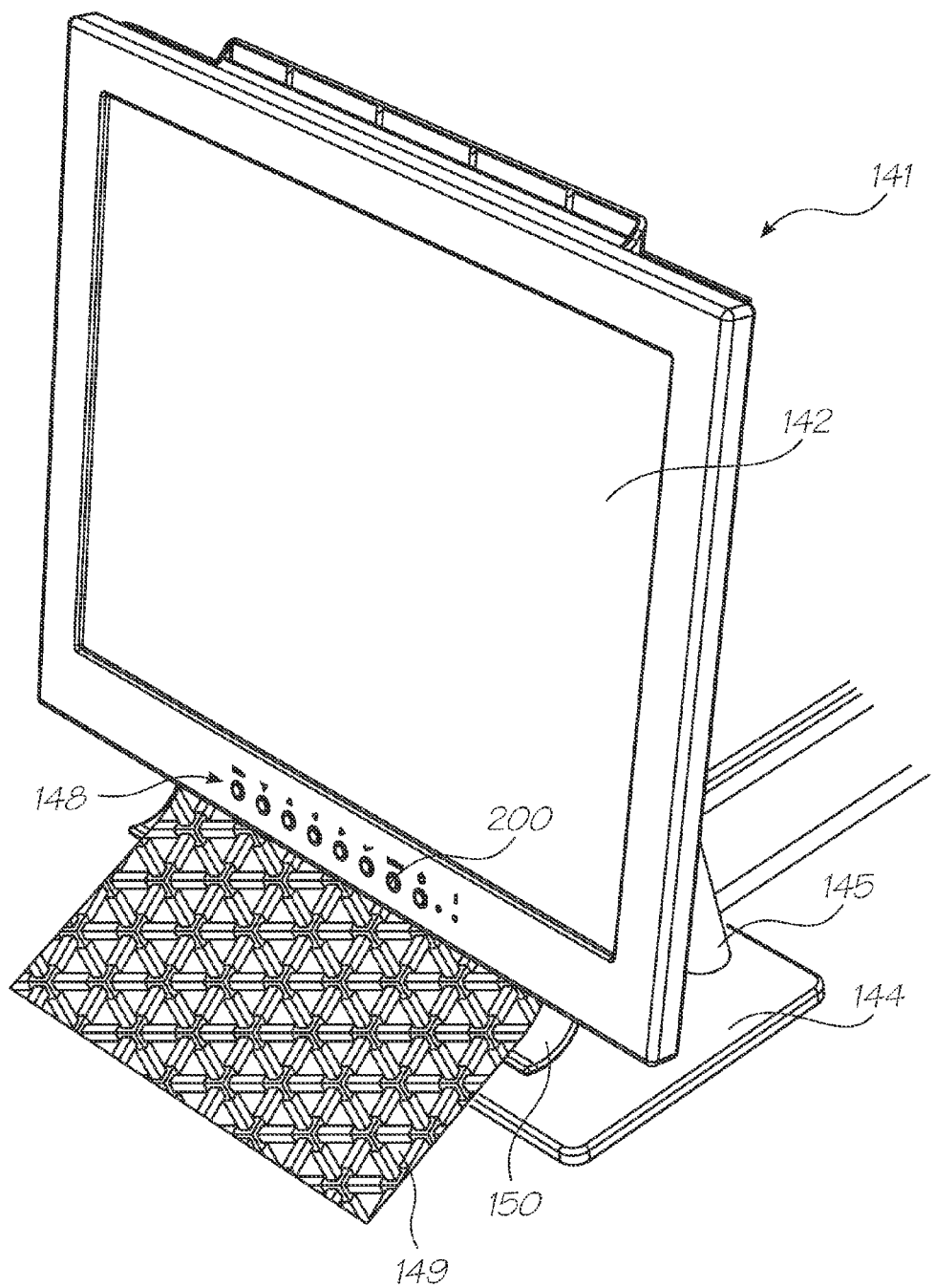
FIG. 9 is a perspective view of the flat panel display of FIG. 8, whilst printing a page.
Figure 12:
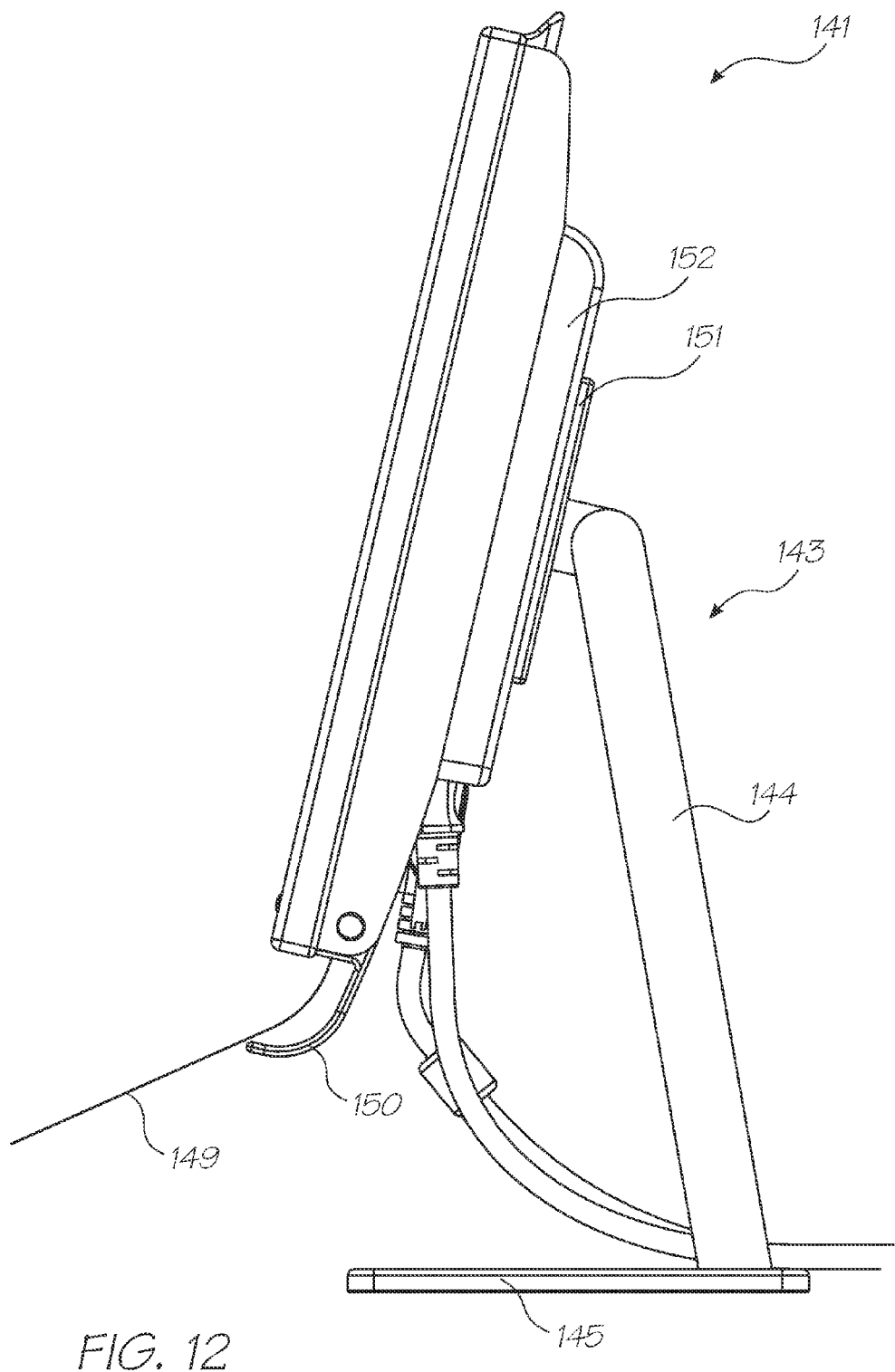
FIG. 12 is a right-hand side elevation of the flat panel display of FIG. 9.
Figure 13:
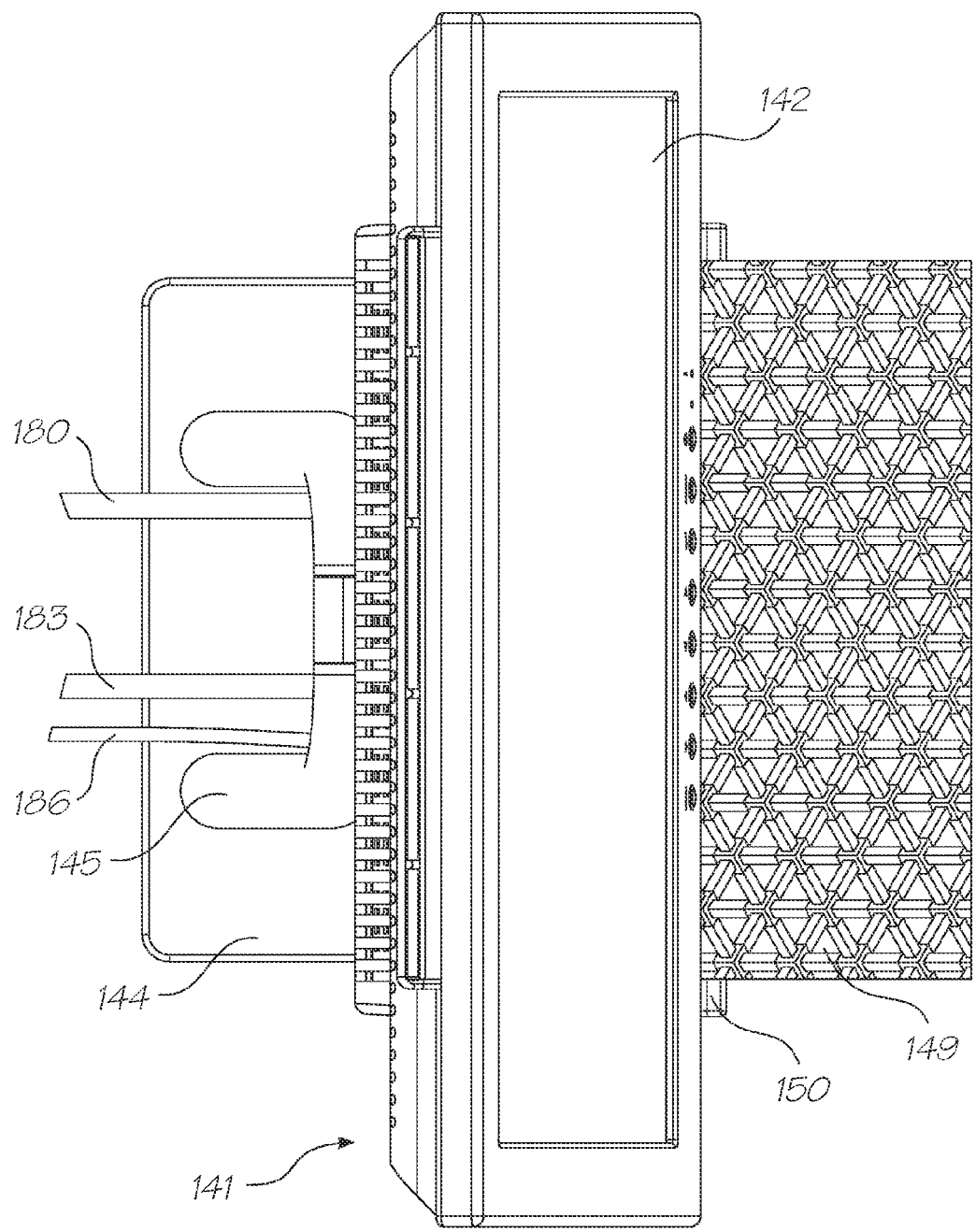
FIG. 13 is a plan view of the flat panel display of FIG. 9.
Figure 14:
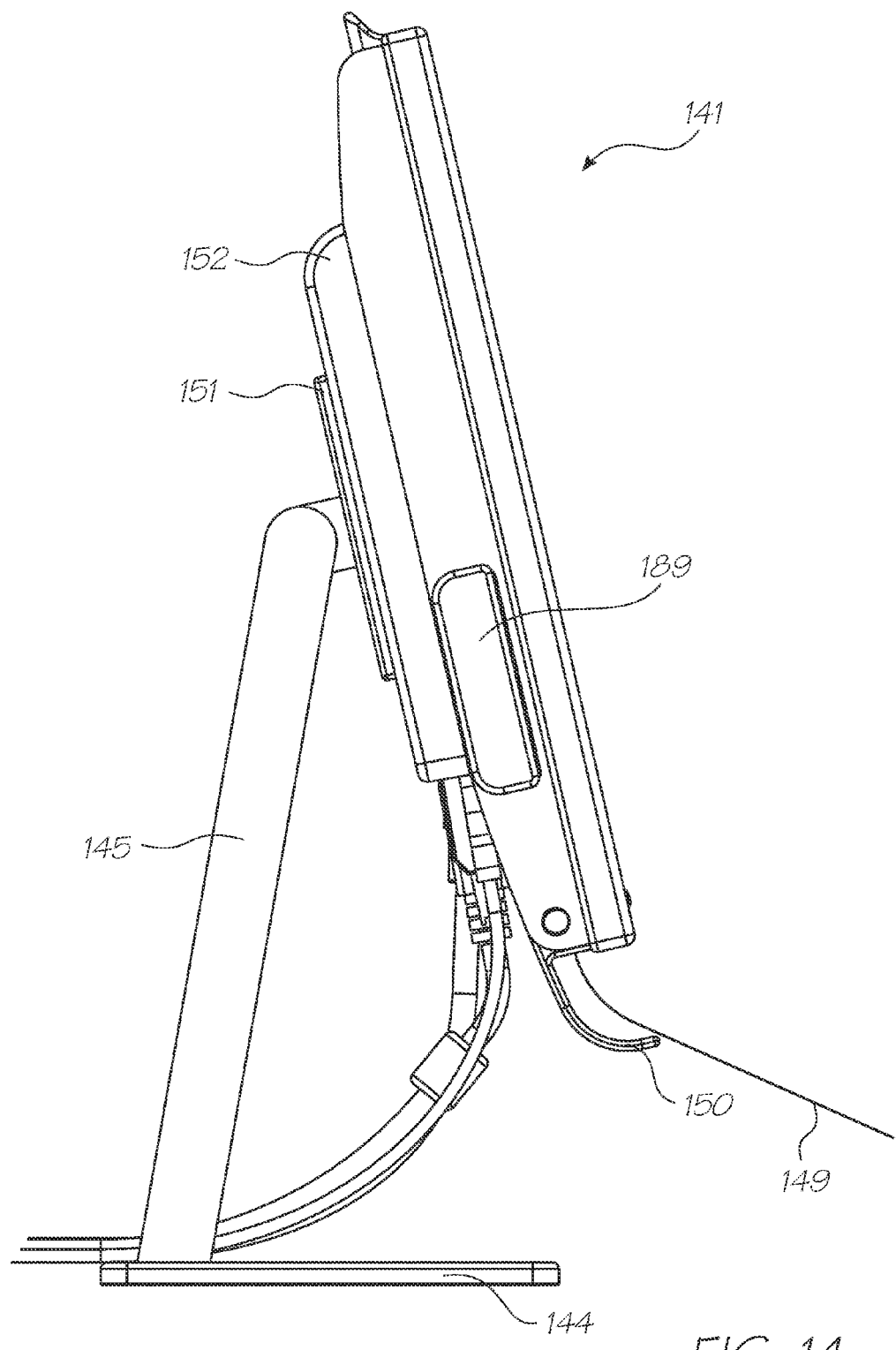
FIG. 14 is a left-hand side elevation of the flat panel display of FIG. 9.
Figure 15:
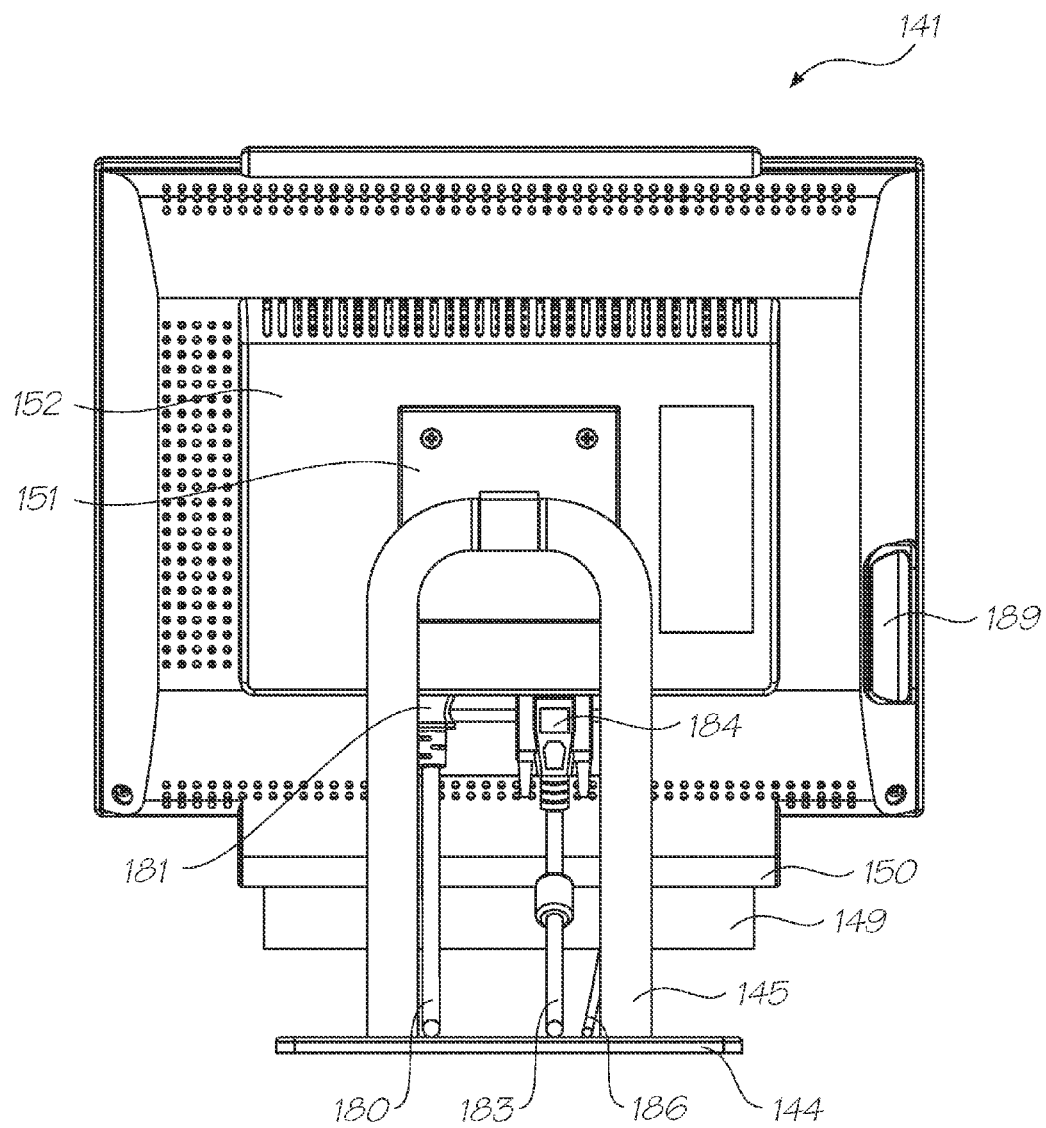
FIG. 15 is a rear elevation of the flat panel display of FIG. 9.

The display unit 141 incorporates a page-width printer (described below) that accepts, in the preferred embodiments shown in FIGS. 8 to 32, single sheets of standard A4 or US Letter paper 149. A curved paper guide 150 causes paper exiting the printer to be directed away from the base 144 of the display unit 141, as best shown in FIGS. 9 and 12.

Figure 16:
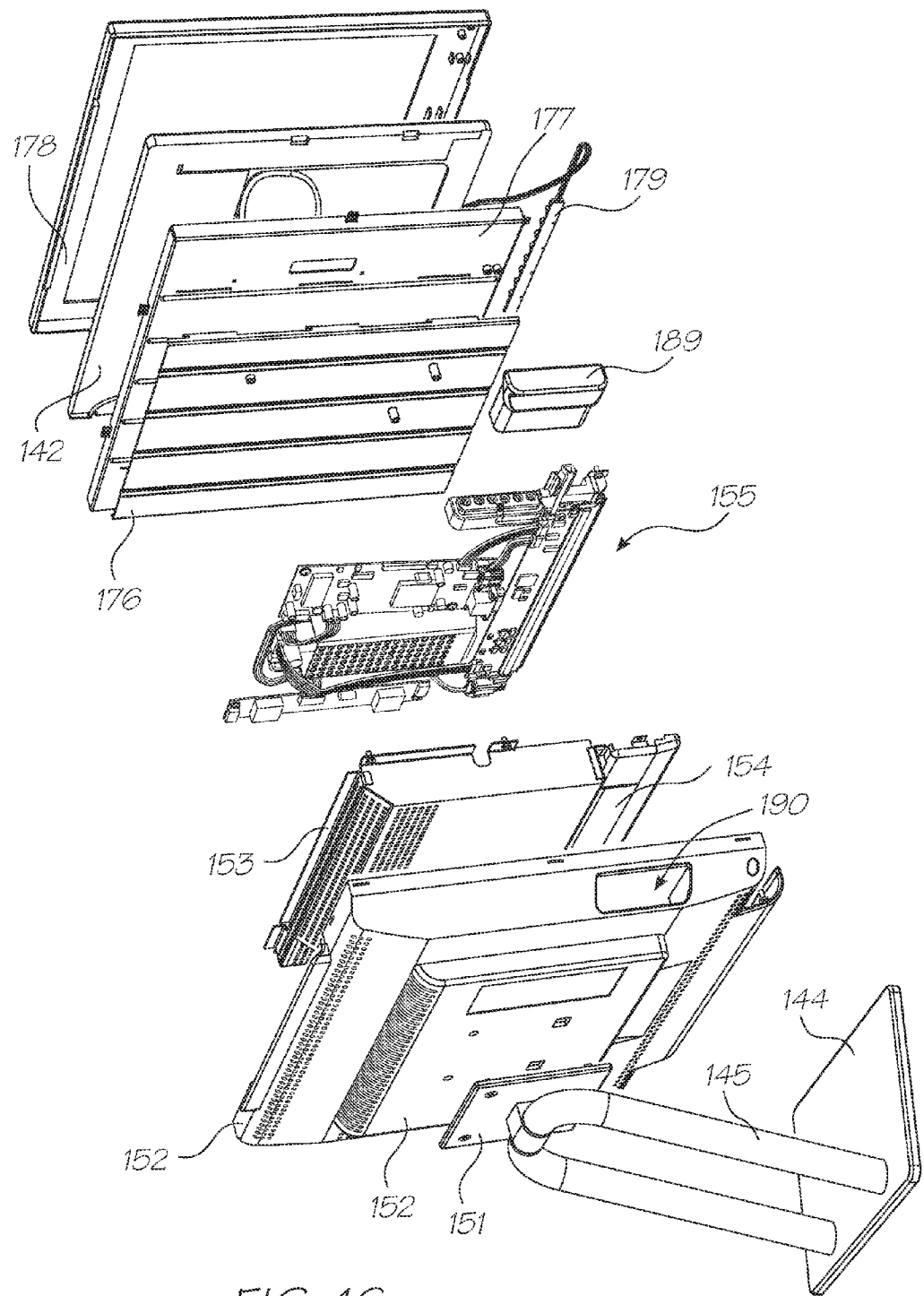
FIG. 16 is a perspective exploded view of the flat panel display of FIG. 8.

The sub-components that comprise the display unit 141 are shown in exploded view in FIG. 16. A mounting plate 151 is hingedly mounted to the arm 145 and attached to a rear cover molding 152 formed from a plastics material. The cover molding is perforated to allow convective air currents to cool the electronic circuitry inside the display unit 141.

A metallic radio frequency interference and electromagnetic interference (RFI/EMI) shield 153 fits inside the concave side of the rear cover molding 152. The shield 153 screens the various circuitry elements from external radiation, whilst reducing any radiation generated by the circuitry being transmitted from the display unit 141. The shield 153 takes the form of a cage with cooling holes that allow ventilation of the circuitry. An additional shield 154 covers the printhead (described below in relation to FIG. 23).

Figure 19:
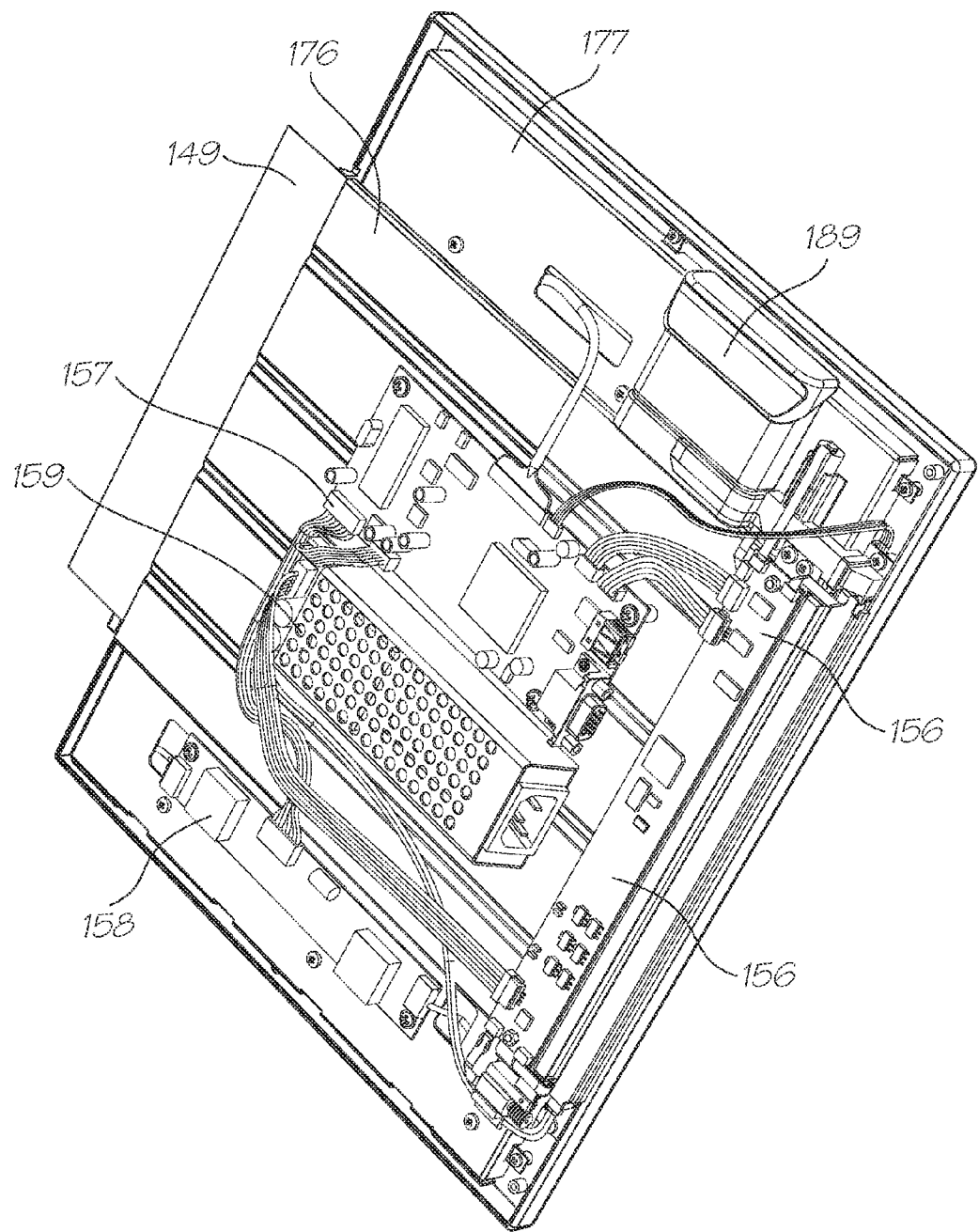
FIG. 19 is a rear perspective view of the flat panel display of FIG. 8 with the shields removed.
Figure 20:
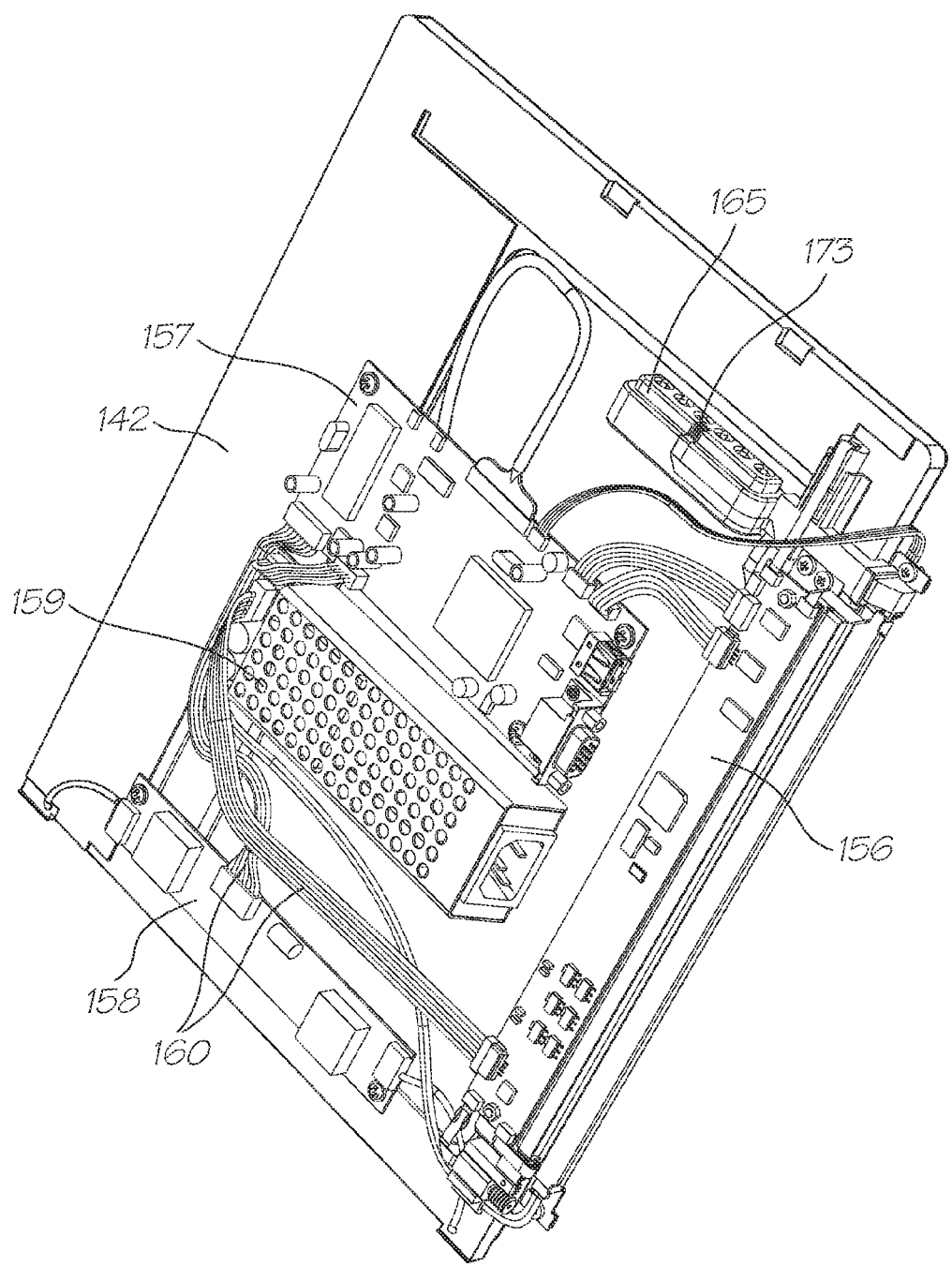
FIG. 20 is a rear perspective view of the flat panel display of FIG. 8 showing the core electrical and electronic components.

The various electronic, mechanical and electromechanical components that comprise the printer are mounted on interconnected printed circuit boards (PCBs) 155, as best shown in FIGS. 19 to 21. The PCBs 155 include a printhead PCB 156, an analog converter PCB 157, a backlight inverter PCB 158, and a power supply unit (PSU) 159. The PSU 159 supplies power at appropriate voltage and current to the various other PCBs via wiring 160.

Figure 22:
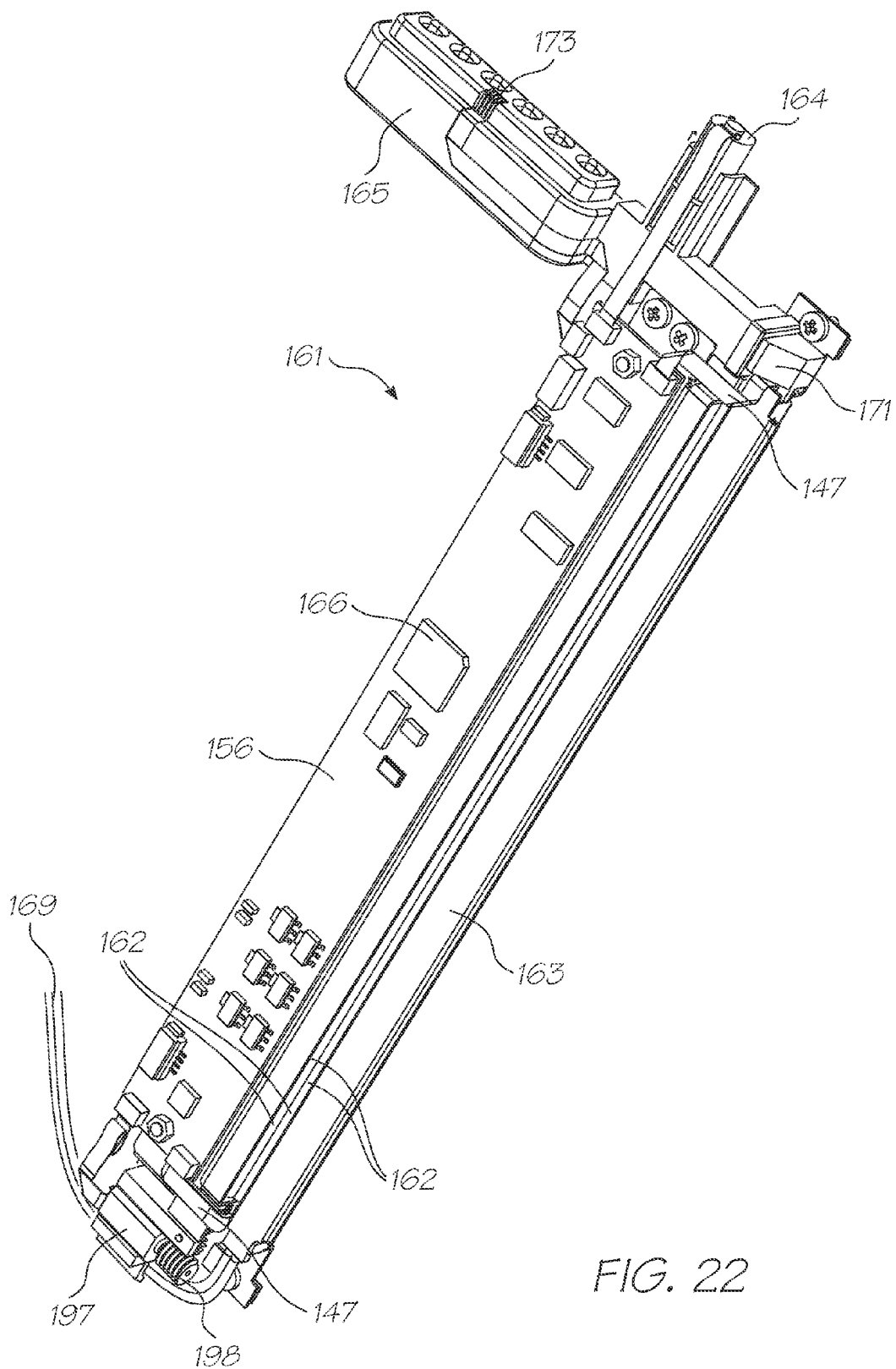
FIG. 22 is a perspective view of the print engine used in the flat panel display of FIG. 8.

Turning to FIG. 22, the printhead PCB forms part of a print engine assembly 161. The print engine assembly 161 also includes paper feed rollers 162, a platen 163 for supporting paper as it is fed past the printhead, an air pump 164 for supplying pressurized air to the printhead, a flexible connector 147 for supplying data from the print engine chips on the print engine PCB to the printhead, an ink delivery bus 165, and a print engine controller (SoPEC) chip 166. The feed rollers 162 are driven by a paper drive motor 197 and drive assembly 198.

Figure 23:
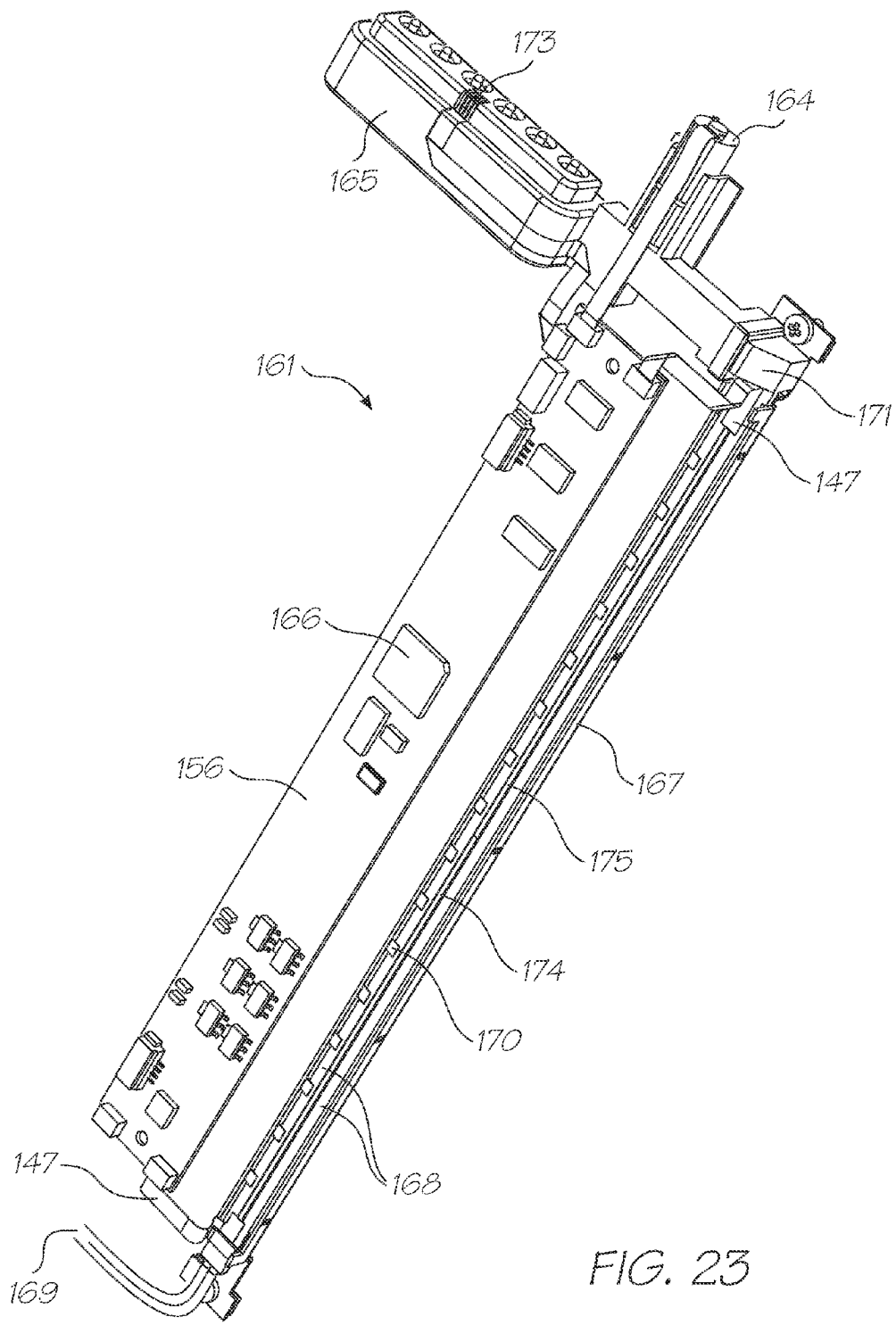
FIG. 23 is a perspective view of the print engine of FIG. 22, with some componentry removed to reveal the printhead.
Figure 24:
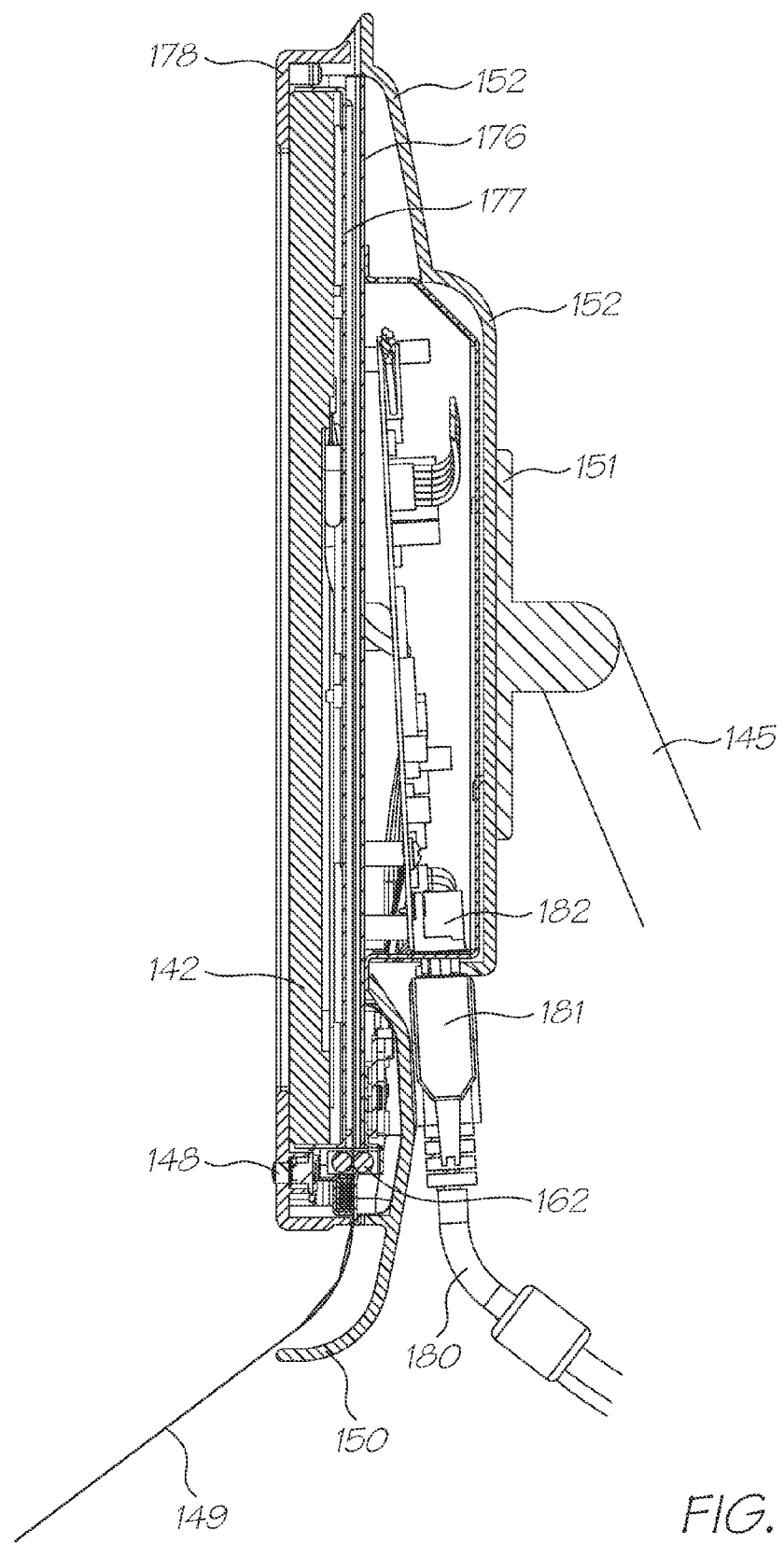
FIG. 24 is a vertical section along the centerline of the flat panel display of FIG. 8.
Figure 25:
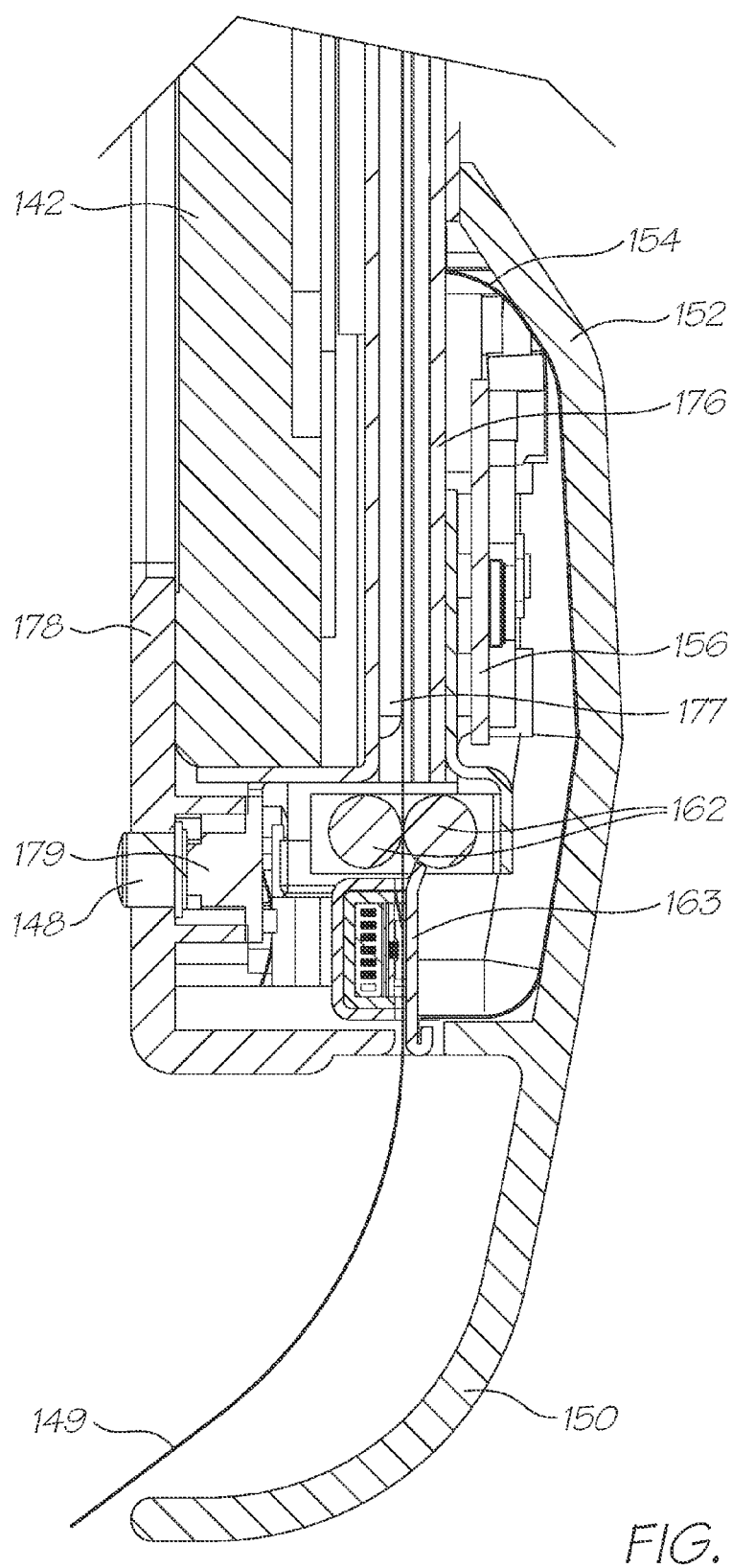
FIG. 25 is an enlarged detail view of the vertical section of FIG. 24.

As shown in FIG. 23 (in which the platen and feed rollers are removed for clarity), the print engine assembly 161 also includes support metalwork 167 for mounting the various components, copper busbars 168 for supplying power from the power leads 169 to the printheads, and flexible paper guide fingers 170. Ink channel moldings 171 route ink from the ink delivery bus 165, which also includes electrical contacts 173 that enable communication between an ink cartridge (described below) and the print engine assembly. It will be noted that the present embodiment includes two printhead segments 174 and 175 of equal length that together form a pagewidth printhead. As described earlier in this document, Referring back to FIG. 16, a metal paper chute 176 is provided to guide paper behind the display and down to the printhead. A metal chassis 177 is provided to support the display 142, which is surrounded and protected by a plastic front bezel molding 178. A menu PCB 179 holds the menu buttons 148 and associated status LEDs.

Figure 10:
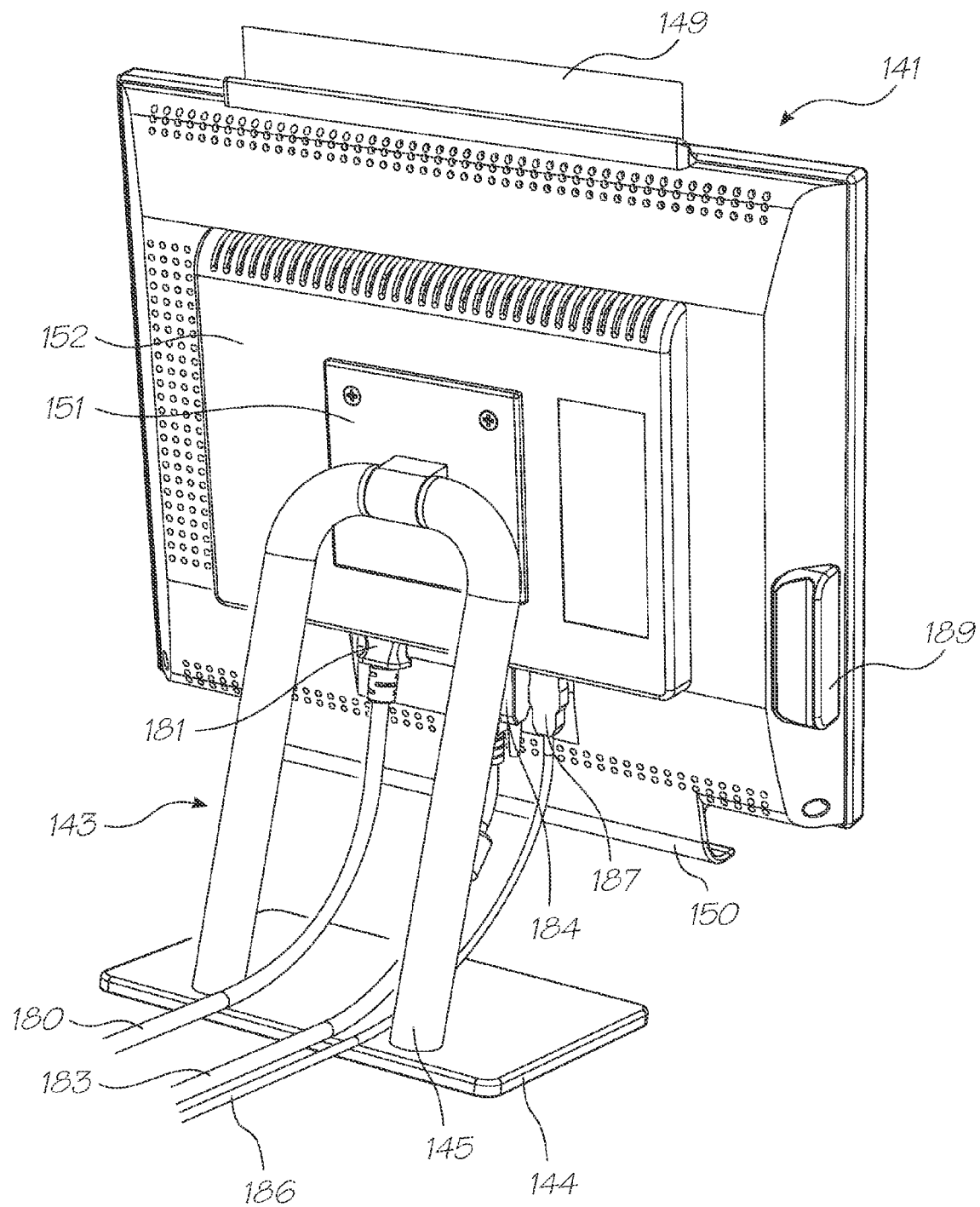
FIG. 10 is a rear perspective view of the flat panel display of FIG. 8.
Figure 11:
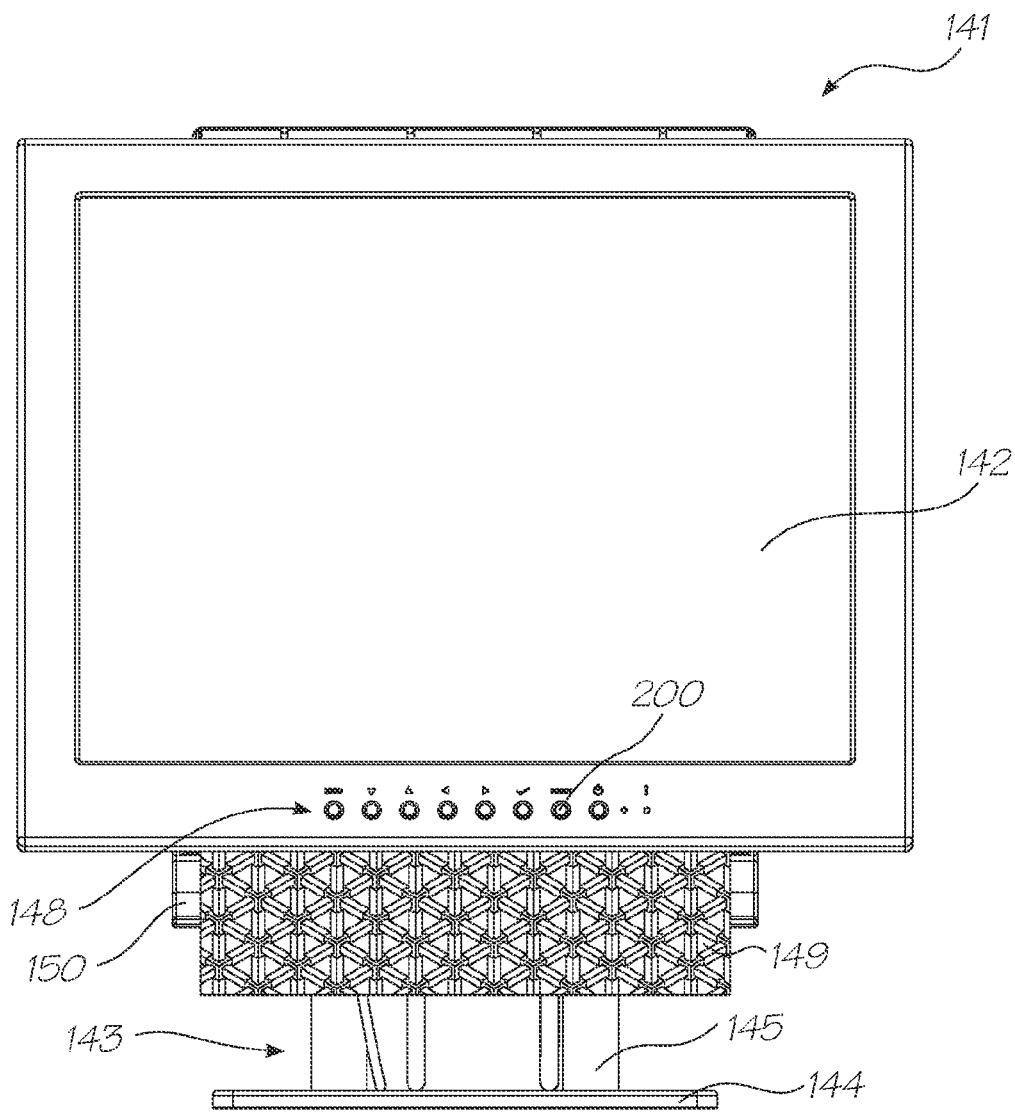
FIG. 11 is a front elevation of the flat panel display of FIG. 9.
Figure 17:
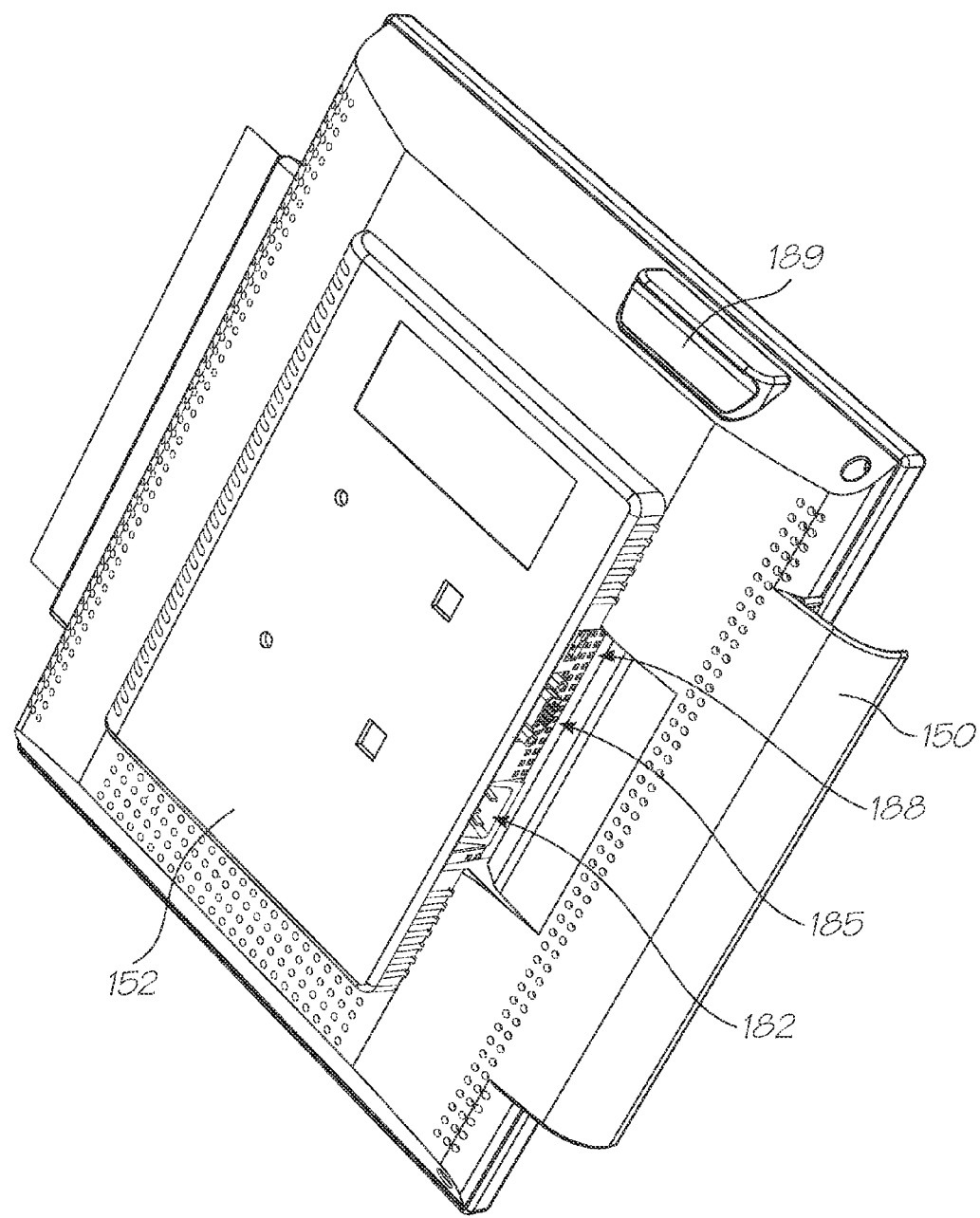
FIG. 17 is a rear perspective view of the flat panel display of FIG. 8 with the stand detached.
Figure 18:
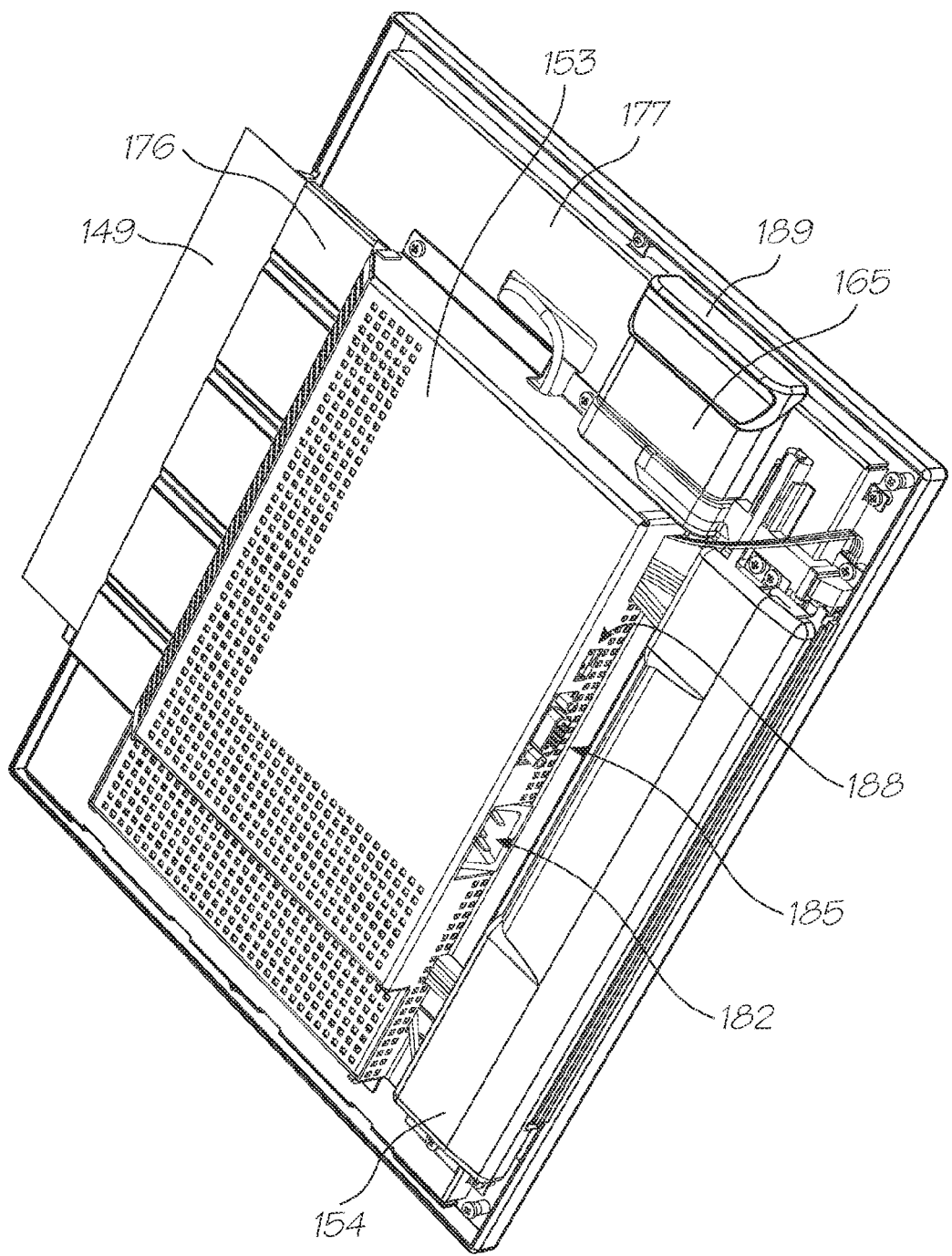
FIG. 18 is a rear perspective view of the flat panel display of FIG. 8 with the rear cover removed.

As best shown in FIG. 10, the display unit 141 is provided with power via a mains cord 180 and associated mains plug 181. The mains plug 181 is inserted into mains socket 182, which is shown in FIG. 17 with the mains plug 181 removed. The mains socket 182 is hard-wired into the PSU 159.

A video input cable 183 and associated video plug 184 supply video data from a computer. The video plug 184 is inserted into a video socket 185, which is shown in FIG. 17 with the video plug 184 removed for clarity.

A data connection in the form of a USB 2 link is provided by way of a data cable 186 and associated data plug 187. The plug 187 is inserted into a USB 2 compliant data socket 188, which is shown in FIG. 17 with the data plug 187 removed for clarity.

As shown in FIG. 21 an ink cartridge 189 containing the various inks required for operation of the printer releasably engages the ink delivery bus 165 via an aperture 190 (FIG. 16) formed in the rear molding 152. The cartridge is preferably held in position by an interference fit, although a positive retaining mechanism such as a clip can be supplied in alternative embodiments. As best shown in FIG. 21, the ink delivery bus 165 includes a plurality of fluid ports 191 that engage with corresponding fluid outputs (not shown) formed in the cartridge. In the embodiment shown, each fluid port 191 includes a hollow needle 192 that penetrates a seal (not shown) in the corresponding fluid output. The seal can be an annular resilient seal with a frangible membrane, or simply a frangible membrane that self-seals around the needle 192 as the cartridge 189 is inserted into an operative position.

The cartridge 189 contains the inks necessary for its use with the printer. The various possible combinations of colored inks (such as CMY), black ink, infrared ink and a fixative are described elsewhere in this document. The cartridge 189 also includes a QA ("Question-Answer") chip that is configured to store information accessible by the SoPEC chip 166, such as ink levels remaining (preferably on a per-ink basis), types of ink contained in the cartridge, security data for ensuring the cartridge is compliant with the printer's needs and any other data that might be useful for the operation of the printer based on the particular cartridge inserted. The QA chip is electrically connected to a set of contacts (not shown) that operatively engage the electrical contacts 173 on an edge of the ink delivery bus 165. The electrical contacts allow information to be read from the QA chip in the cartridge 189 as required. This can be when the cartridge is first inserted, and possibly periodically thereafter. In the preferred embodiment, the SoPEC chip 166 can also write back to the cartridge. Typically, this will involve determining the amount of ink used and then updating the QA chip in the cartridge.

Figure 44:
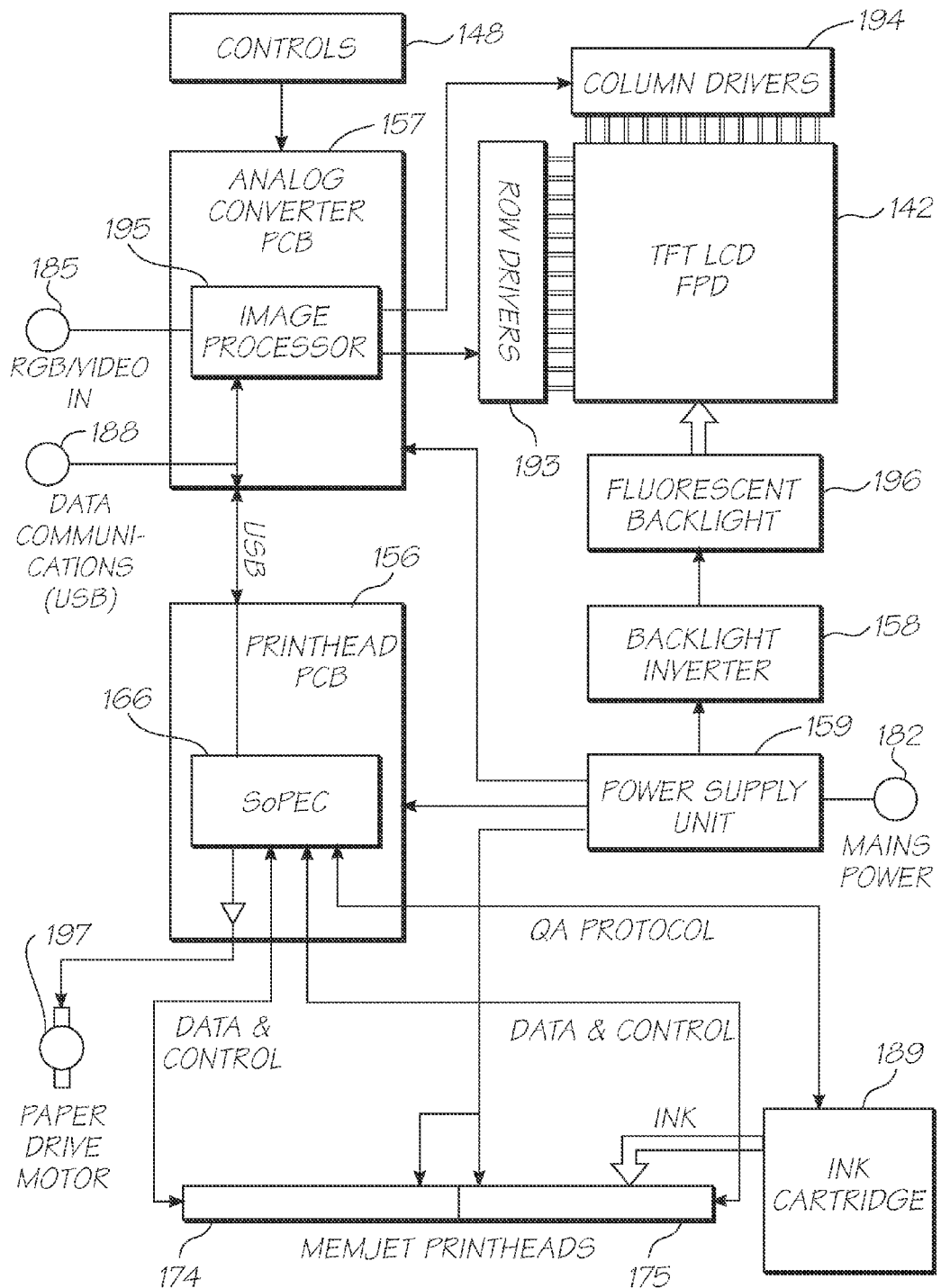
FIG. 44 is a schematic view showing the components of the flat panel display of FIG. 8.

A number of other elements of the display unit 141 not shown in other Figures are shown in FIG. 44. It will be noted that the flat panel display 142 is preferably a Thin Film Transistor (TFT) Liquid Crystal Display (LCD). However, it will be understood that the particular technology employed in the flat panel display 142 is not critical to the invention. The flat panel display 142 can therefore be of any other type, including those using Organic Light Emitting Diode (OLED), Field Emission Display (FED) and Plasma Display Panel (PDP) technologies.

As shown in FIG. 44 the display unit includes row drivers 193 and column drivers 194 that are provided with input signals by an image processor 195 located on the analog converter PCB 157. The image processor receives display data from a personal computer (not shown) via the video socket 185. The fluorescent backlight inverter PCB 158 drives a fluorescent backlight 196.

The USB input 188 (FIG. 17) provides data in accordance with the USB 2 protocol to the SoPEC chip 166. The image processor 195 can also provide data to the SoPEC chip 166, as described in detail below.

Operation of the display unit will now be described with reference to FIG. 44. Display data is received from a personal computer, or other suitable video data source, via the video input socket 185. The display data is provided to the image processor 195, which processes and converts it into a format suitable for supply to the row drivers 193 and column drivers 194. These drive the various TFTs required to display the image on the flat panel display 142. The fluorescent backlight 196 provides illumination from behind the TFTs, thereby enhancing visibility of images displayed. Various display settings, such as contrast, brightness and resolution, can be altered by a user via the controls 148.

The USB input socket 188 accepts USB formatted data from a connected personal computer, such as personal computer 102 in FIG. 1. It will be appreciated that this data can come from any other suitable source, such as a network connection or any other data communication link.

Upon receipt, the data is forwarded via an internal USB link to the printhead PCB 156 and the SoPEC chip 166. The data is decompressed and formatted in accordance with the steps shown in FIG. 1, using the hardware 232 described in relation to FIG. 2. The formatted data is forwarded from the SoPEC chip 166 to the Memjet printheads 174 and 175. The data is then printed onto the paper 149 as it is driven past the printheads.

In the preferred embodiment, the print button 200 (FIGS. 8 and 9) can be used to generate a printout of the presently displayed image. This enables a printout of the screen to be taken without the need to use a mouse, keyboard or other control device associated with the personal computer 102.

The invention has a number of advantages over the prior art. The combination of a printer and flat panel display saves a considerable amount of room compared to a separate display and printer combination. The printed matter, in the preferred embodiment, is ejected right in front of the user, unlike the case with prior art printers which are, for the most part, too bulky to be placed directly in front of the user.

In the particularly preferred embodiment described, the pagewidth nature of the printer and its relatively compact dimensions compared with inkjet and laser printers respectively mean that high quality printing can be provided without substantially increasing the size of the flat panel display casing. Given that a major advantage of flat panel displays is their compactness, this can be considered a major feature of the preferred embodiment. With the use of a pagewidth printhead, there is less vibration than with a reciprocating inkjet printhead, resulting in a more stable image for a user viewing the display whilst printing.

Figure 26:
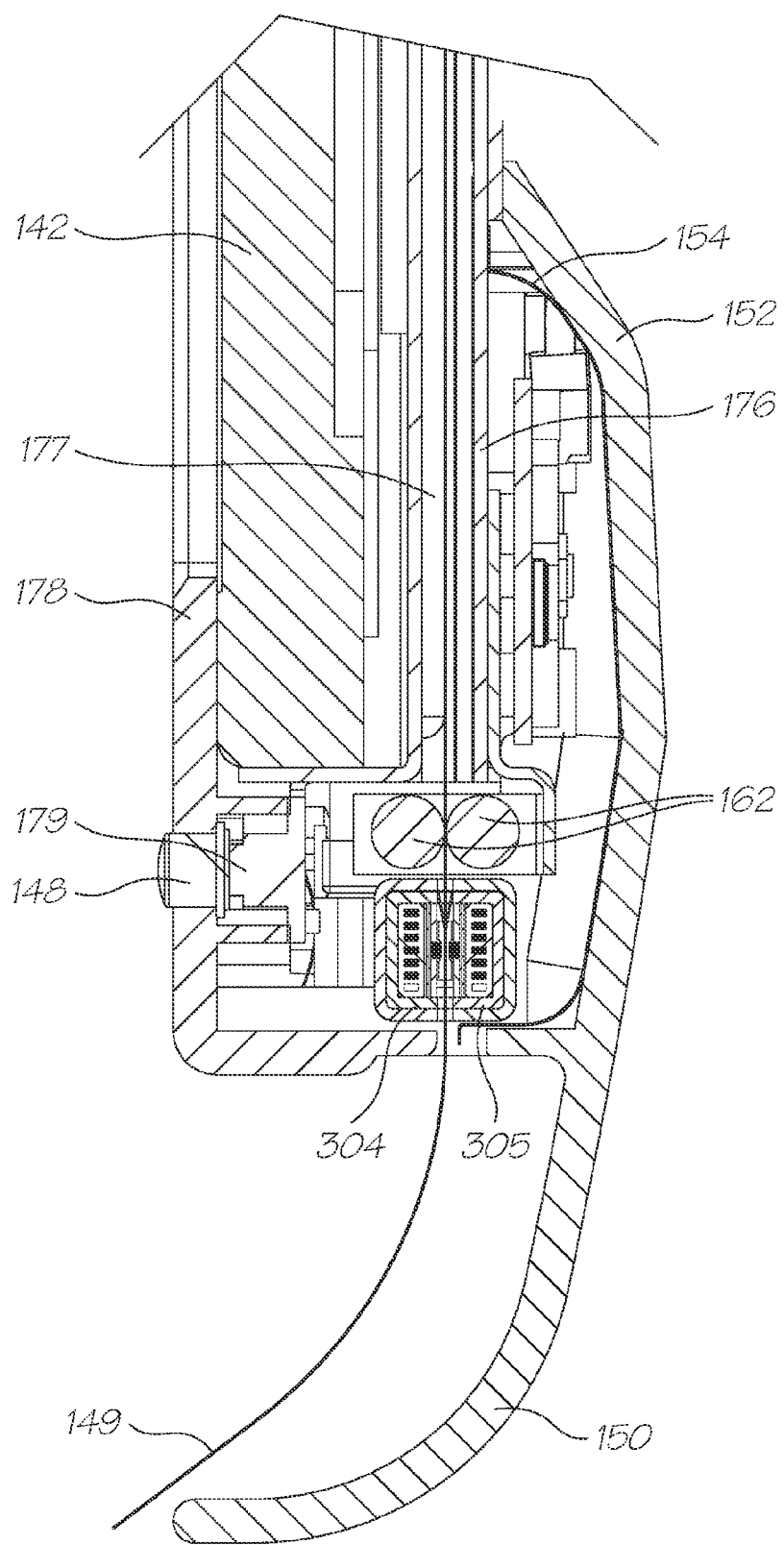
FIG. 26 is an enlarged detail view of a vertical section of a second embodiment of a flat panel display incorporating a duplex printhead, in accordance with the invention.

An alternative embodiment of the invention is shown in FIG. 26, in which like numerals indicate features corresponding to those described in relation to the embodiment of FIGS. 8 to 25. The embodiment of FIG. 26 is a duplex printer, which includes a pair printheads 304 and 305. The printheads are preferably of the same construction as the single printhead, each comprising two printhead segments. In the preferred embodiment, each of the printheads 304 and 305 has its own associated SoPEC device.

In operation, the embodiment of FIG. 26 prints onto both sides of the paper 149 as it is fed between the printheads 304 and 305.

Figure 27:
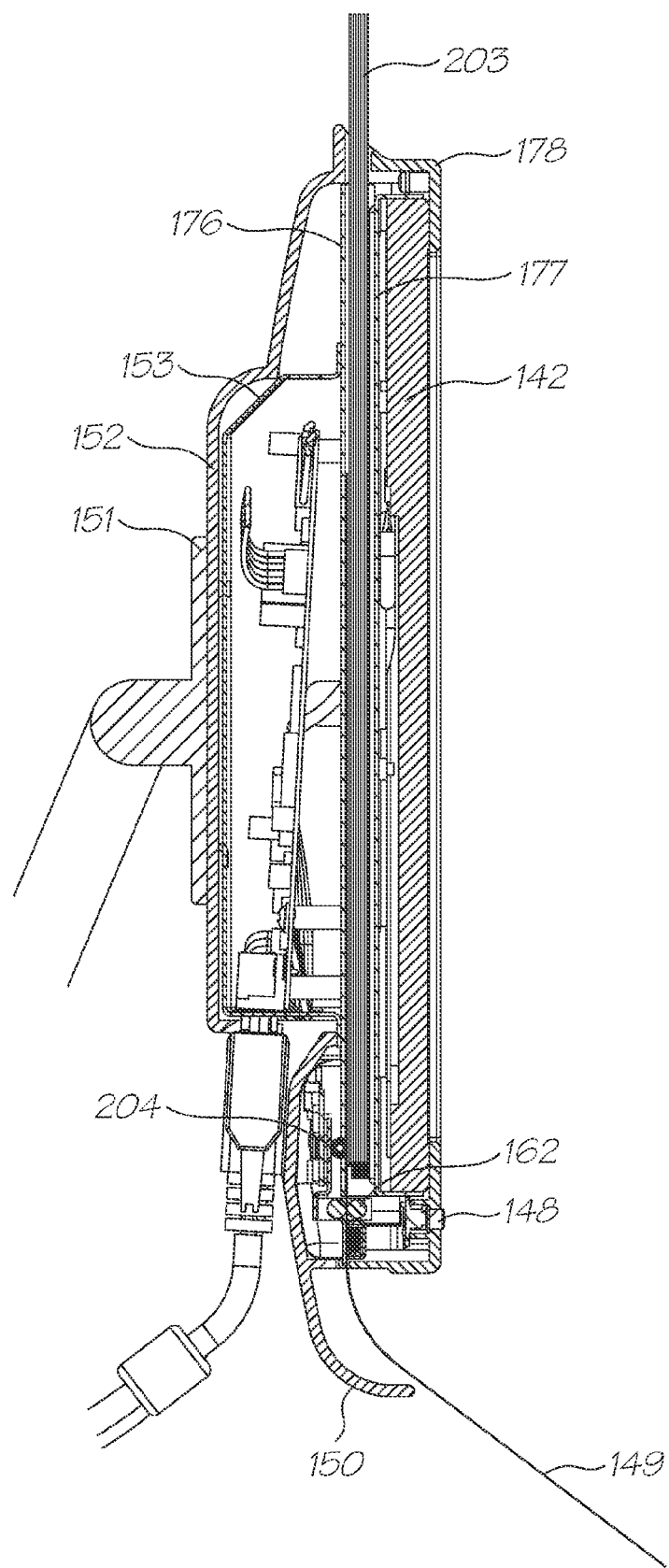
FIG. 27 is a vertical section along the centerline of a third embodiment of a flat panel display incorporating a multi-sheet paper feeder, in accordance with the invention.
Figure 28:
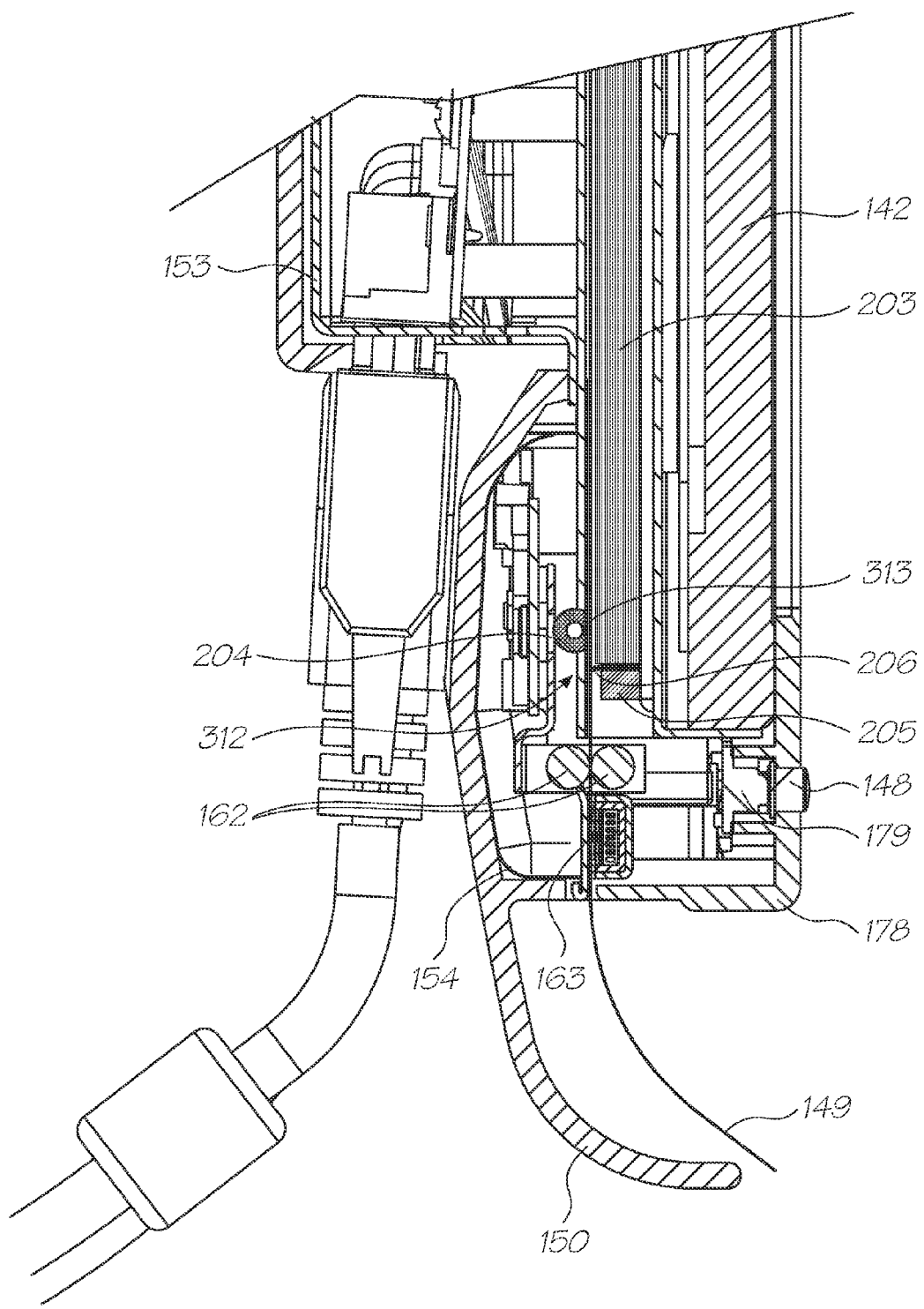
FIG. 28 is an enlarged detail view of the vertical section of FIG. 27

A further embodiment is shown in FIGS. 27 and 28, in which like numerals indicate features corresponding to those described in relation to the embodiment of FIGS. 8 to 25. The embodiment includes a multi-sheet feeder 312 that enables a single sheet at a time to be taken from a stack of paper and fed past the printhead. The feeder 312 is best shown in FIG. 28, and includes a paper stop 205 that holds a stack of paper 203 in position. The preferred capacity of the stack 203 is about 50 sheets, although other capacities can be used. A flexible shim 206 extends across the top of the paper stop 205, terminating in an edge adjacent and below a pickup roller 204. The pickup roller 204 is generally circular in cross-section, but incorporates a flat portion 313.

In use, the paper stack 203 is loaded such that it rest on the flexible shim 206, which is in turn supported by the paper stop 205. The pickup roller 204 is positioned rotationally such that the flat portion 313 (FIG. 28) is aligned with the nearest piece of paper in the stack. The pickup roller 204 is then rotated clockwise (relative to FIG. 28), until the rounded portion engages the piece of paper. As this happens, friction between the paper and the roller increases, causing a downward force on the paper. The flexible shim 206 causes the sheet of paper to be separated from the stack 203 and driven downwards towards the feed rollers 162. As the paper engages the feed rollers, the flat spot rotates back into the position shown in FIG. 28, which reduces the friction between the pickup roller and the paper, thereby enabling the feed rollers to push the paper past the printhead.

It will be appreciated that any other known paper feeding mechanisms can be employed for taking a single sheet from a stack and feeding it for printing. It will also be appreciated that a duplex printhead arrangement such as that shown in FIG. 26 can also be employed with a multi-sheet feed mechanism.

Figure 29:
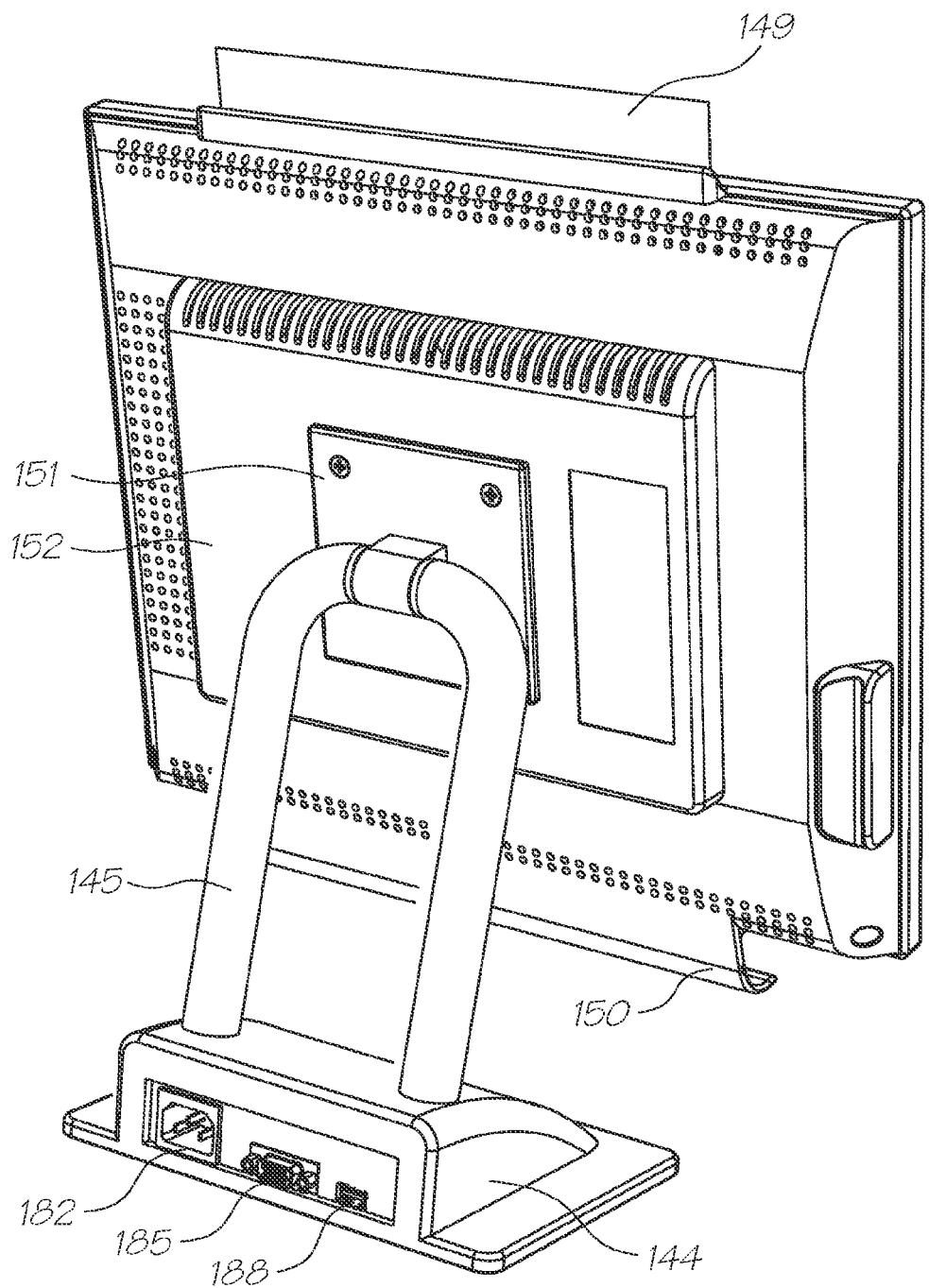
FIG. 29 is a rear perspective view of an alternative embodiment of a flat panel display including power and data connections in its base, in accordance with the invention.

Another embodiment is shown in FIG. 29, in which the sockets 182, 185 and 188 are positioned in the base portion 144 of the display unit. This enables a neater arrangement of cables, since there is no need to route them all the way up to the rear molding 152. Rather, internal wiring takes the power and data from the sockets to the relevant components via the interior of the arms 145.

Figure 30:
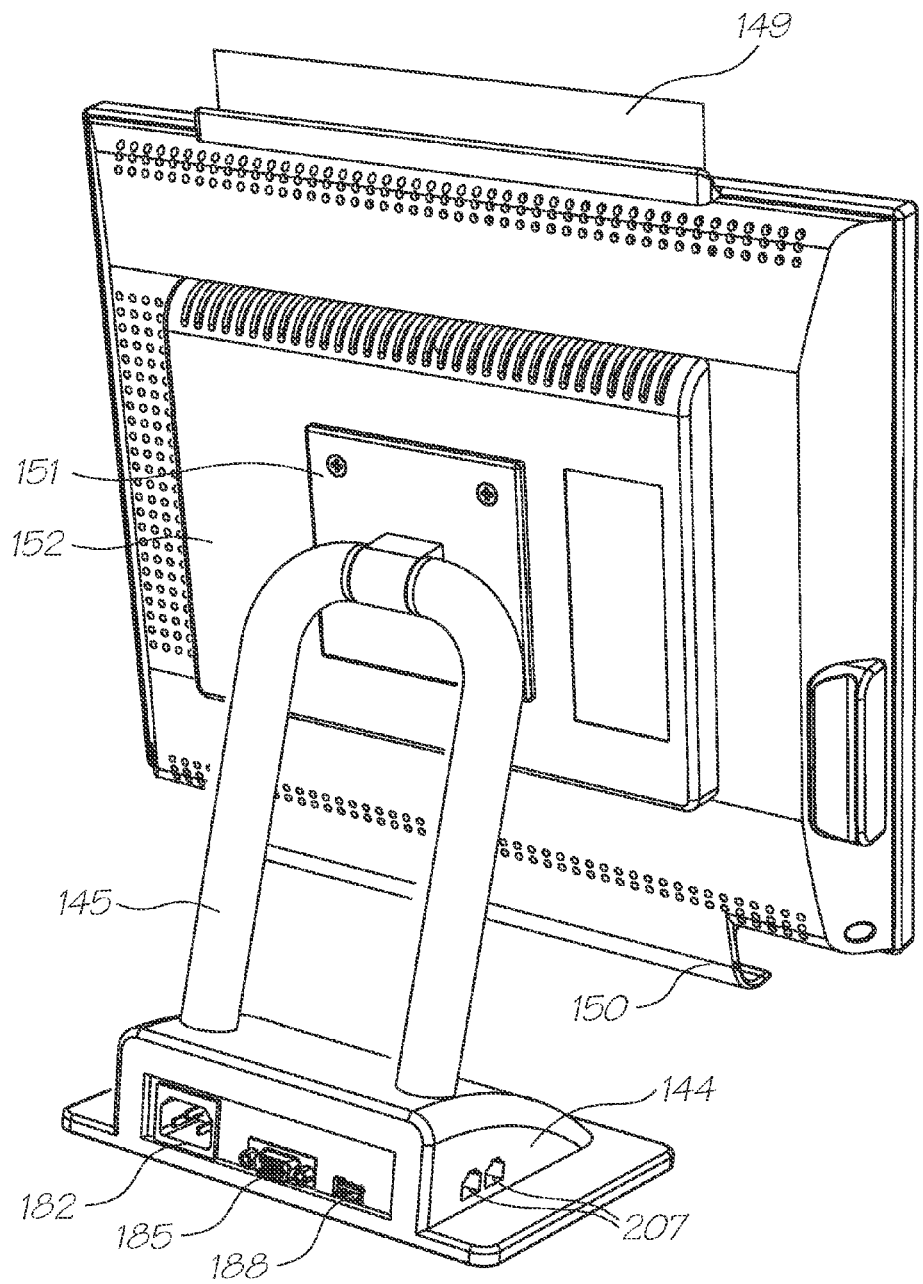
FIG. 30 is a rear perspective view of an alternative embodiment of a flat panel display including a power input, data inputs and data outputs in its base, in accordance with the invention.

FIG. 30 shows another embodiment, in which the base portion 144 acts as a data hub. Circuitry (not shown) in the base portion 144 allows the USB connection enabled by socket 188 to send and receive data to and from other devices via data hub connectors 207. This enables anything from network to peripheral devices to be connected via the base portion 144, rather than needing to access ports or sockets on the personal computer to which the display unit is connected. This can be advantageous given that ports and sockets on personal computers are often positioned in relatively difficult to access places. Often, the computer device itself is positioned out of the way, such as underneath a desk, which can contribute to this inconvenience of making data connections in the prior art.

Figure 31:
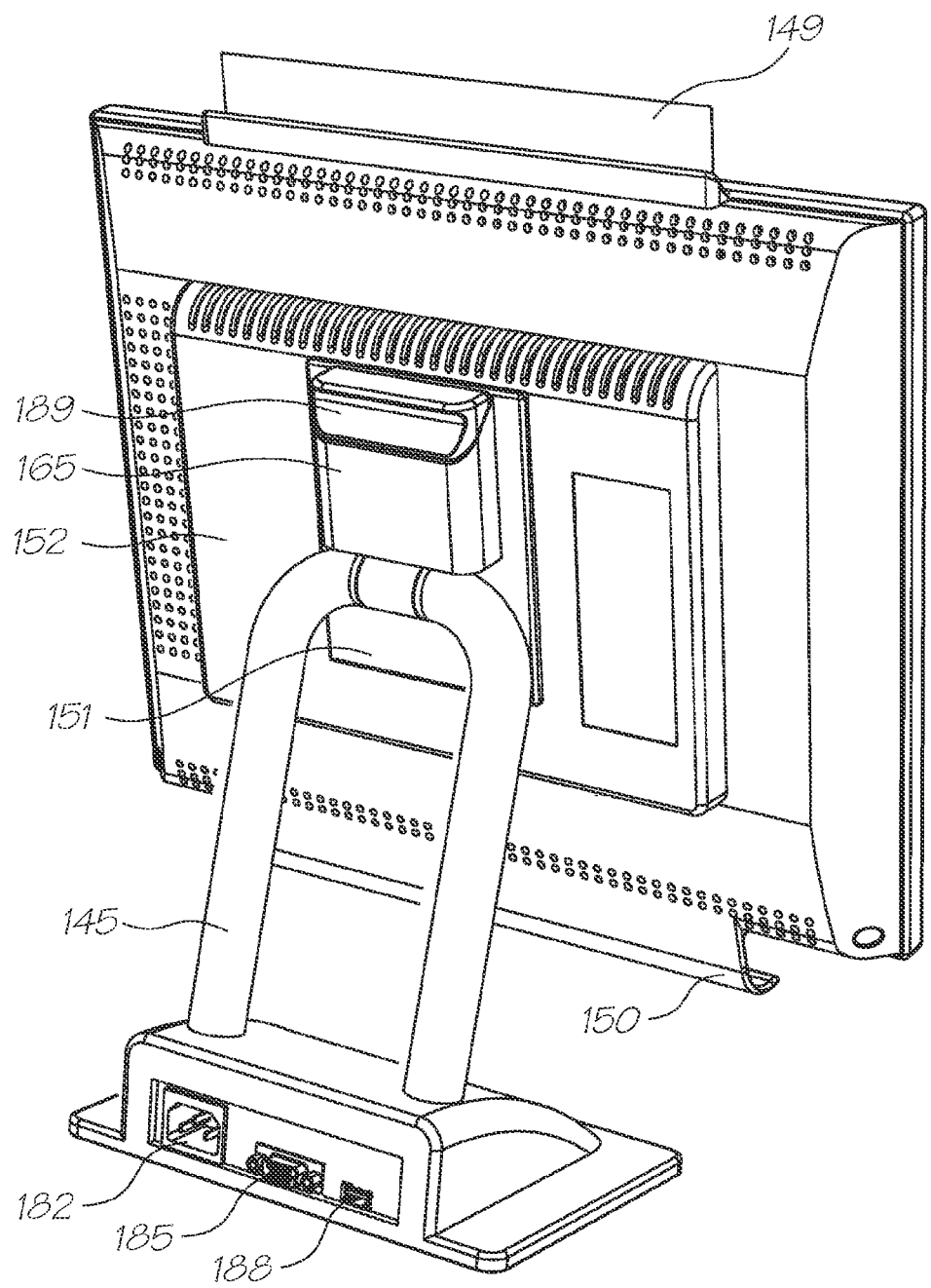
FIG. 31 is a rear perspective view of an alternative embodiment of a flat panel display including power and data connections in its base and an ink cartridge in its mounting plate, in accordance with the invention.

Yet another embodiment, shown in FIG. 31, the ink bus 165 is positioned such that the ink cartridge 189 is positioned on the mounting plate 151.

Figure 32:
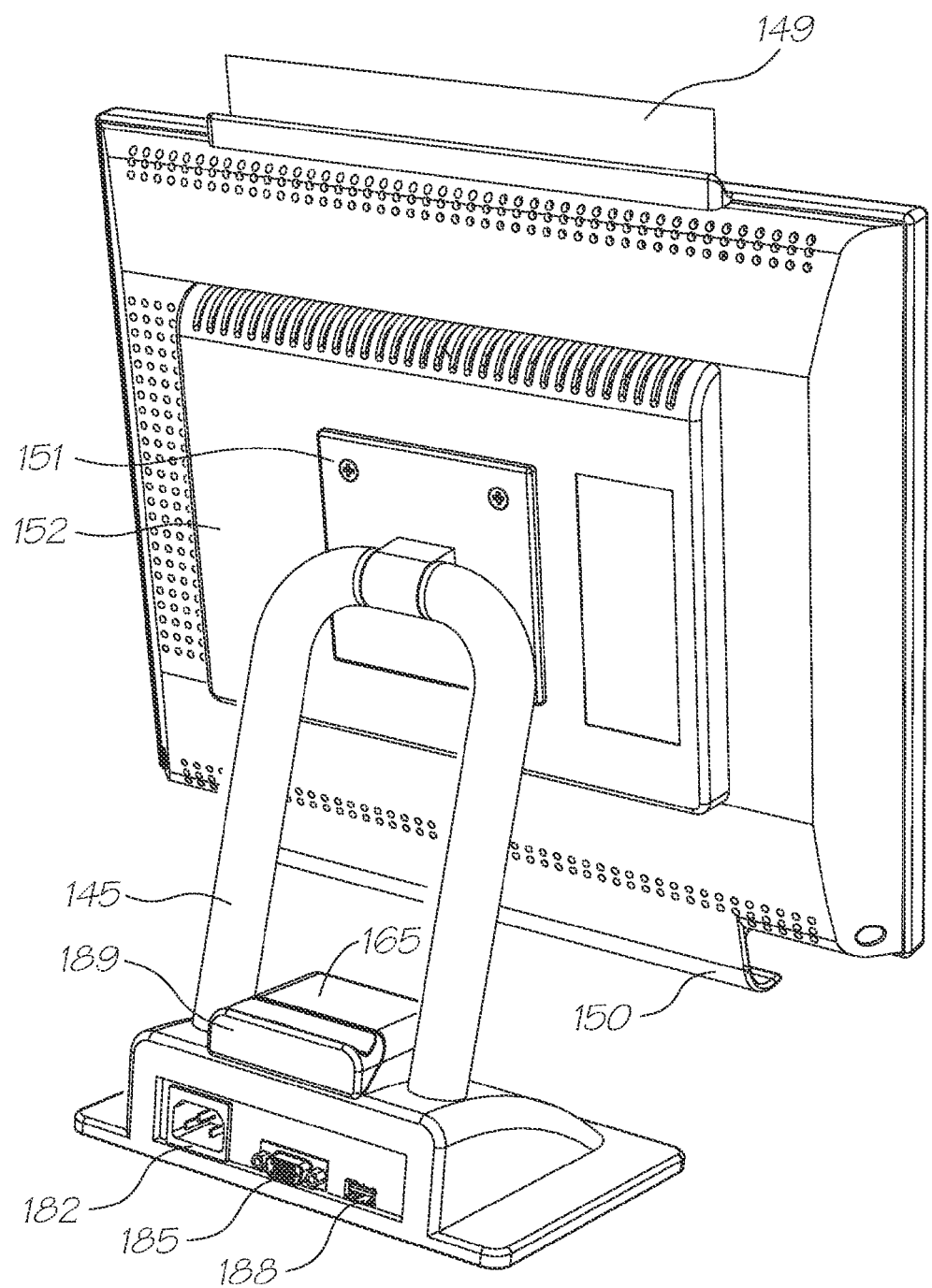
FIG. 32 is a rear perspective view of an alternative embodiment of a flat panel display including an ink cartridge, a power input and data connections in its base, in accordance with the invention.
Figure 33:
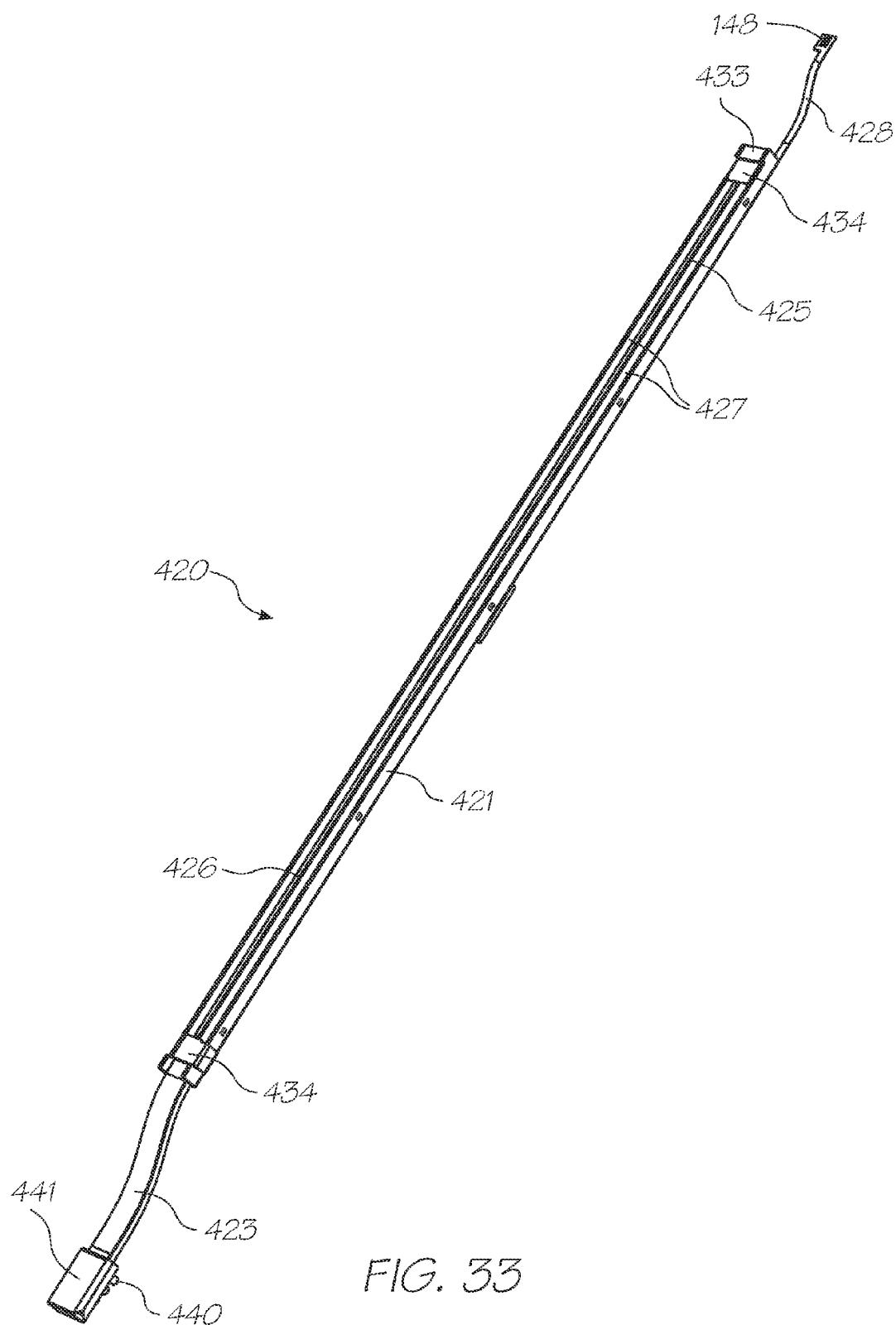
FIG. 33 is a perspective view of a bi-lithic printhead for use in the flat panel display of FIG. 8.
Figure 34:
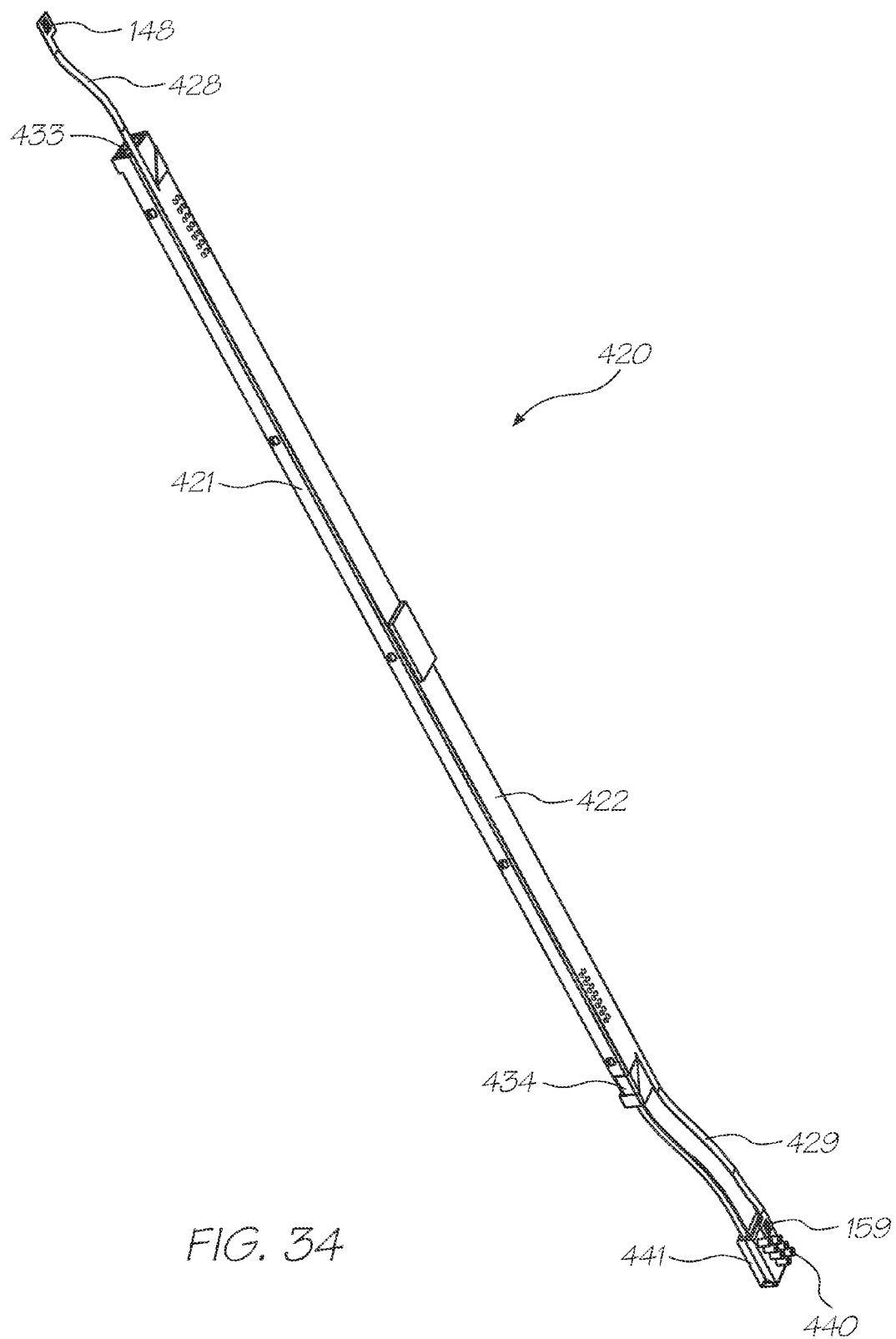
FIG. 34 is a rear perspective view of the bi-lithic printhead of FIG. 33.
Figures 35A, 35B, 35C, 35D:
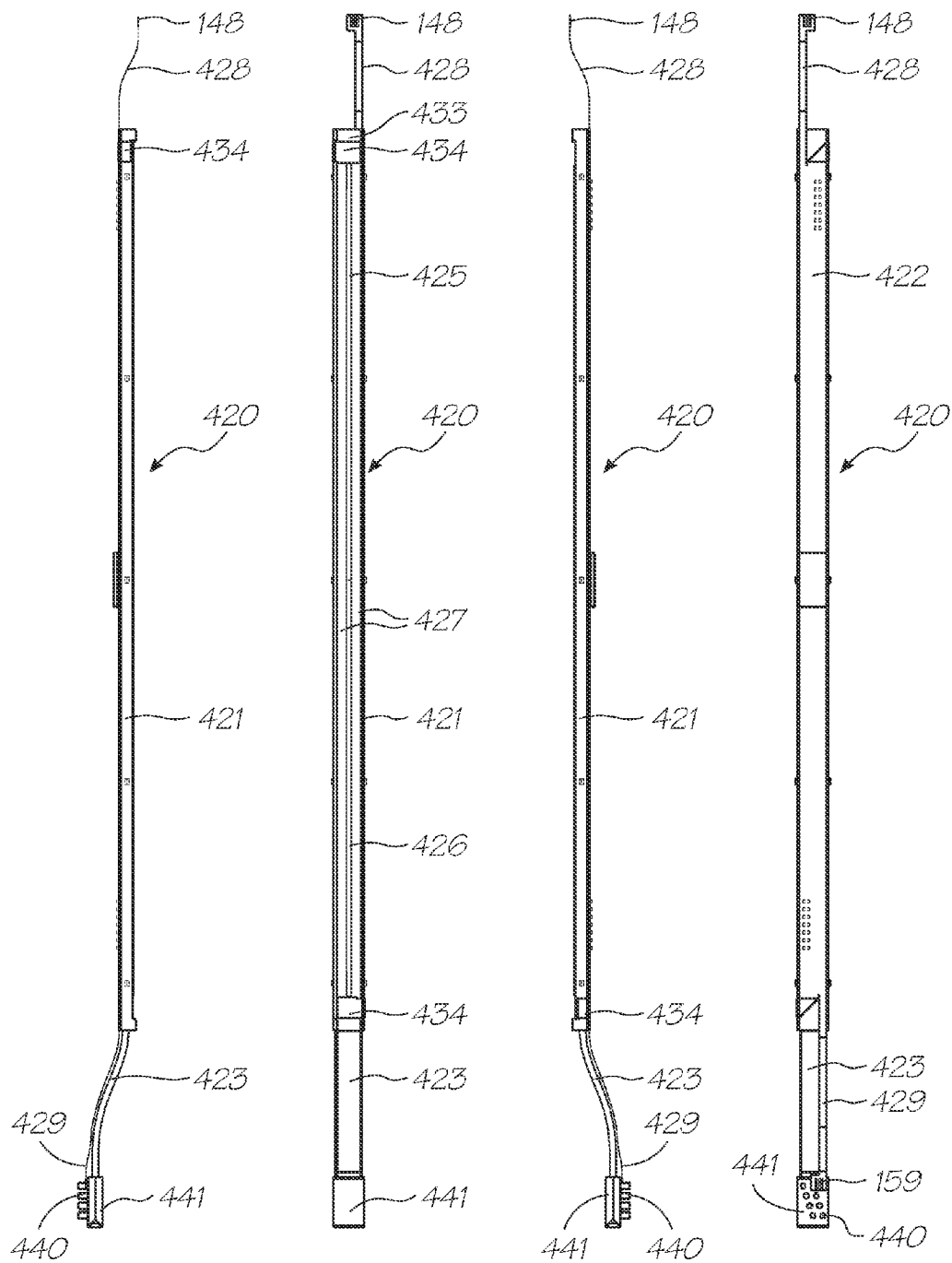
FIGS. 35(*a*) to 35(*d*) show a side elevation, plan view, opposite side elevation and reverse plan view, respectively, of the bi-lithic printhead of FIG. 33.
Figure 36:
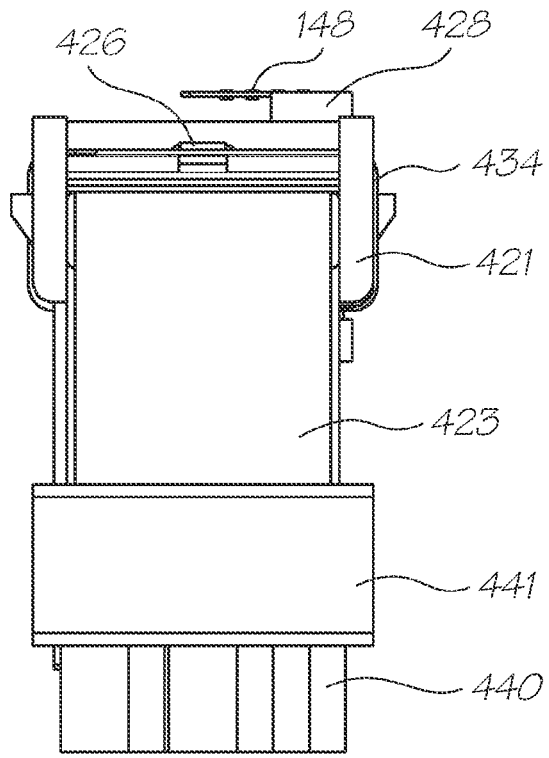
FIGS. 36 and 37 show enlarged end views of the bi-lithic printhead of FIG. 33.
Figure 37:
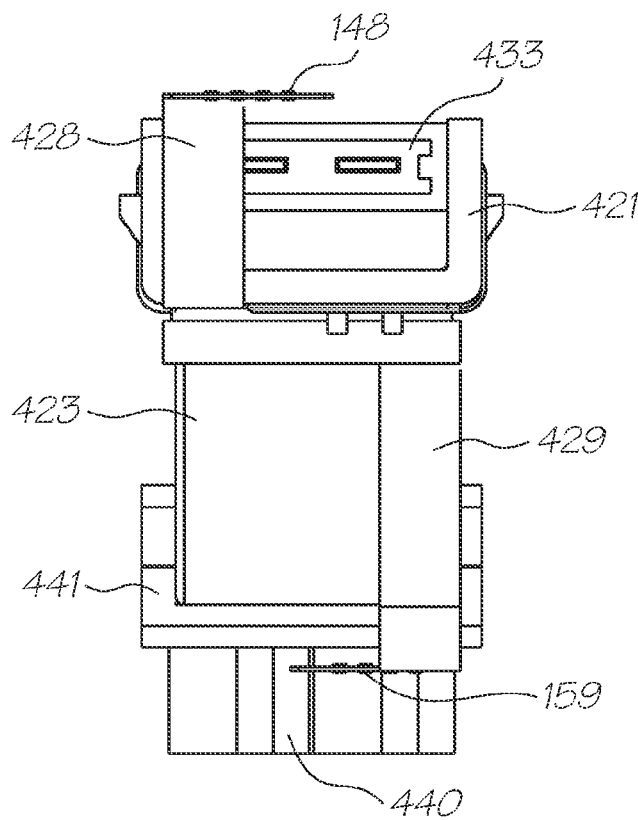

FIG. 32 shows another embodiment of the invention, in which the ink cartridge 189 is positioned in the base portion 144 of the display unit. In this case, the arms 145 also include ink conduits for supplying ink from the cartridge 189 to the printer. In some cases, it may be necessary to provide some form of pump or other pressurization arrangement to push the ink upwards through the conduits in the arms 145.

One Touch Print Button

A desktop printer attached to a personal computer (PC) may usefully incorporate an "Print" button which when pressed causes the active Windows application on the PC to print its entire active document to the printer, without an intervening print dialog.

As a variation on this theme, when the printer is embedded in a flat-panel display (FPD), then the Print button may be incorporated in the display.

By active application we mean the application whose window is top-most, and with which the user it typically currently interacting. By active document we mean the document displayed in the active application's top-most window.

When the Print button is incorporated in a printer, it is important that the button initiates printing to that printer. When the Print button is incorporated in a display, it is reasonable for it to initiate printing to the default printer, which may or may not be configured to be the in-panel printer.

Windows Printing Background

There is no single standard way under Microsoft Windows to programmatically instruct the active application to print its active document to the default or to a designated printer. However, there are several mechanisms which may be exploited, covering most application types.

Although not explored here, comparable mechanisms exists under other operating systems and windowing systems, including Apple MacOS, Unix, X Windows, Linux etc. It should be appreciated by those skilled in the art that the invention is not limited to use with any particular hardware, operating system or software combination.

Printing User Interface

Most Microsoft Windows applications, as a matter of convention, provide a fairly standard printing user interface. This consists of: (a) a Print option on the File menu, usually accessible via the two keyboard sequences ALT, F, P and CTRL+P, which displays a print dialog to print the current document; and (b) a Print tool on the toolbar (shown as a printer icon) which prints the current document to the default printer without displaying the print dialog. Dialog-less direct printing has no standard keyboard shortcut.

If the active application is receptive to a keyboard sequence in this way, then a client application can instruct it to print by queuing the appropriate keyboard events (using the keybd_event or SendInput SDK functions) or by queuing the appropriate keyboard messages (using the AttachThreadInput, GetFocus, and PostMessage SDK functions). Direct printing can be simulated by appending a carriage-return to the keyboard sequence, causing the print dialog to be completed without further user input.

Automation

Some Windows applications, including Microsoft Office applications such as Word and Excel, expose an Automation interface (formerly known as OLE Automation), which allows them to be controlled by a separate application. For example, Word (like many other Microsoft applications) exposes a PrintOut method which can be invoked on the active document to print the document directly. A client application can discover an open Word document and print it in this way. The application can designate a particular printer by assigning the name of the printer to Word's ActivePrinter property prior to invoking the PrintOut method.

Automation servers such as Office applications register running instances of themselves in the Running Object Table (ROT). Multi-instance applications (such as Excel and some versions of Word) are only able to create a single application entry in the ROT. However, multi-instance applications typically also register each of their open documents separately in the ROT, allowing the client application to find the application instance corresponding to a particular document via the document's entry in the ROT.

The client application can iterate through the ROT, attach to each server application of interest in turn, and identify whether the application is associated with the foreground window. If the server application is associated with the foreground window (as identified by the GetForegroundWindow SDK function), then the client application can invoke the application's PrintOut method (or equivalent) to print the active document.

In the case of a single-instance application (such as PowerPoint), the client application attaches to the server application directly via the ROT entry. In the case of a multi-instance application (such as Excel), the client application attaches to the server application via a document entry in the ROT.

The Windows SDK provides standard functions for obtaining a pointer to the ROT and iterating through it. Application and document entries in the ROT are easily recognised since each entry is associated with a class-specific programmatic identifier. For example, a Word application has the programmatic identifier "Word.Application.x" (where x indicates the application version), and a Word document has the identifier "Word.Document.y" (where y indicates the document version). An application entry in the ROT conventionally includes the application's class identifier in its name, from which the corresponding programmatic identifier can be obtained via the Windows registry. A document entry in the ROT allows its programmatic identifier to be discovered via the class identifier associated with the document's persistence interface.

Because there are several ways to programmatically instruct the current application to print its active document to the default or to a designated printer, and because no single way is optimal for all applications, support for a "Print" button is best provided (in this embodiment) by invoking the mechanism most appropriate to the current application according to the current application's type.

In its simplest form, this consists of first trying to find the active application in the ROT, specifying the target printer by setting the active application's ActivePrinter property, and invoking the active application's PrintOut method. If the active application is not found in the ROT, then the fallback consists of queuing the standard print-invocation keyboard sequence (i.e. Control key down, P key down, P key up, Control key up, CR key down, CR key up).

In a more sophisticated implementation, a table of applications is created which lists the mechanism most appropriate to each application type, i.e. Automation versus keyboard sequence, and exact application properties and methods to use, or exact keyboard sequence to send. Automation server applications are identified by their programmatic identifiers, while conventional applications are identified by their names. For example, Word is identified by its programmatic identifier "Word.Application.x", while Notepad is identified by its name "Notepad". It is straightforward to identify the foreground window (via the GetForegroundWindow SDK function) and extract the name of the corresponding active application from the window's title (via the GetWindowText SDK function).

The "Print" button can be a physical momentary switch or it can be simulated via another interface on the printer (or FPD) such as a touch-sensitive display. In any case, when the user presses the print button, an event is relayed to a background application on the PC which invokes the corresponding printing function as described above. The background application may already be executing, i.e. awaiting events, or it may be activated by the user's act of pressing the "Print" button. The button event can be relayed by the control software in the printer, via the printer's communications interface and its printer driver, and thence to the background application. Alternatively cacan be relayed via its own communications interface and driver, in which case the driver and the background application may be one and the same. For example, the print button can be provided in the form of a separate Universal Serial Bus (USB) device on the USB bus, but may share the physical USB connection between the printer (or FPD) and the PC.

In the preferred embodiment, the background application is capable of handling the "Print" buttons of multiple devices. To allow it to distinguish multiple buttons, each button event in this embodiment uniquely identifies its originating button. An event may include a unique identifier associated with the printer in which the button is embedded, or a unique identifier associated with the button itself, retrieved from non-volatile storage attached to the button. In cases where the target printer can be selected by setting the active server application's ActivePrinter property, the background application must know which printer name to specify. Since it may be difficult for the background application to know the name of the printer associated with a particular "Print" button it is servicing, it is useful to allow the user to associate a printer with each button, indexed by the button's unique identifier. If a button is pressed which has no associated printer, then the background application can determine how many printers are configured on the PC. If there is only one printer, then the application has no need to specify a printer since the one printer must be the default printer. If there are several printers, then the application can prompt the user to select one, and can then record the association between the selected printer and the button. It is straightforward for the background application to enumerate the available printers using the EnumPrinters SDK function.

Various exemplary, non-limiting aspects of the invention are foreshadowed in the following numbered paragraphs:

The invention claimed is:

1. A stand-alone monitor comprising:
a housing;
a flat panel display disposed within the housing for displaying a video signal provided from an external computer through a video input socket of the monitor;
a printer disposed within the housing and behind said flat panel display as viewed by the user, the printer including a pagewidth printhead for printing onto print media print data provided from the external computer through a serial data connection of the monitor; and
a sheet feeder disposed within the housing for feeding a sheet of print media from a stack of print media past the pagewidth printhead, the stack of print media being located behind and parallel to said flat panel display such that, immediately prior to commencement of printing, at least an edge of the print media is visible above an upper edge of the flat panel display.

2. A monitor according to claim 1, wherein print media to be printed on passes between the flat panel display and the pagewidth printhead.

3. A monitor according to claim 1, wherein the print media to be printed on passes behind the flat panel display and the pagewidth printhead relative to a viewing position of the flat panel display.

4. A monitor according to claim 1, wherein the printer is a process color printer.

5. A monitor according to claim 1, wherein the printer is an inkjet printer.

6. A monitor according to claim 5, wherein the printer has more than 5,000 inkjet nozzles.

7. A monitor as claimed in claim 1, wherein the sheet feeder is at least partially fed by gravity.

8. A monitor as claimed in claim 1, wherein the printer further includes a printer controller for receiving print data in a compressed form, decompress the print data, and output dot data based on the decompressed print data to the pagewidth printhead.

9. A monitor as claimed in claim 1, wherein at least a majority of a print media path of the printer is in a plane that is substantially parallel to a plane defined by the flat panel display.

\* \* \* \* \*